(12) United States Patent
Oh et al.

(10) Patent No.: US 7,410,817 B2
(45) Date of Patent: Aug. 12, 2008

(54) LIQUID CRYSTAL DISPLAY DEVICE INCLUDING DRIVING CIRCUIT AND METHOD OF FABRICATING THE SAME

(75) Inventors: Kum-Mi Oh, Gyeonggi-do (KR); Kwang-Sik Hwang, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 777 days.

(21) Appl. No.: 10/998,844

(22) Filed: Nov. 30, 2004

(65) Prior Publication Data

US 2005/0219435 A1    Oct. 6, 2005

(30) Foreign Application Priority Data

Apr. 6, 2004    (KR) ...................... 10-2004-0023445

(51) Int. Cl.
*H01L 21/00* (2006.01)
(52) U.S. Cl. .................. 438/30; 438/34; 438/149; 438/486; 438/605; 438/618; 438/621; 438/FOR. 184; 148/DIG. 150; 257/E21.411; 257/E27.108; 257/E27.184
(58) Field of Classification Search ............. 438/30, 438/34, 149, 151, 155, 486, 598, 605, 618, 438/621, FOR. 201, FOR. 184; 148/DIG. 150; 257/E21.411, E27.108, E27.132
See application file for complete search history.

(56) References Cited

FOREIGN PATENT DOCUMENTS

| KR | 10-2003-0058771 A | 7/2003 |
| KR | 10-2004-0016963 A | 2/2004 |

OTHER PUBLICATIONS

Korean Office Action dated Dec. 5, 2005.

*Primary Examiner*—Thanh V Pham
(74) *Attorney, Agent, or Firm*—McKenna Long & Aldridge LLP

(57) ABSTRACT

A method of fabricating an array substrate structure for a liquid crystal display device includes defining a display area and a non-display area on a substrate, the display area having a pixel TFT portion and a pixel electrode area, and the non-display area having an n-type driving TFT portion and a p-type driving TFT portion; forming a first gate electrode in the display area, a second and a third gate electrodes and a first capacitor electrode in the non-display area; an amorphous silicon layer on the substrate; crystallizing the amorphous silicon layer to a polycrystalline silicon layer and doping specific portions of the polycrystalline silicon layer with plurality of impurity concentrations; and forming a first semiconductor layer in the display area, a second and a third semiconductor layers and a second capacitor electrode in the non-display area.

46 Claims, 55 Drawing Sheets

LIQUID CRYSTAL DISPLAY DEVICE INCLUDING DRIVING CIRCUIT AND METHOD OF FABRICATING THE SAME

This application claims the benefit of Korean Patent Application No. 2004-023445, filed in Korea on Apr. 6, 2004, which is hereby incorporated by reference.

BACKGROUND OF THE INVENTION

1. Field of the Invention

The present invention relates to a liquid crystal display device, and more particularly, to a display device including a driving circuit polycrystalline silicon driving circuit and a method of fabricating the same.

2. Discussion of the Related Art

As the information age progresses, flat panel display (FPD) devices having high portability and low power consumption is becoming the trend of recent research and development. Among various types of FPD devices, liquid crystal display (LCD) devices are commonly used as monitors for notebook and desktop computers because of their ability to display high-resolution images, wide ranges of different colors, and moving images.

In general, the LCD device includes a color filter substrate and an array substrate separated from each other by having a liquid crystal layer interposed there between, wherein the color filter substrate and the array substrate include a common electrode and a pixel electrode, respectively. When a voltage is supplied to the common electrode and the pixel electrode, an electric field is generated that changes the orientation of liquid crystal molecules of the liquid crystal layer due to optical anisotropy within the liquid crystal layer. Consequently, light transmittance characteristics of the liquid crystal layer is modulated and images are displayed by the LCD device.

Active matrix type display devices are commonly used because of their superiority in displaying moving images. Active matrix-type display devices include pixel regions disposed in a matrix form where a thin film transistor (TFT) is formed in the pixel region as a switching element. While forming the TFT, hydrogenated amorphous silicon (a-Si:H) is selected to be deposited over a large area of substrate. Hydrogenated amorphous silicon yields higher productivity while easily fabricated on the large area of the substrate. In addition, the hydrogenated amorphous silicon (a-Si:H) is deposited at a temperature less than about 350 ° C., a glass substrate of low cost can be used. Accordingly, the hydrogenated amorphous silicon is used mainly in the TFT, which is referred to as an amorphous silicon thin film transistor (a-Si TFT).

However, since the hydrogenated amorphous silicon has a disordered atomic arrangement, weak silicon-silicon (Si—Si) bonds and dangling bonds exist in the hydrogenated amorphous silicon. These types of bonds become metastable when light or an electric field is applied to the hydrogenated amorphous silicon. As a result, this metastability makes the TFT unstable. Electrical characteristics of the hydrogenated amorphous silicon are especially degraded due to light irradiation. Furthermore, a TFT using the hydrogenated amorphous silicon is difficult to be implemented in a driving circuit due to degraded electric characteristics such as a low field effect mobility between about 0.1 $cm^2$/Vsec to about 1.0 $cm^2$/Vsec, and poor reliability.

In the related art TFT, the substrate including the a-Si TFT is connected to a printed circuit board (PCB) using a tape carrier package (TCP) that has a driving integrated circuit (IC). The driving IC and its packaging increase the LCD device production cost. Additionally, as the resolution of a liquid crystal display display panel for an LCD device increases, a pad pitch between gate pads or between data pads of the a-Si TFT substrate becomes smaller. Thus, bonding of the TCP and the a-Si TFT substrate becomes harder.

To solve these problems, a polycrystalline silicon thin film transistor (p)-Si TFT) is suggested. Due to a higher field effect mobility of a p-Si TFT as compared to an a-Si TFT, fabrication of a driving circuit and a switching element can be achieved simultaneously. Accordingly, the production cost is reduced and the TCP is removed. Moreover, p-Si TFT can be used as a switching element of a high-resolution panel to benefit from the high field effect mobility of the polycrystalline silicon. Furthermore, a p-Si TFT has a lower photo current than an a-Si TFT, thereby preventing the display device from the substantial degradation of display quality due to the exposure to light.

FIG. 1 is a schematic view showing a liquid crystal display device according to the related art where a switching element and a driving circuit are formed on a single substrate. In FIG. 1, a driving circuit portion 5 and a display area 3 are defined on a single substrate 1. The display area 3 is disposed at a central portion of the substrate 1, while the driving area 5 is disposed at left and top portions of the display area 3. The driving circuit portion 5 includes a gate driving circuit 5a and a data driving circuit 5b. The display area 3 includes a plurality of gate lines 7 connected to the gate driving circuit 5a and a plurality of data lines 9 connected to the data driving circuit 5b. The gate line 7 and the data line 9 intersect each other to define a pixel region "P". A pixel electrode 10 is formed in the pixel region "P." A thin film transistor (TFT) "T" formed as a switching element is connected to the pixel electrode 10. The gate driving circuit 5a supplies a scan signal to the TFT "T" from the gate line 7 and the data driving circuit 5b supplies a data signal to the pixel electrode 10 from the data line 9.

The gate driving circuit 5a and the data driving circuit 5b are connected to an input terminal 12 to receive external signals. Accordingly, the gate driving circuit 5a and the data driving circuit 5b process the externals signals from the input terminal 12 to generate the scan signal and the data signal. To generate the scan signal and the data signal, the gate driving circuit 5a and the data driving circuit 5b include a plurality of TFTs forming complementary metal-oxide-semiconductor (CMOS) logic. For example, an inverter including negative (n)-type and positive(p)-type TFTs may be formed in the gate driving circuit 5a and the data driving circuit 5b.

FIGS. 2A to 2F are schematic cross-sectional views showing a process of fabricating a thin film transistor in a display area of a liquid crystal display device according to the related art. FIGS. 3A to 3F are schematic cross-sectional views showing a process of fabricating n-type and a p-type thin film transistors in a driving area of a liquid crystal display device according to the related art.

In FIGS. 2A and 3A, a buffer layer 25 is formed on a substrate 20 and an amorphous silicon layer is formed on the buffer layer 25. The amorphous silicon layer is crystallized to a polycrystalline silicon layer by a laser annealing method. The amorphous silicon layer may be dehydrogenated before crystallizing to a polycrystalline silicon layer. The polycrystalline silicon layer is patterned through a first mask process to form a first semiconductor layer 30 in a pixel TFT portion "I," a second semiconductor layers 35 in an n-type driving TFT portion "II" and a third semiconductor layer 40 in a p-type driving TFT portion "III."

In FIGS. 2B and 3B, a gate insulating layer 45 of silicon oxide ($SiO_2$) is formed on the semiconductor layers 30, 35 and 40. After depositing a metallic material on the gate insulating layer 45, first, second and third gate electrodes 50, 55 and 60 are formed on the gate insulating layer 45 through a second mask process. Then, the semiconductor layers 30, 35 and 40 are doped with low concentration n-type (n−) impurities using the gate electrodes 50, 55 and 60 as doping masks. Accordingly, a portion of the first semiconductor layer 30 directly underneath the first gate electrode 50 is not doped with n− impurities, while the other portion of the first semiconductor layer 30 is doped with n− impurities. Similarly, the second and third semiconductor layers 35 and 40 are partially doped with n− impurities. As a result, the semiconductor layers 30, 35 and 40 are divided into undoped regions 30*a*, 35*a* and 40*a* and n-doped regions 30*b*, 35*b* and 40*b*. The undoped regions 30*a*, 35*a* and 40*a* are used as an active region of a TFT.

In FIGS. 2C and 3C, first, second and third n+ photoresist (PR) patterns 61, 62 and 63 are formed through a third mask process. The first and second n+ PR patterns 61 and 62 cover the first and second gate electrodes 50 and 55, respectively. In addition, the first n+ PR pattern 61 covers a predetermined portion of the first semiconductor layer 30 adjacent to the first gate electrode 50 and the second n+ PR pattern 62 covers a predetermined portion of the second semiconductor layer 35 adjacent to the second gate electrode 55. The third n+ PR pattern 63 completely covers the third semiconductor layer 40 including the third gate electrode 60. Next, the first, second and third semiconductor layers 30, 35 and 40 are doped with high concentration n-type impurities (n+) using the first, second and third n+ PR patterns 61, 62 and 63 as doping masks. Accordingly, the predetermined portions of the first and second semiconductor layers 30 and 35 are not doped with n+ impurities, while the exposed portions of the first and second semiconductor layers 30 and 35 are doped with n+ impurities. In addition, the third semiconductor layer 40 is not doped with n+ impurities. As a result, the exposed portions of the first and second semiconductor layers 30 and 35 become n+ doped regions 30*c* and 35*c*, which are used as an ohmic contact regions of n-type, and the predetermined portions of the first and second semiconductor layers 30 and 35 that remain n− doped regions 30*b* and 35*b* are used as a lightly doped drain (LDD) region. Therefore, the active regions 30*a* and 35*a*, the LDD regions 30*b* and 35*b*, and the n-type ohmic contact regions 30*c* and 35*c* are defined by doping with n− impurities and n+ impurities. After doping with n+ impurities, the first, second and third n+ PR patterns 61, 62 and 63 are removed.

In FIGS. 2D and 3D, the first and second p+ PR patterns 65 and 66 are formed through a fourth mask process. The first and second p+PR patterns 65 and 66 completely cover the first and second semiconductor layers 30 and 35, respectively. The third semiconductor layer 40 is exposed, since no p+ PR pattern is provided in the portion "III". Next, the semiconductor layers 30, 35 and 40 are doped with high concentration p-type (p+) impurities using the first and second p+ PR patterns 65 and 66 and the third gate electrode 60 as doping masks. Accordingly, the first and second semiconductor layers 30 and 35 are not doped with p+ impurities. In addition, a portion of the third semiconductor layer 40 directly underneath the third gate electrode 60 is not doped with p+ impurities, while the other portion of the third semiconductor layer 40 is doped with p+ impurities. Since the p-type impurities has a concentration higher than the n-type impurities in the exposed portion of third semiconductor layer 40, the p-type impurities compensate the n-type impurities. Accordingly, the exposed portion of the third semiconductor layer 40 becomes p+ doped region 40*b* which is used as an ohmic contact region of p-type. Therefore, the active regions 40*a* and the p-type ohmic contact region 40*b* are defined by doping with p+ impurities. After doping with p+ impurities, the first and second p+ PR patterns 65 and 66 are removed.

In FIGS. 2E and 3E, an interlayer insulating layer 70 of an inorganic insulating material such as silicon nitride ($SiN_x$) and silicon oxide ($SiO_2$) is formed on the gate electrodes 50, 55 and 60 through a fifth mask process. The interlayer insulating layer 70 has semiconductor contact holes 73*a*, 73*b*, 75*a*, 75*b*, 77*a* and 77*b* defined through the gate insulating layer 45 to expose the ohmic contact regions 30*c*, 35*c* and 40*c*. First source and drain electrodes 80*a* and 80*b*, second source and drain electrodes 83*a* and 83*b*, and third source and drain electrodes 87*a* and 87*b* are formed on the interlayer insulating layer 70 through a sixth mask process. The source and drain electrodes 80*a*, 80*b*, 83*a*, 83*b*, 87*a* and 87*b* have a double layer structure formed of molybdenum (Mo) and aluminum-neodymium (AlNd), and are connected to the ohmic contact regions 30*c*, 35*c* and 40*c* within the semiconductor contact holes 73*a*, 73*b*, 75*a*, 75*b*, 77*a* and 77*b*.

FIGS. 2F and 3F, a passivation layer 90 of silicon nitride ($SiN_x$) is formed on the source and drain electrodes 80*a*, 80*b*, 83*a*, 83*b*, 87*a* and 87*b* through a seventh mask process. The passivation layer 90 may be hydrogenated and has a drain contact hole 95 exposing the first drain electrode 80*b*. Next, a pixel electrode 97 of indium-tin-oxide (ITO) is formed on the passivation layer 90 through an eighth mask process. The pixel electrode 97 is connected to the first drain electrode 80*b* within the drain contact hole 95.

As mentioned above, the array substrate for an LCD device according to the related art is fabricated through a eight-mask process. Since the related art mask process includes steps of coating PR, exposing PR, and developing PR, increase in production cost and fabrication time as well as a reduced production yield results from an increased number of masks. In addition, reliability of a thin film transistor is reduced accordingly.

SUMMARY OF THE INVENTION

Accordingly, the present invention is directed to a liquid crystal display device and a method of fabricating the same that substantially obviates one or more of the problems due to limitations and disadvantages of the related art.

An object of the present invention is to provide a liquid crystal display device having a bottom gate structure and a method of fabricating the same through a reduced number of mask processes.

Another object of the present invention is to provide an array substrate for a liquid crystal display device and a method of fabricating the same where production yield is improved and fabrication cost is reduced based on a five-mask process.

Another object of the present invention is to provide a thin film transistor for a liquid crystal display device and a method of fabricating the same where source and drain electrodes are formed after forming a passivation layer on a semiconductor layer of polycrystalline silicon to protect a channel.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating an array substrate structure for a liquid crystal display device includes sequentially disposing a transparent conductive material layer and a metallic material layer on a substrate defining a display area and a non-display area, the display area having a pixel TFT portion and a pixel electrode area, and the non-display area having an n-type driving TFT portion and a p-type driving TFT portion; forming a first gate electrode in the pixel TFT portion, a second gate electrode in the n-type driving TFT portion, a third gate electrode in the p-type driving TFT portion, a gate line in the display area, a pixel electrode in the pixel electrode area, and a first capacitor electrode connected to the pixel electrode through a first mask process; sequentially disposing a gate insulating layer and an amorphous silicon layer on the first gate electrode, the second gate electrode, the third gate electrode, the gate line, the pixel electrode and the first capacitor electrode; doping the amorphous silicon layer in the p-type driving TFT portion with high concentration p-type impurities (p+) through a second mask process to define a first active region and a first ohmic contact region; doping the amorphous silicon layer in the pixel TFT portion and the n-type driving TFT portion with high concentration n-type impurities (n+) and low concentration n-type impurities (n−) through a third mask process to define second and third active regions, second and third ohmic contact regions, first and second lightly doped drain (LDD) regions and a storage capacitor area; disposing a passivation layer on the amorphous silicon layer; forming a first semiconductor layer in the pixel TFT portion, a second semiconductor layer in the n-type driving TFT portion, a third semiconductor layer in the p-type driving TFT portion, a second capacitor electrode in the storage capacitor area through a fourth mask process; forming a passivation pattern on the first, second and third semiconductor layers and the second capacitor electrode through the fourth mask process, wherein side portions of each of the first, second and third semiconductor layers are exposed; and forming first source and drain electrodes, second source and drain electrodes, third source and drain electrodes and a data line through a fifth mask process, portions of the first source and drain electrodes contacting the side portions of the first semiconductor layer, portions of the second source and drain electrodes contacting the side portions of the second semiconductor layer, portions of the third source and drain electrodes contacting the side portions of the third semiconductor layer, and the data line connected to the first source electrode.

In another aspect, a method of fabricating an array substrate structure for a liquid crystal display device includes sequentially disposing a transparent conductive material layer and a metallic material layer on a substrate defining a display area and a non-display area, the display area having a pixel TFT portion and a pixel electrode area, and the non-display area having a driving TFT portion; forming a first gate electrode in the pixel TFT portion and a second gate electrode in the driving TFT portion, a gate line in the display area, a pixel electrode in the pixel electrode area through a first mask process, wherein a first capacitor electrode connects to the pixel electrode; sequentially disposing a gate insulating layer and an amorphous silicon layer on the first, second gate electrodes, the gate line, the pixel electrode, and the first capacitor electrode; doping the amorphous silicon layer with impurities through a second mask process to define a first active region, a first ohmic contact region, and storage capacitor area in the pixel TFT portion, and a second active region and a second ohmic contact region in the driving TFT portion; disposing a passivation layer on the polycrystalline silicon layer; forming a first semiconductor layer in the pixel TFT portion, a second semiconductor layer in the driving TFT portion, a second capacitor electrode in the storage capacitor area, and a passivation pattern on the first and second semiconductor layers and the second capacitor electrode through a third mask process, side portions of each of the first and second semiconductor layers are exposed using the passivation pattern; and forming first source and drain electrodes, second source and drain electrodes, and a data line through a fourth mask process, the first source and drain electrodes contacting the side portions of the first semiconductor layer, the second source and drain electrodes contacting the side portions of the second semiconductor layer, and the data line connected to the first source electrode.

In another aspect, an array substrate structure for a liquid crystal display device includes first, second and third gate electrodes on a substrate having a display area and a non-display area, the display area having a pixel TFT portion and a pixel electrode area, and the non-display area having an n-type driving TFT portion and a p-type driving TFT portion, the first gate electrode disposed in the pixel TFT portion, the second gate electrode disposed in the n-type driving TFT portion, the third gate electrode disposed in the p-type driving TFT portion; a gate line in the display area on the substrate; a pixel electrode in the pixel electrode area on the substrate; a gate insulating layer on the first, second, and third gate electrodes, the gate line, and the pixel electrode; first, second and third semiconductor layers of polycrystalline silicon on the gate insulating layer, the first semiconductor layer disposed in the pixel TFT portion, the second semiconductor layer disposed in the n-type driving TFT portion, and the third semiconductor layer disposed in the p-type driving TFT portion; a passivation pattern on the first, second and third semiconductor layers, the passivation pattern exposing side portions of each of the first, second and third semiconductor layers; first source and drain electrodes, second source and drain electrodes, and third source and drain electrodes on the substrate, the first source and drain electrodes contacting the side portions of the first semiconductor layer, the second source and drain electrodes contacting the side portions of the second semiconductor layer, the third source and drain electrodes contacting the side portions of the third semiconductor layer; and a data line crossing the gate line and connected to the first source electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to embodiments of the present invention, example of which is illustrated in the accompanying drawings. Wherever possible, similar reference numbers will be used throughout the drawings to refer to the same or like parts.

Figure 1:
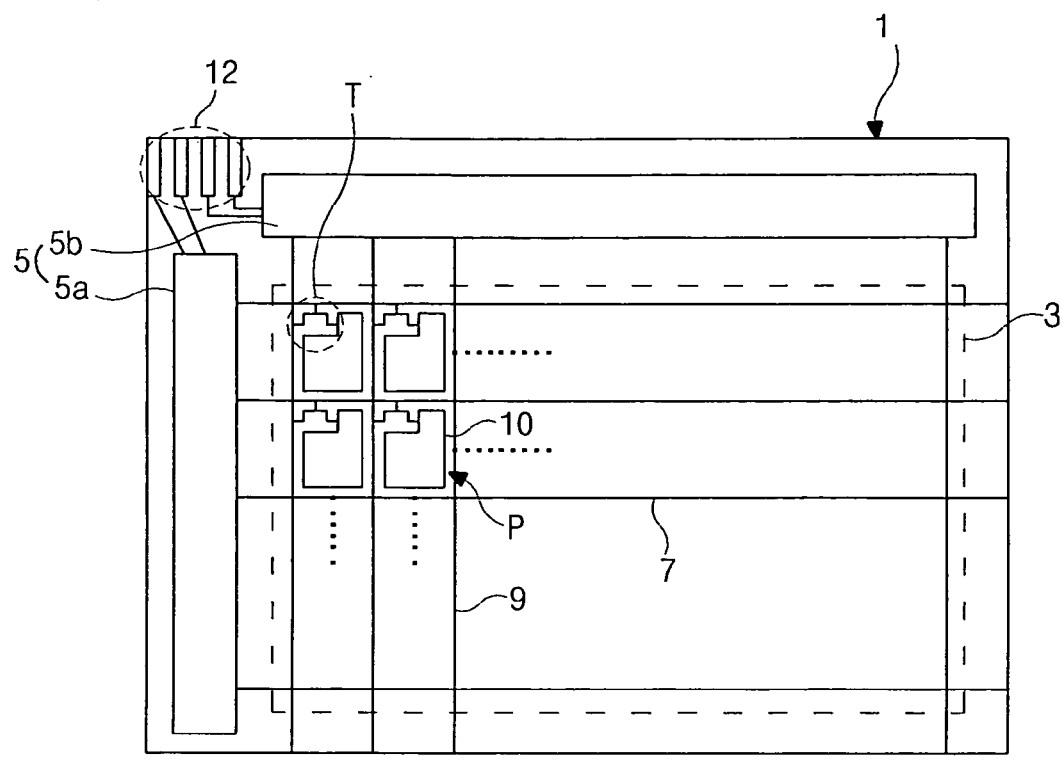
FIG. 1 is a schematic view showing a liquid crystal display device according to the related art where a switching element and a driving circuit are formed on a single substrate.
Figure 2A:
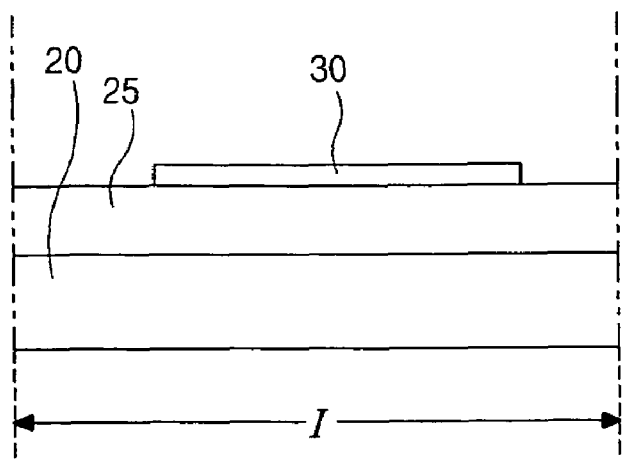
FIGS. 2A to 2F are schematic cross-sectional views showing a process of fabricating a thin film transistor disposed in a display area of a liquid crystal display device according to the related art.
Figure 2B:
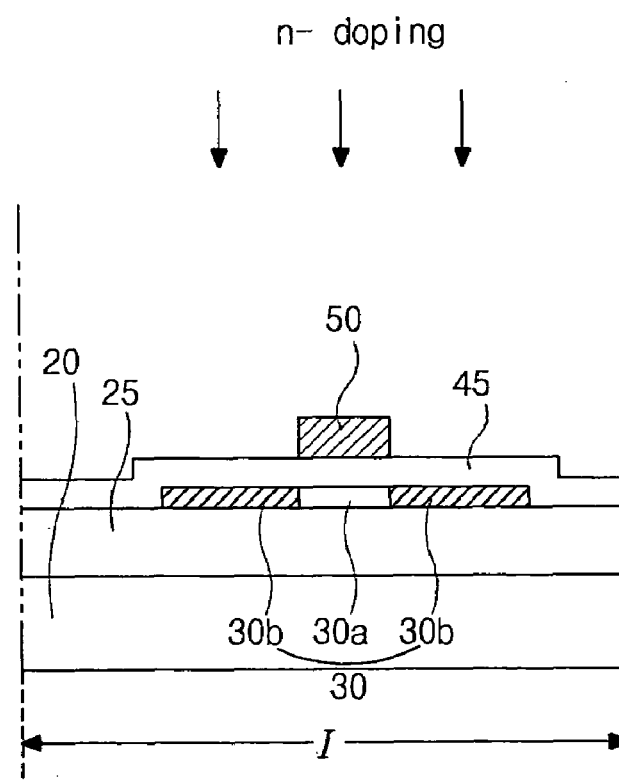
Figure 2C:
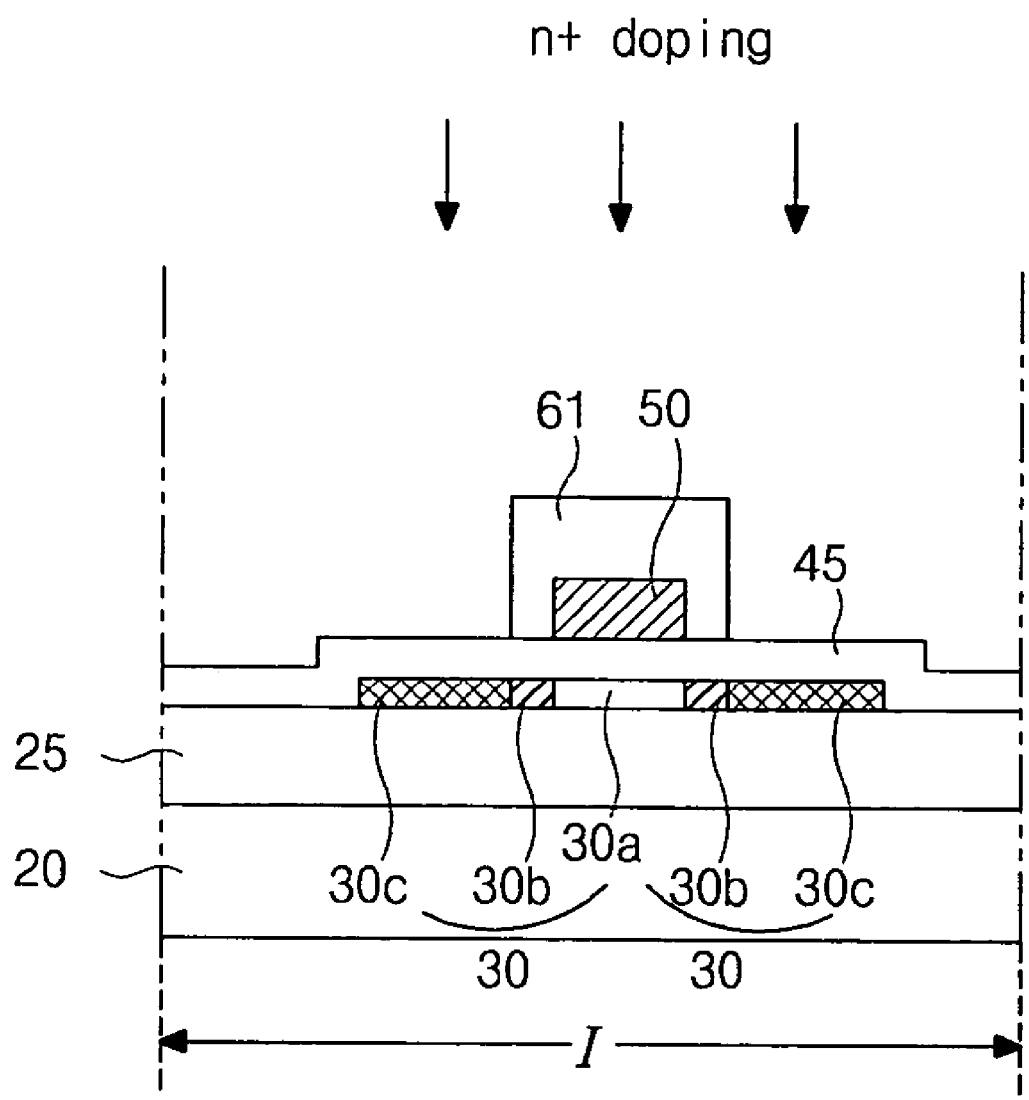
Figure 2D:
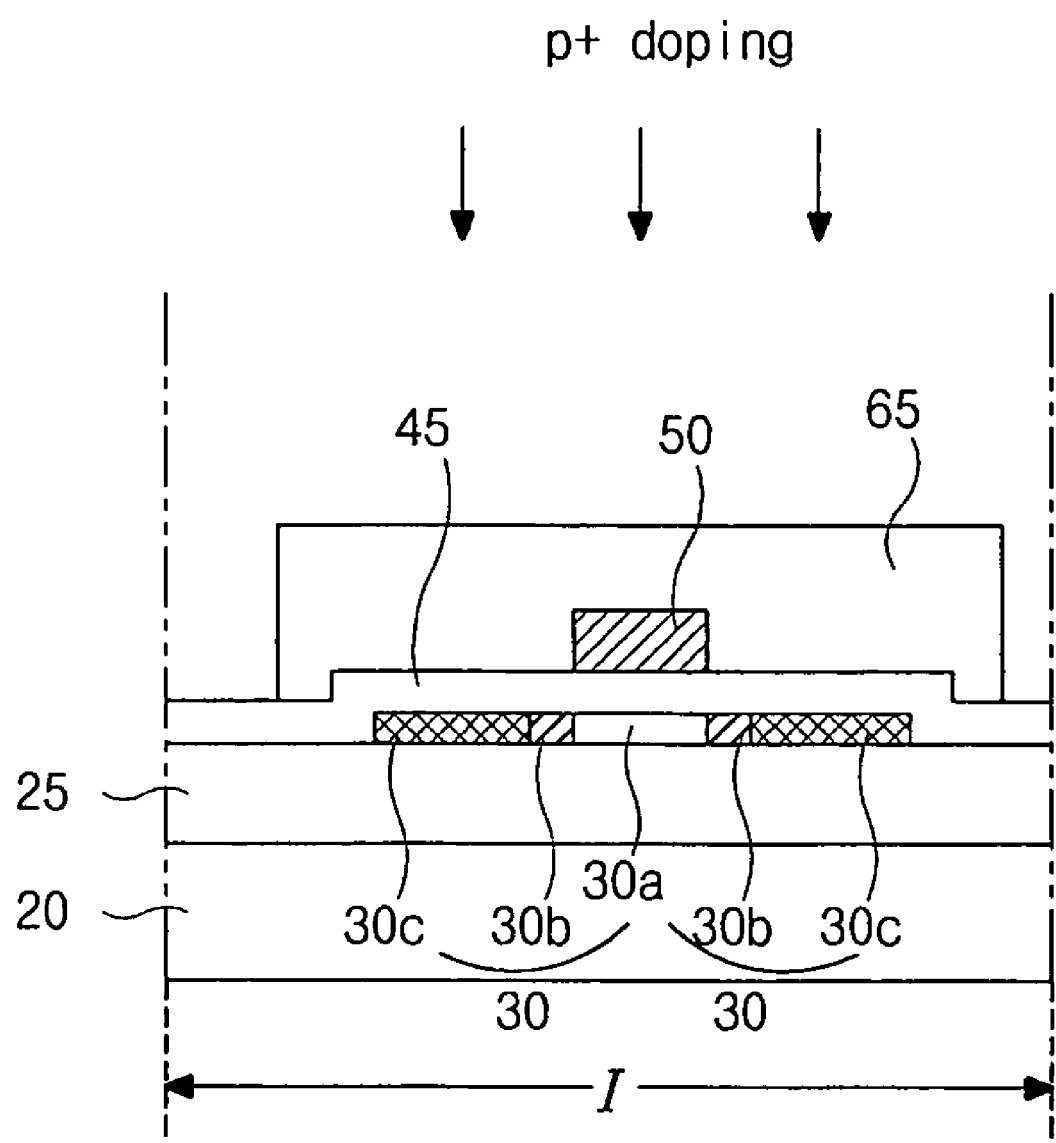
Figure 2E:
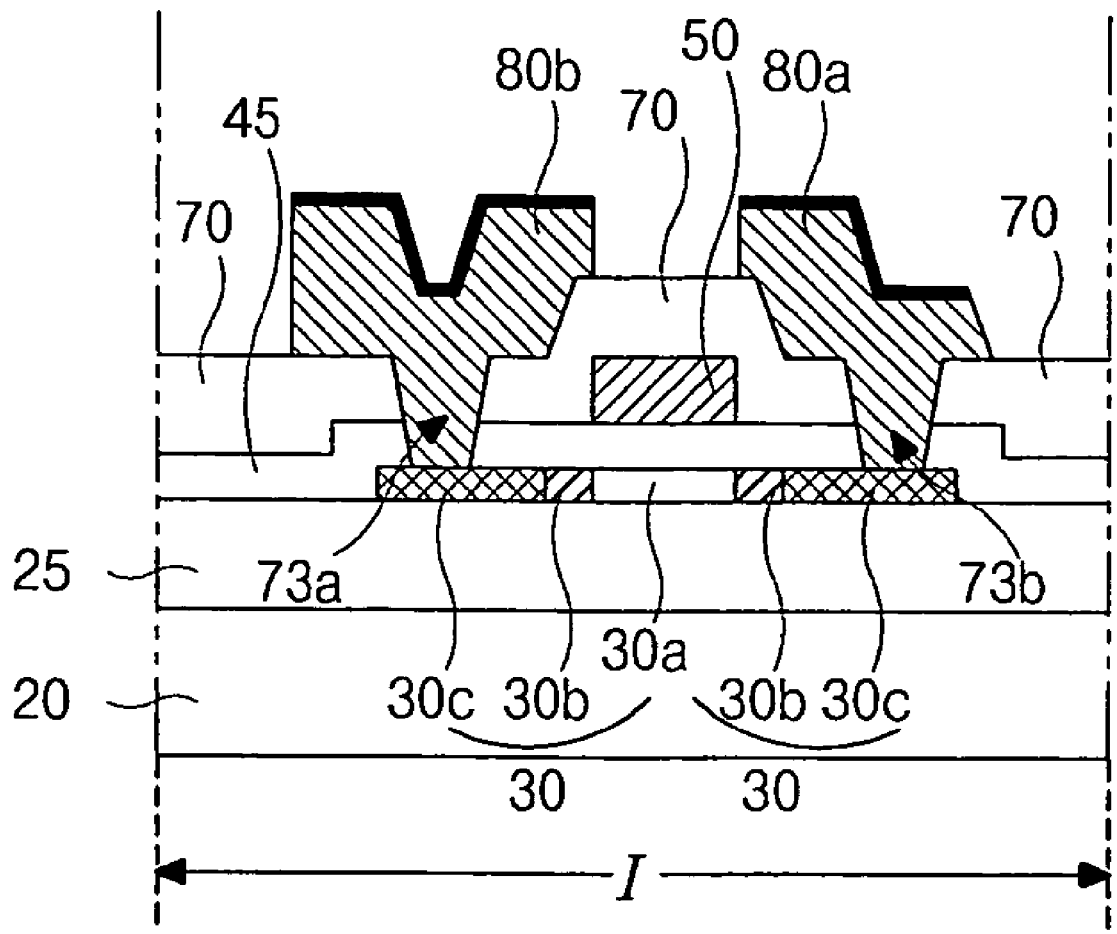
Figure 2F:
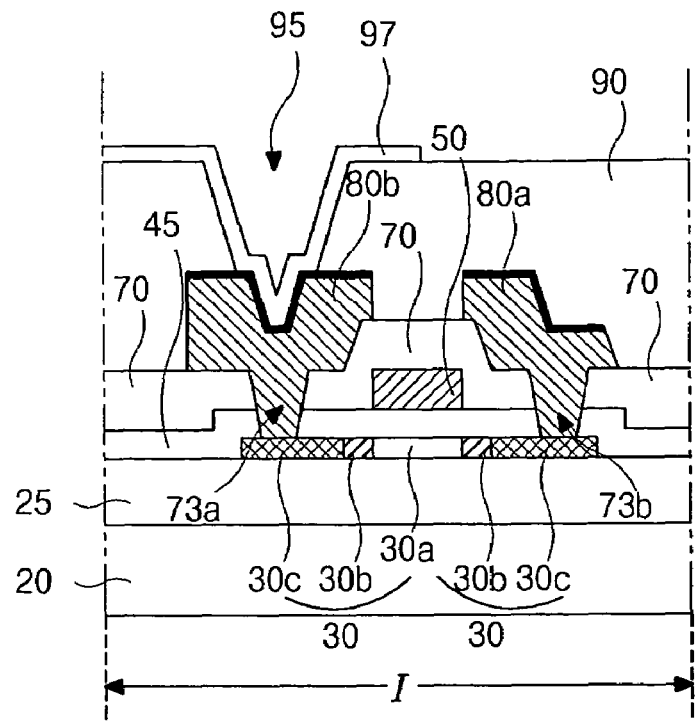
Figure 3A:
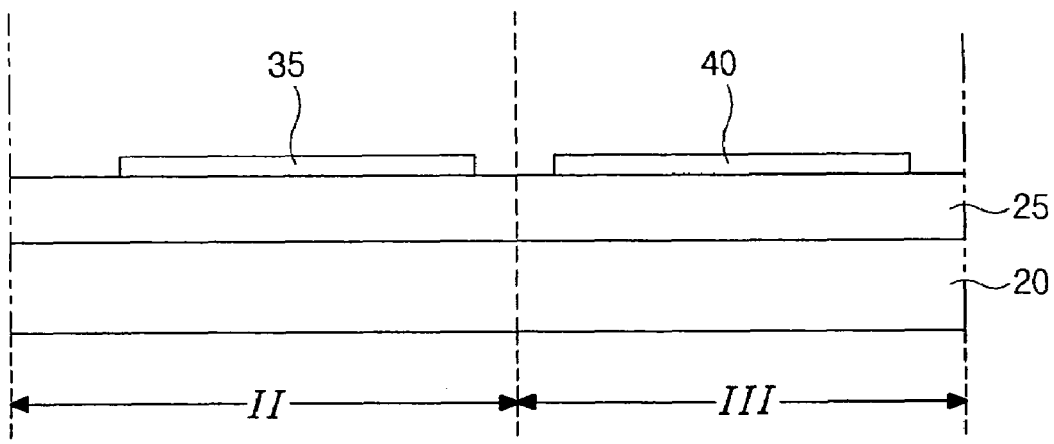
FIGS. 3A to 3F are schematic cross-sectional views showing a process of fabricating n-type and a p-type thin film transistors in a driving area of a liquid crystal display device according to the related art.
Figure 3B:
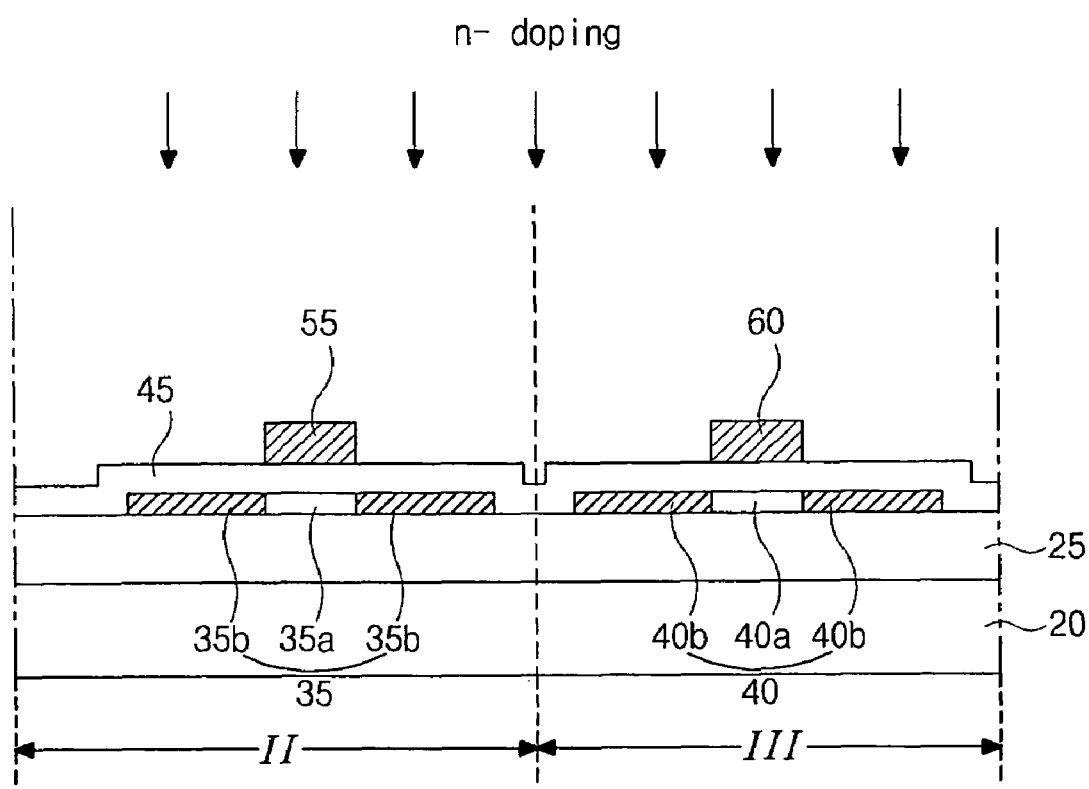
Figure 3C:
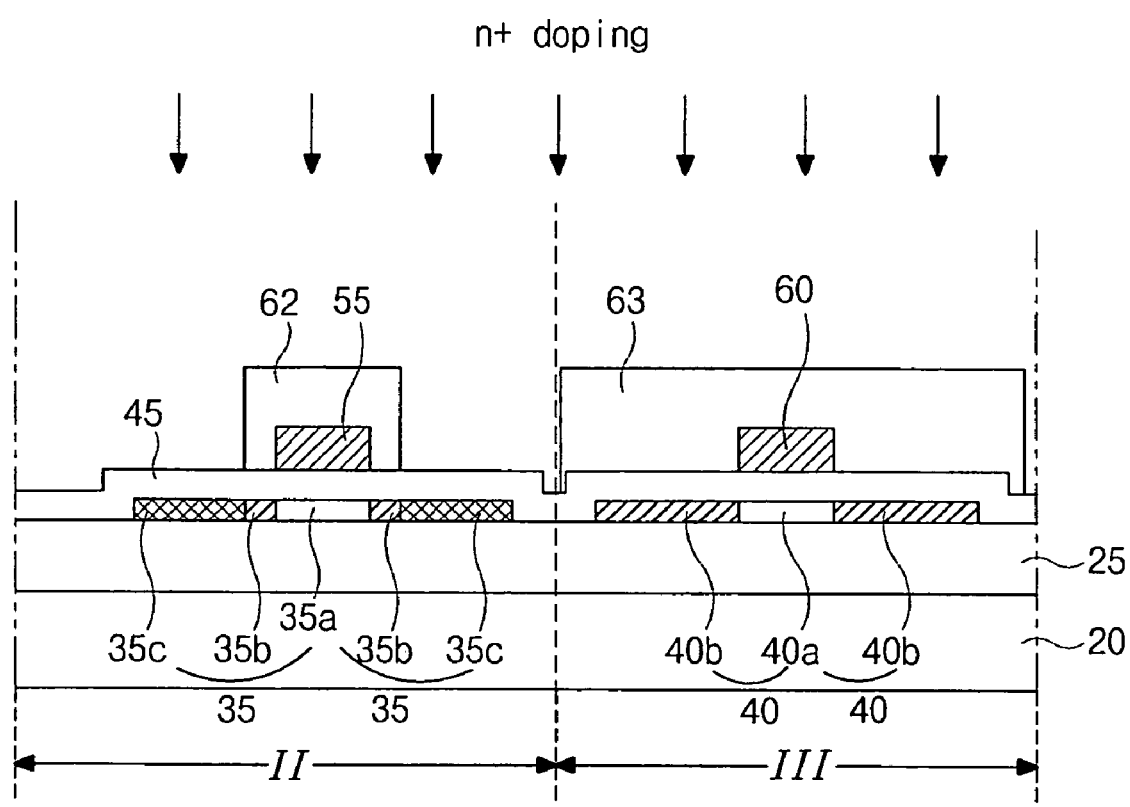
Figure 3D:
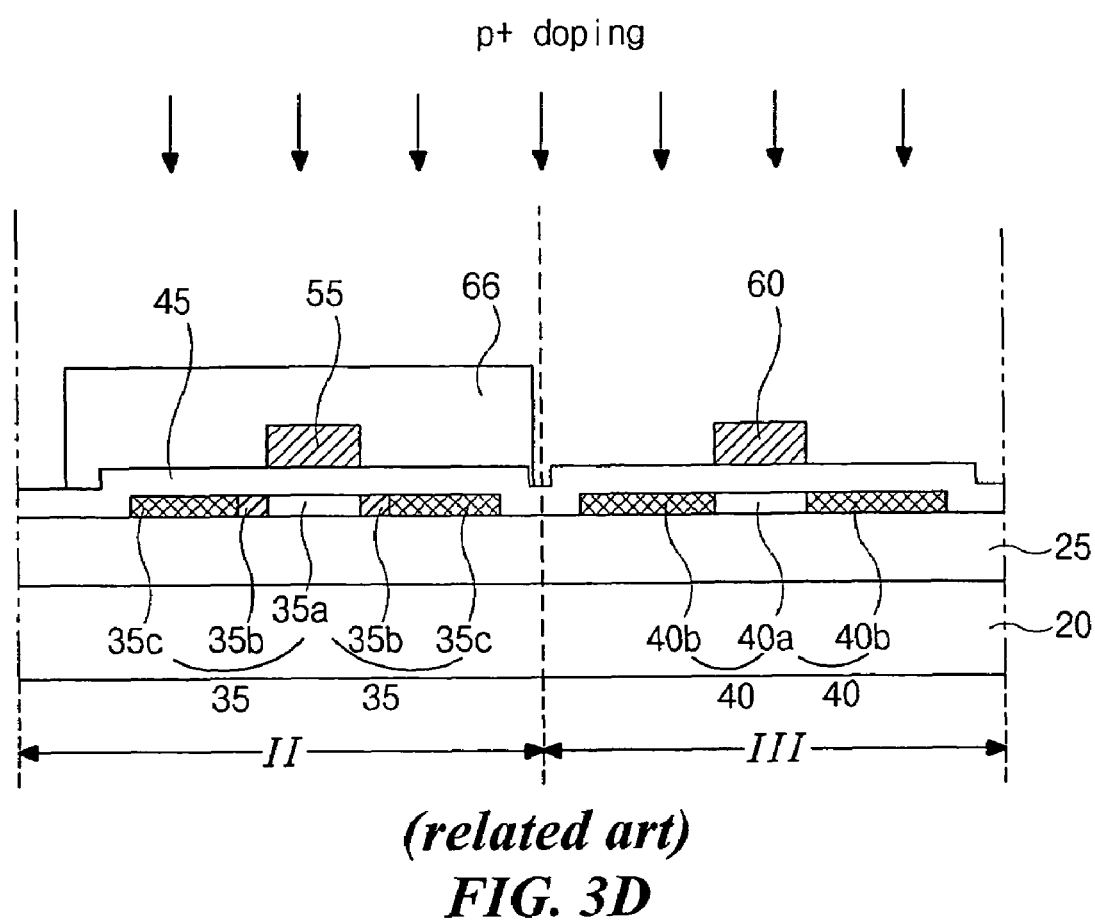
Figure 3E:
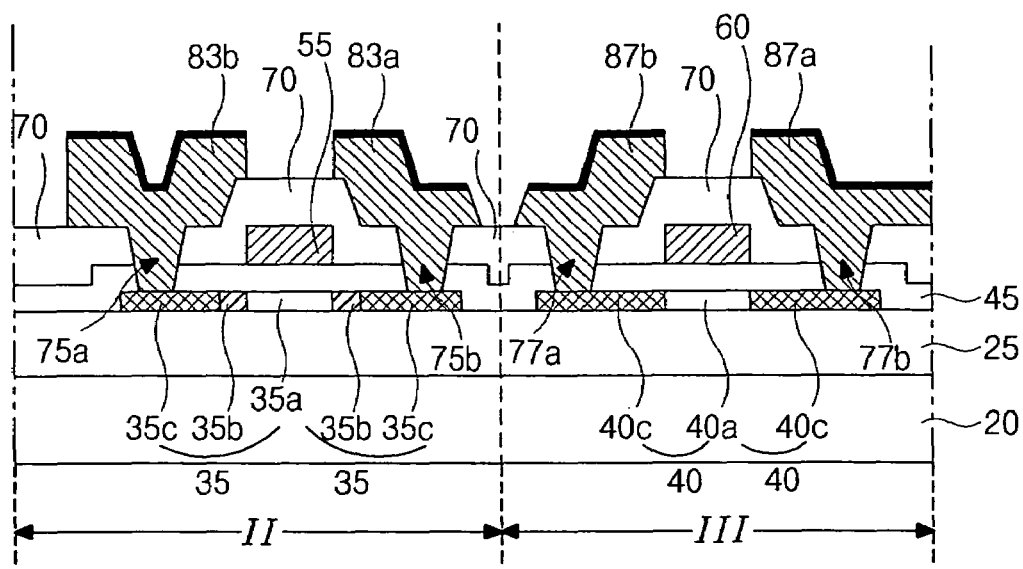
Figure 3F:
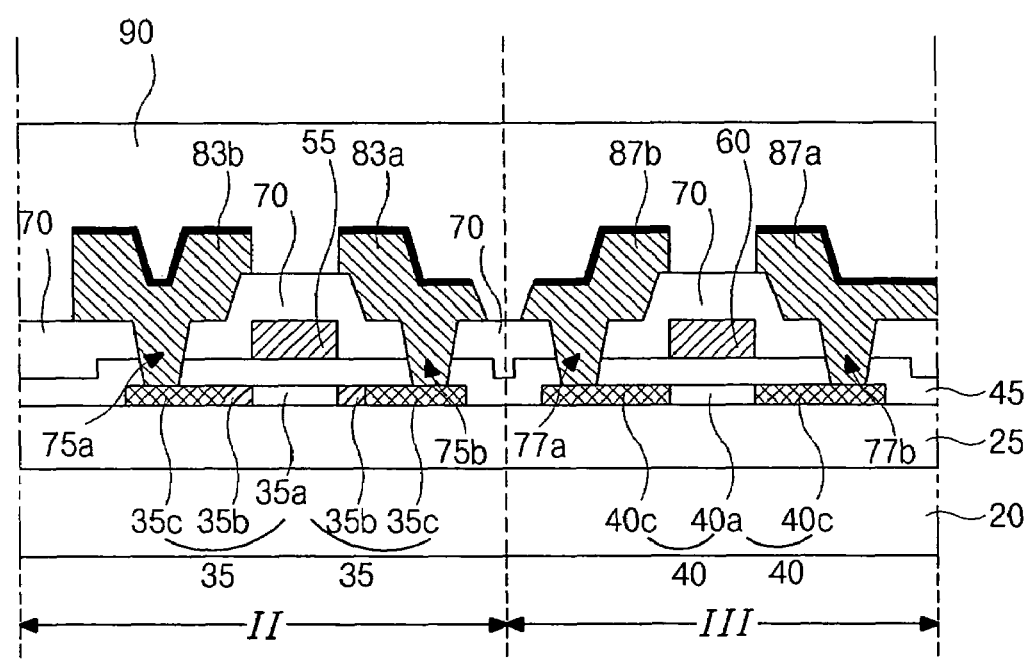
Figure 4:
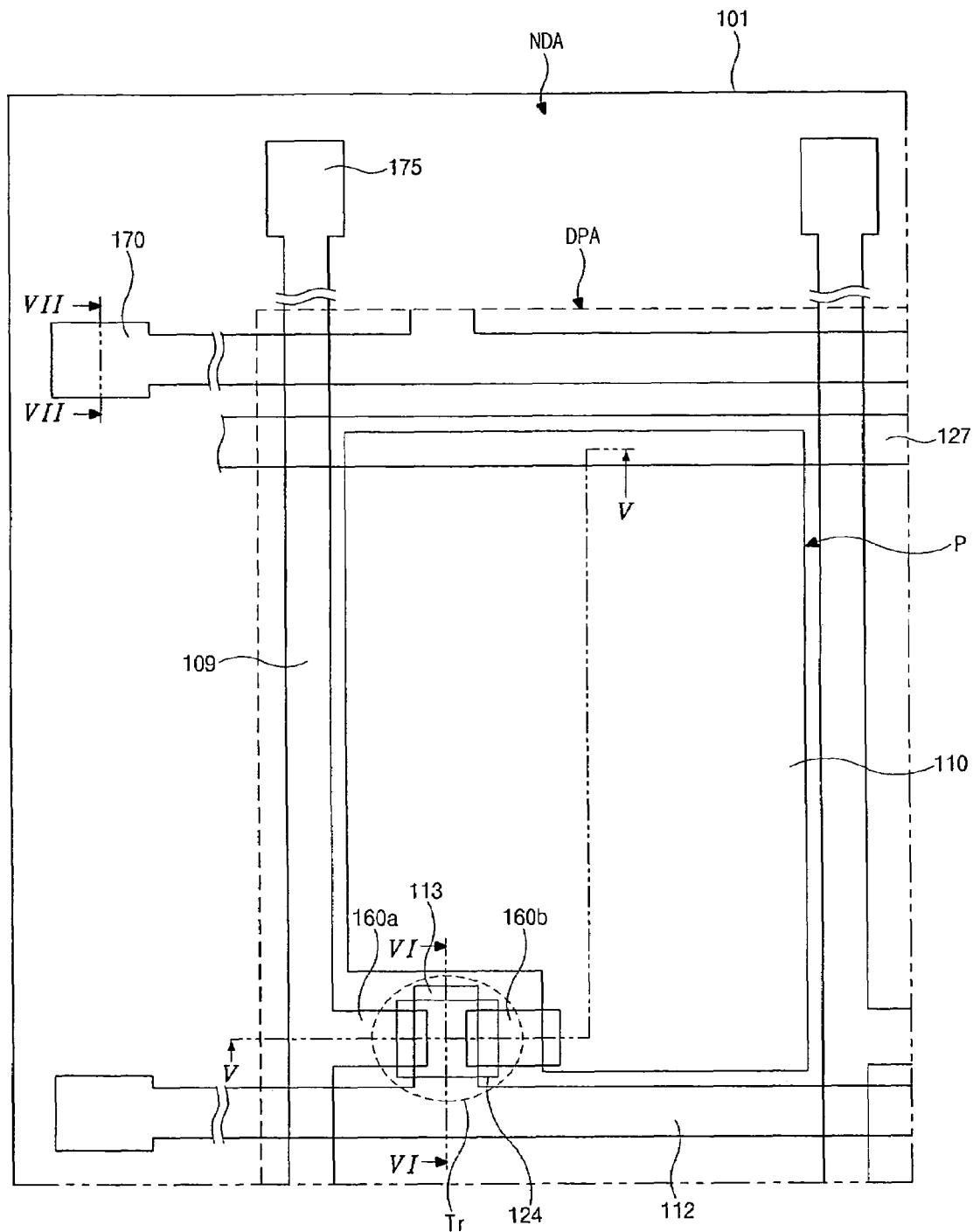
FIG. 4 is a schematic plane view showing an array substrate for a liquid crystal display device according to an exemplary embodiment of the present invention.

FIG. 4 is a schematic plane view showing an array substrate for a liquid crystal display device according to an exemplary embodiment of the present invention. FIG. 4 shows a display area and a pad area of the array substrate, and it does not show a driving area of the array substrate for simplicity.

In FIG. 4, a gate line 112 and a data line 109 are formed on a substrate 101 in a display area "DPA." A gate pad 170 is formed at one end of the gate line 112 and a data pad 175 is formed at one end of the data line 109. The gate line 112 intersects the data line 109 to define a pixel region "P." A thin film transistor (TFT) "Tr" formed as a switching element is connected to the gate line 112 and the data line 109. The gate pad 170 and the data pad 175 are disposed in a non-display area "NDA" at a periphery of the display area "DPA." In addition, a common line 127 is disposed parallel to and spaced apart from the gate line 112. A pixel electrode 110 connected to the TFT "Tr" is disposed in the pixel region "P" and overlaps the common line 127 to form a storage capacitor. The pixel electrode 110 directly contacts the TFT "Tr" without a contact hole.

Figure 5A:
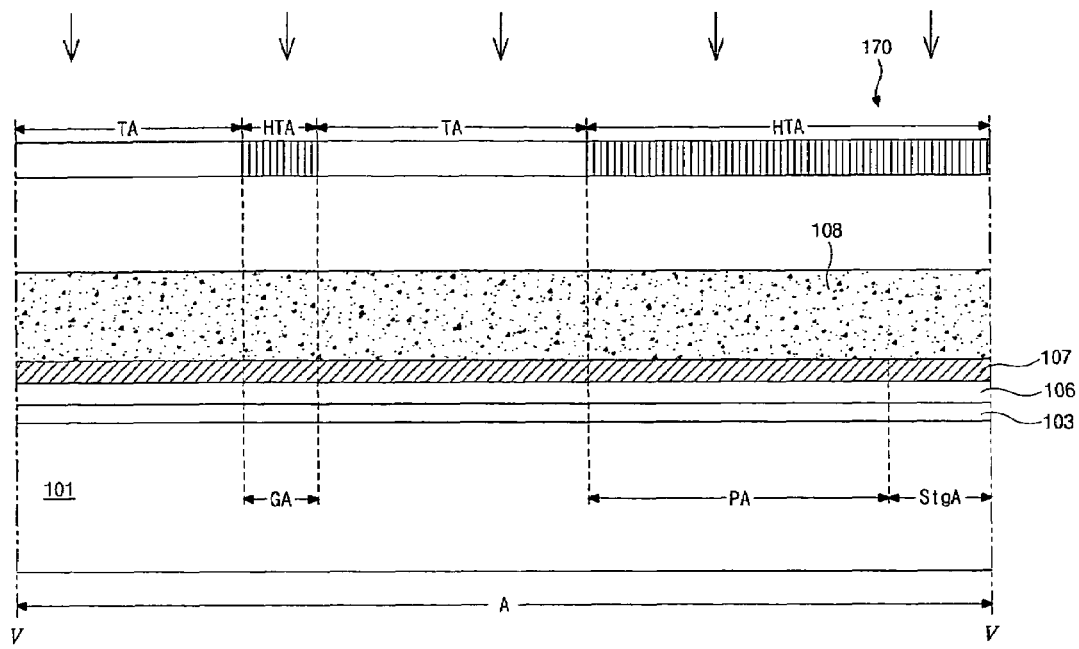
FIGS. 5A to 5P are schematic cross-sectional views taken along line "V-V" of FIG. 4 showing a fabricating process of a pixel thin film transistor and a storage capacitor in a display area of an array substrate according to an exemplary embodiment of the present invention.
Figure 5B:
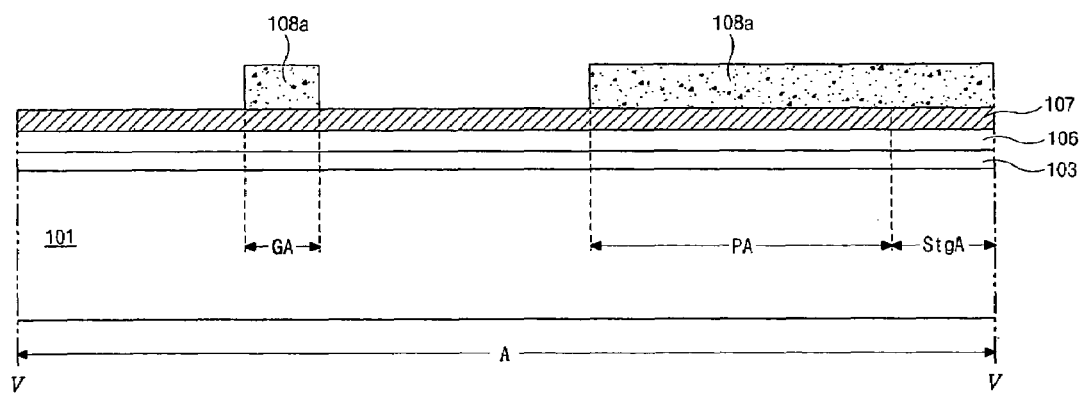
Figure 5C:
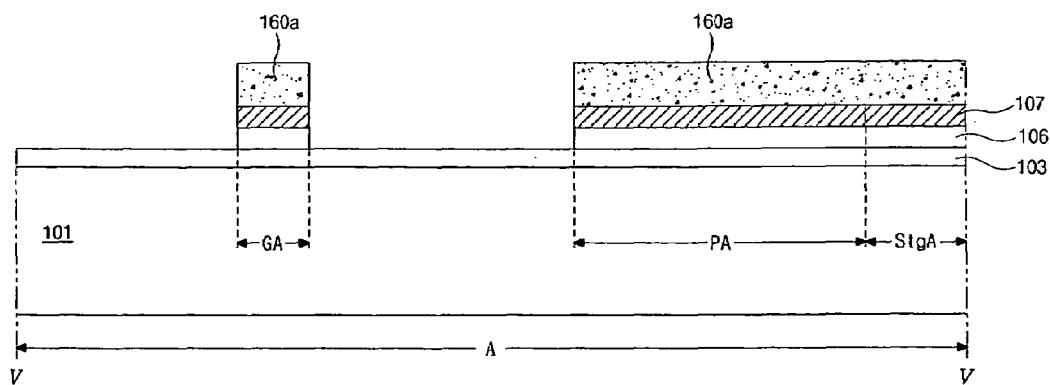
Figure 5D:
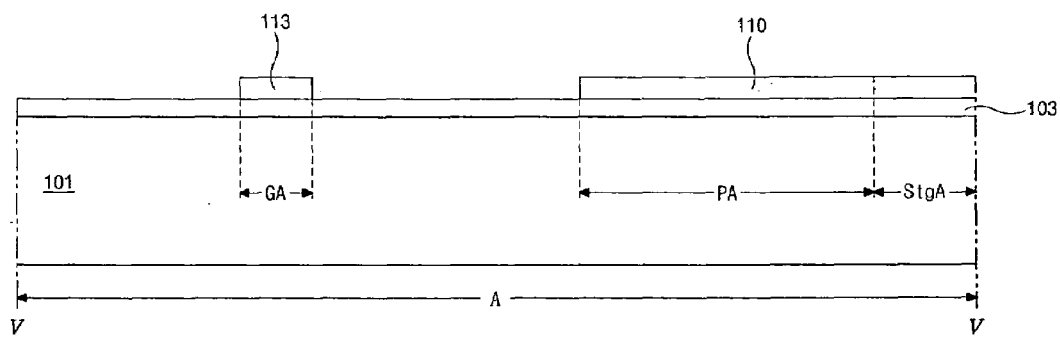
Figure 5E:
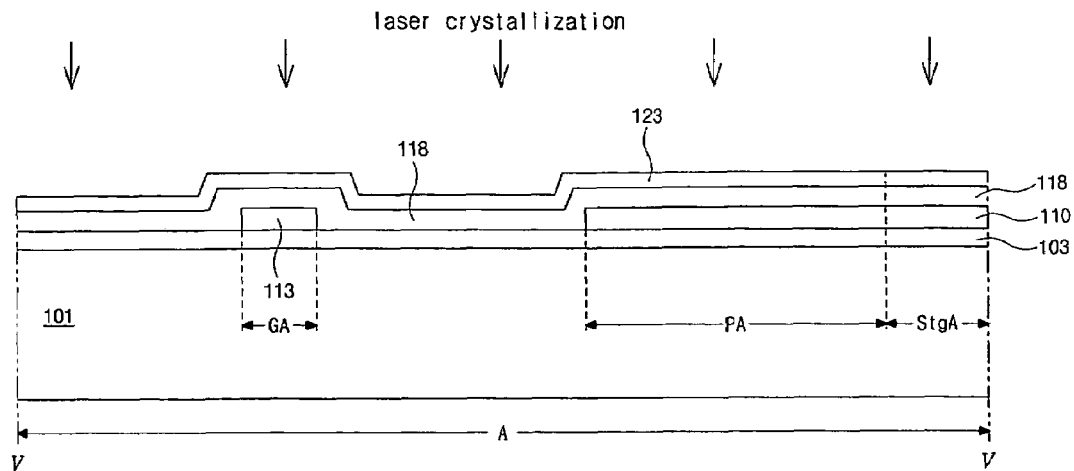
Figure 5F:
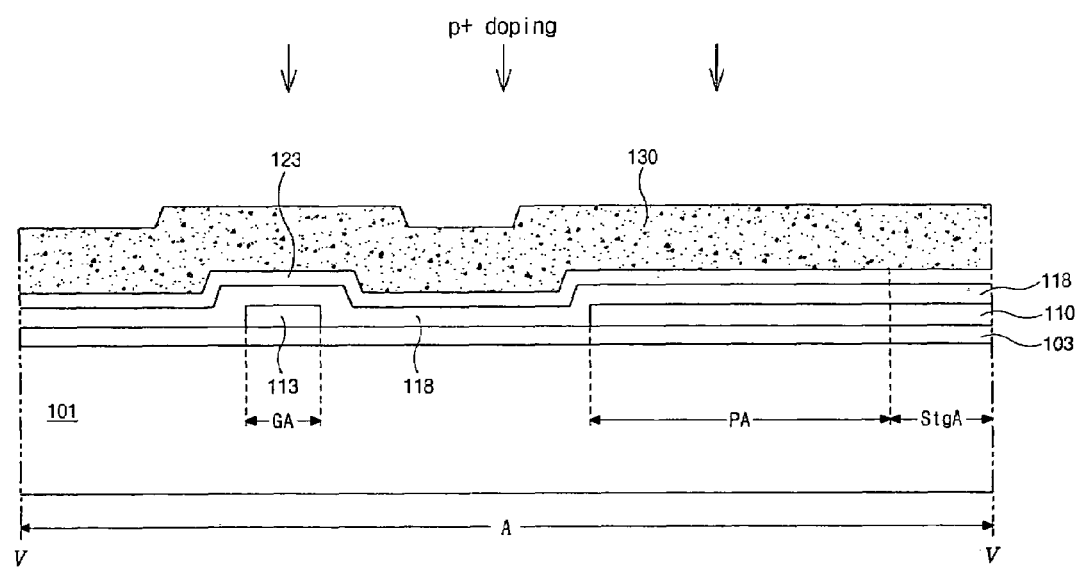
Figure 5G:
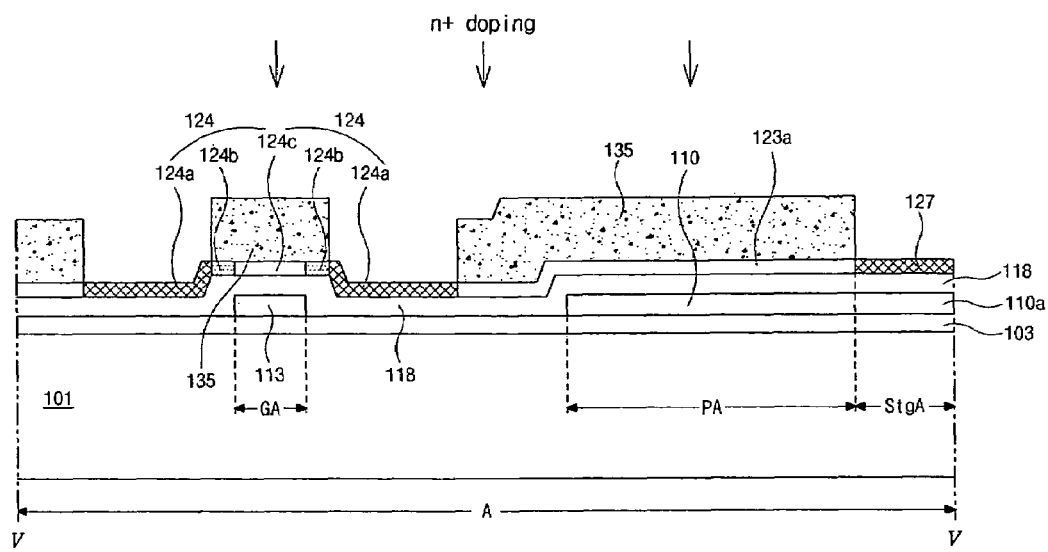
Figure 5H:
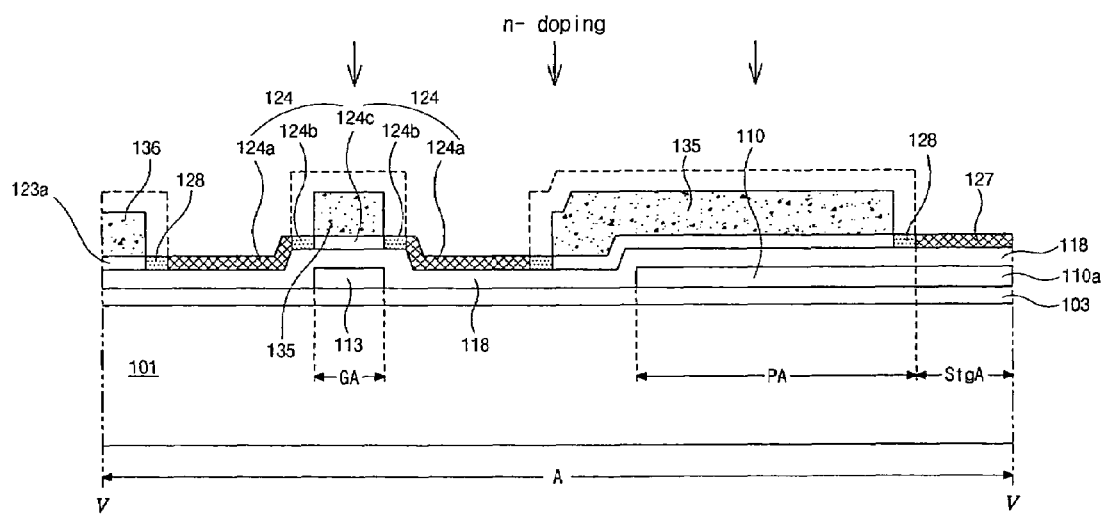
Figure 5I:
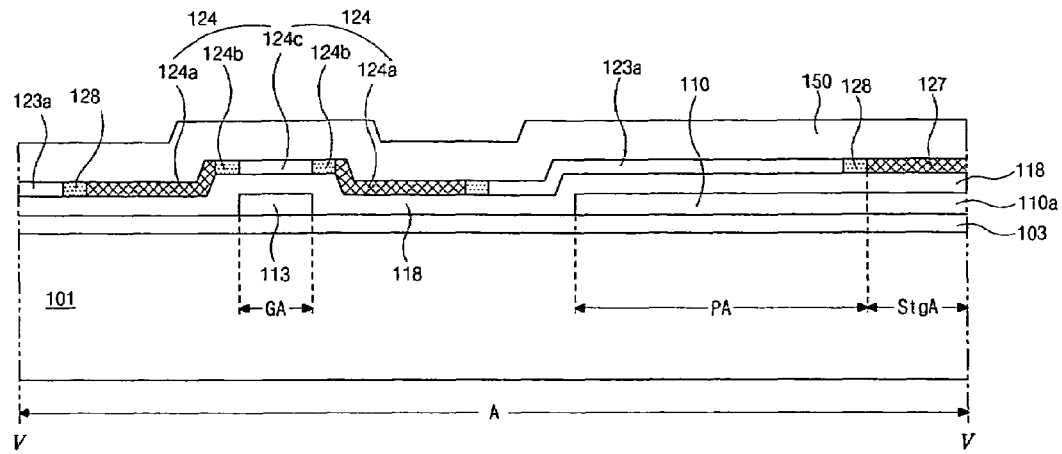
Figure 5J:
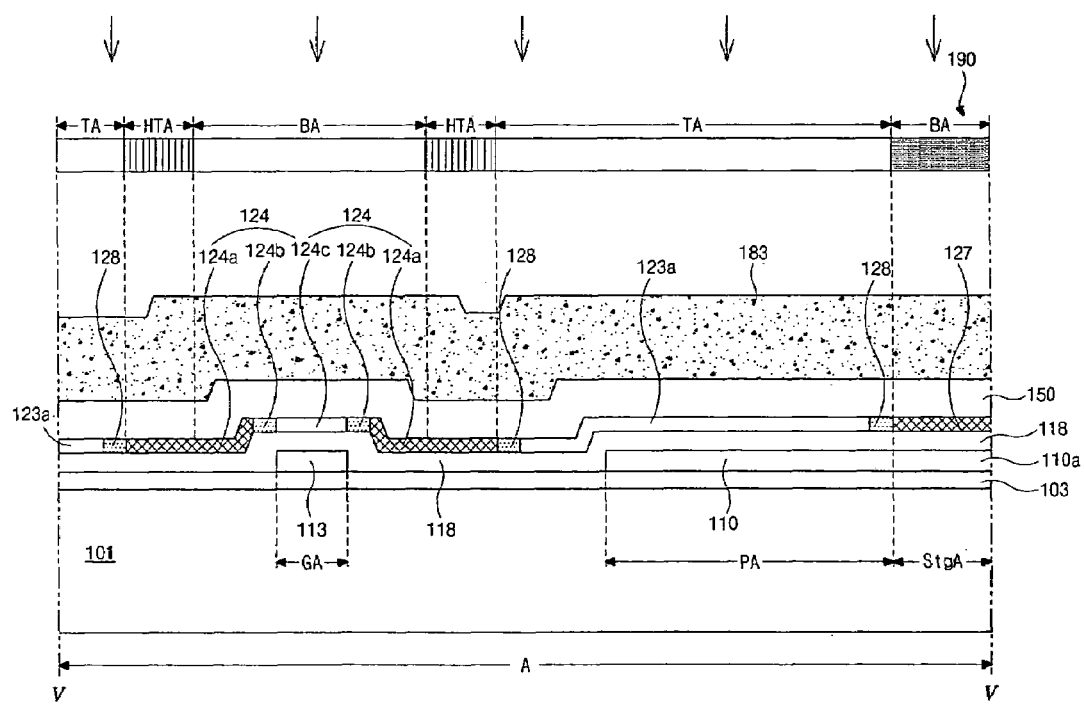
Figure 5K:
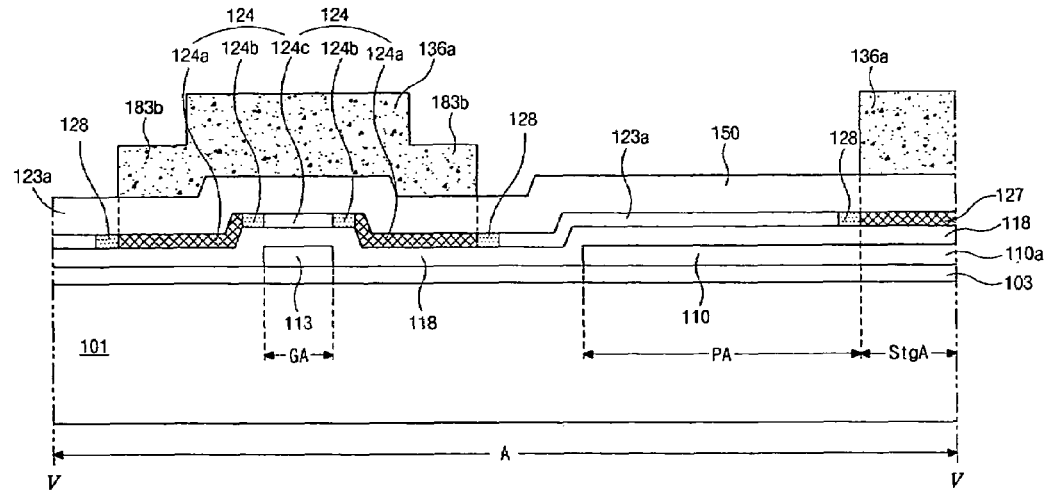
Figure 5L:
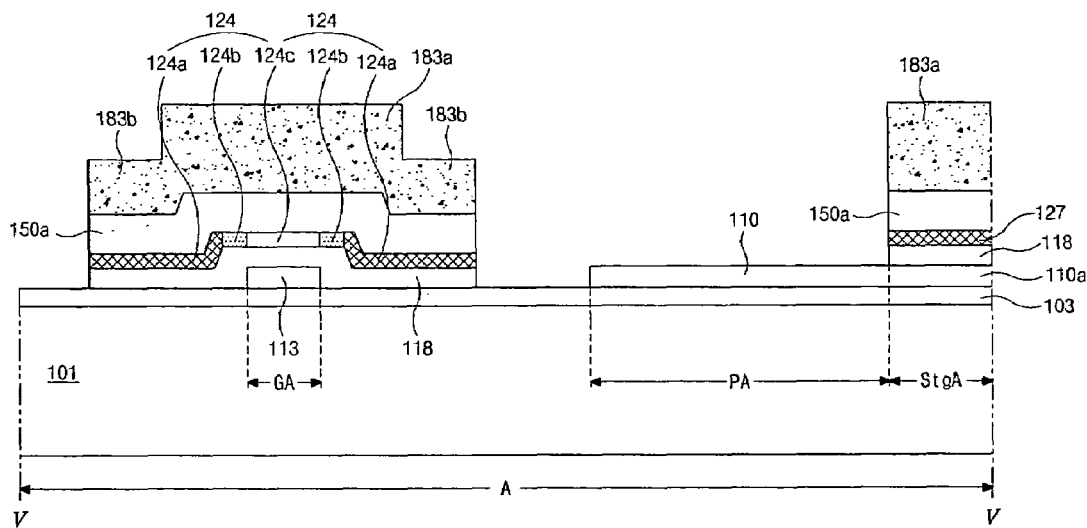
Figure 5M:
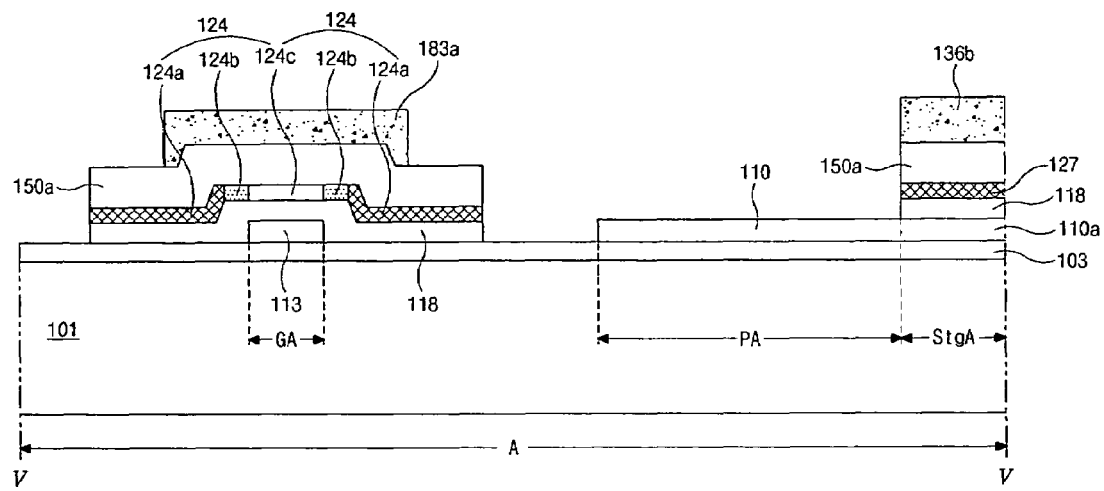
Figure 5N:
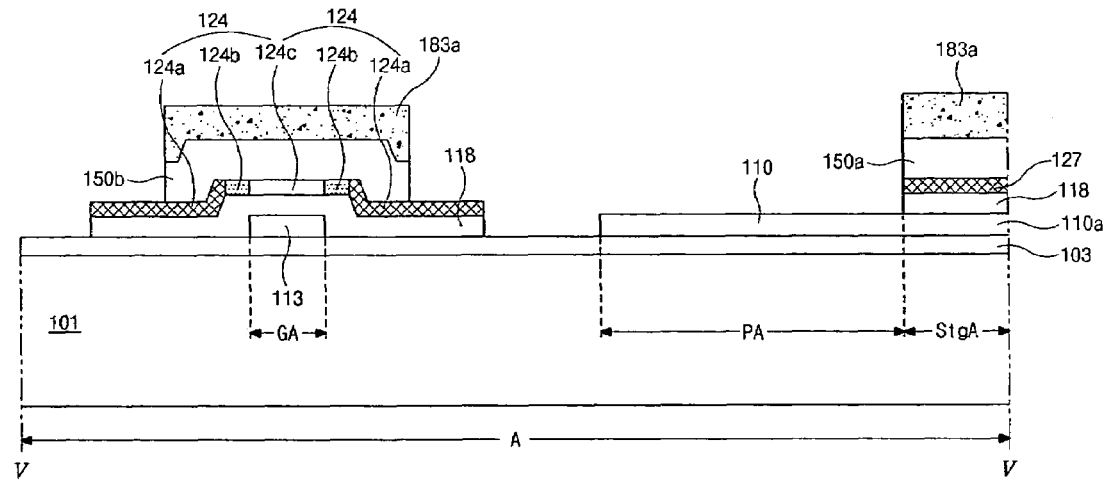
Figure 5O:
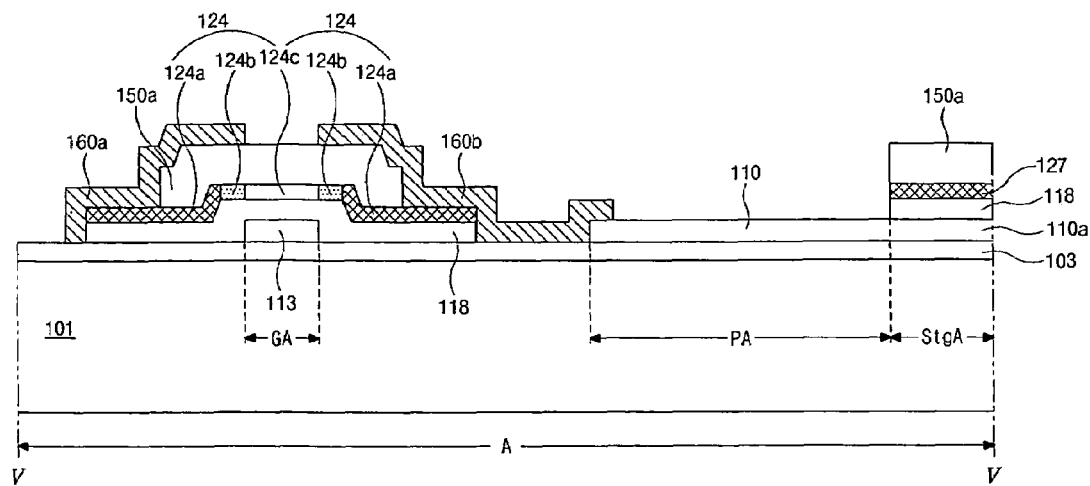
Figure 5P:
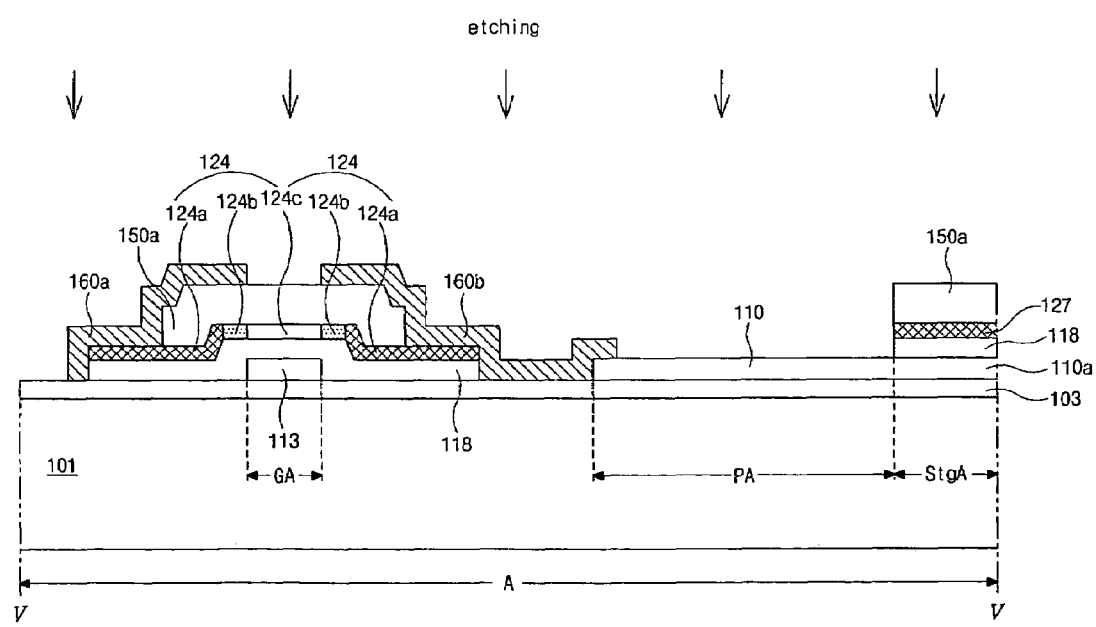
Figure 6A:
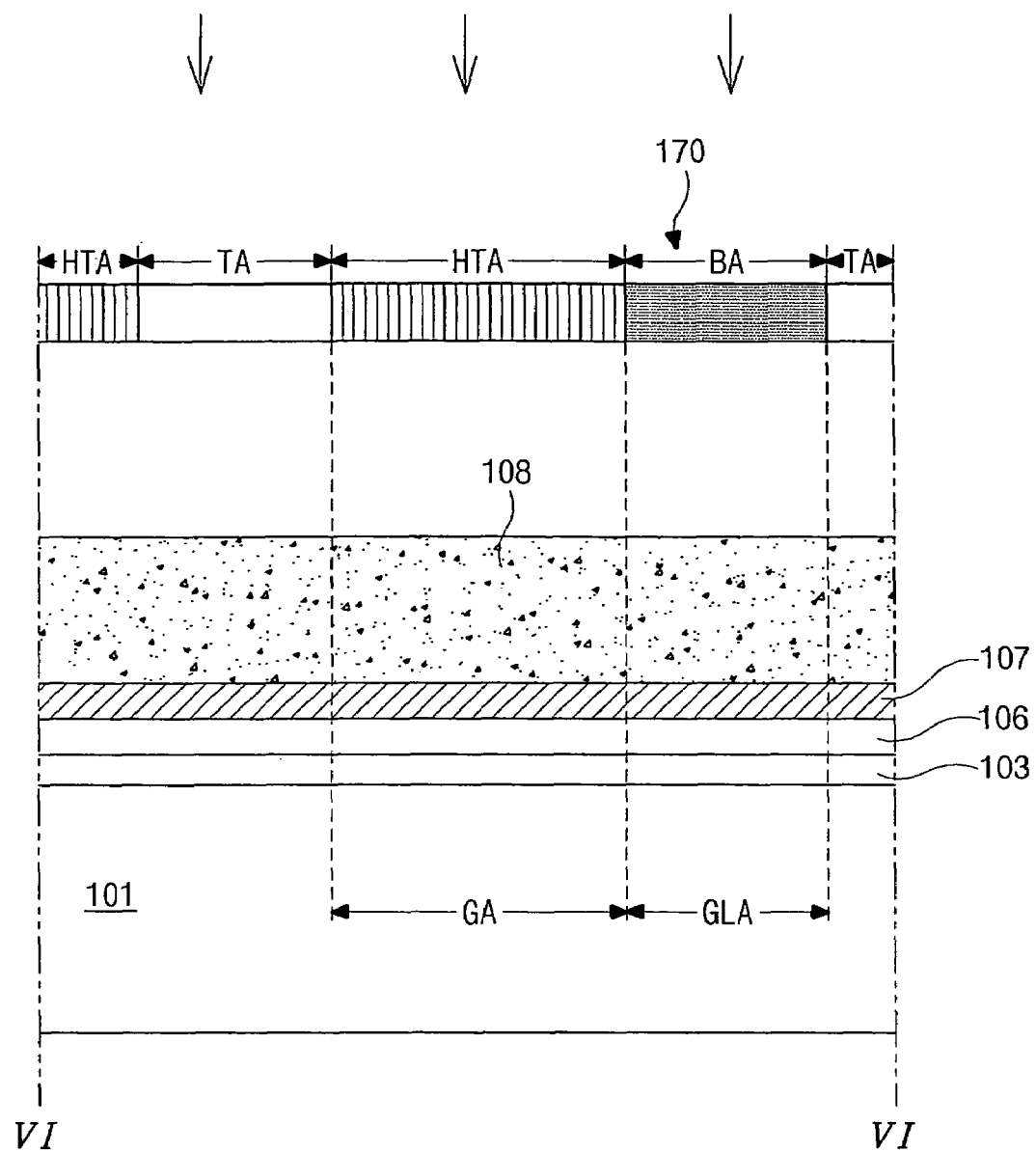
FIGS. 6A to 6P are schematic cross-sectional views taken along line "VI-VI" of FIG. 4 showing a fabricating process of a pixel thin film transistor in a display area of an array substrate for a liquid crystal display device according to an exemplary embodiment of the present invention.
Figure 6P:
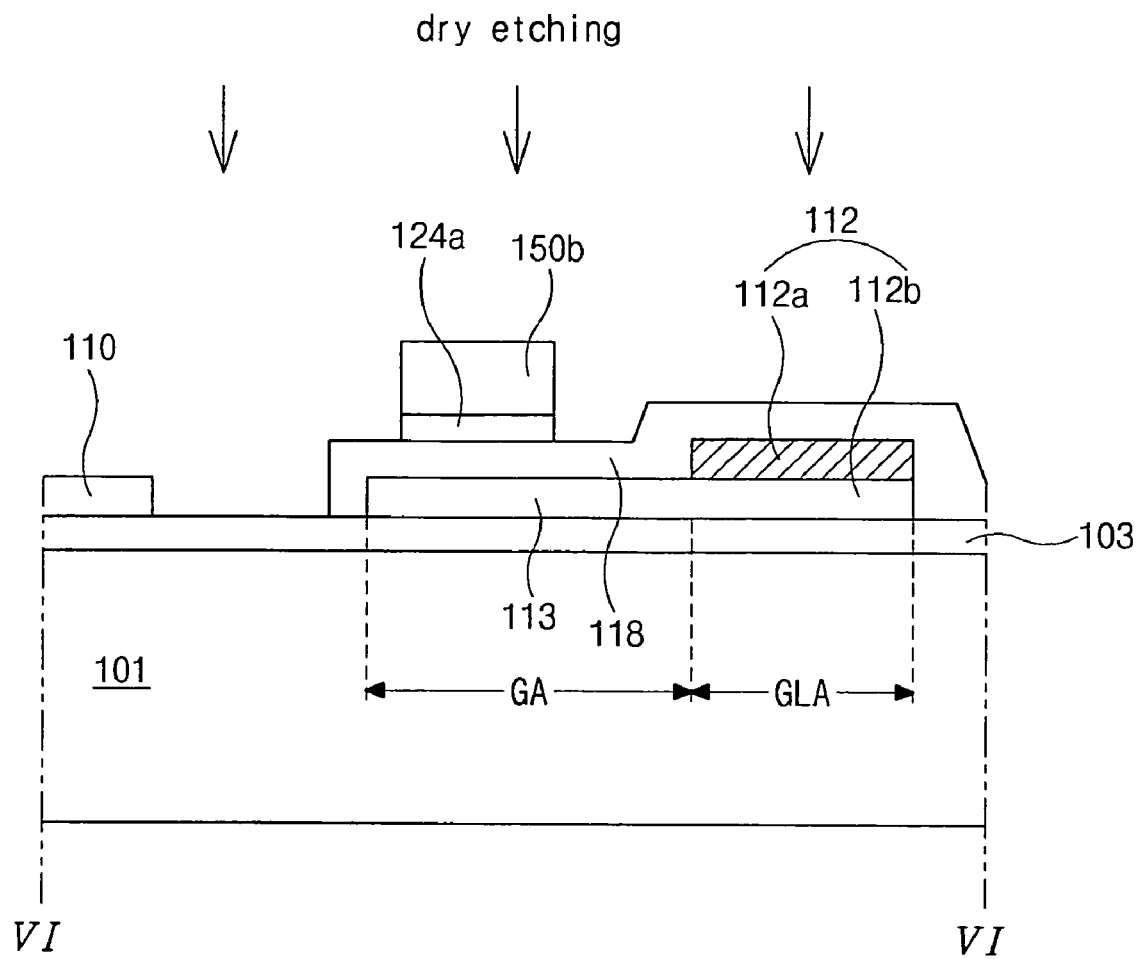
Figure 7A:
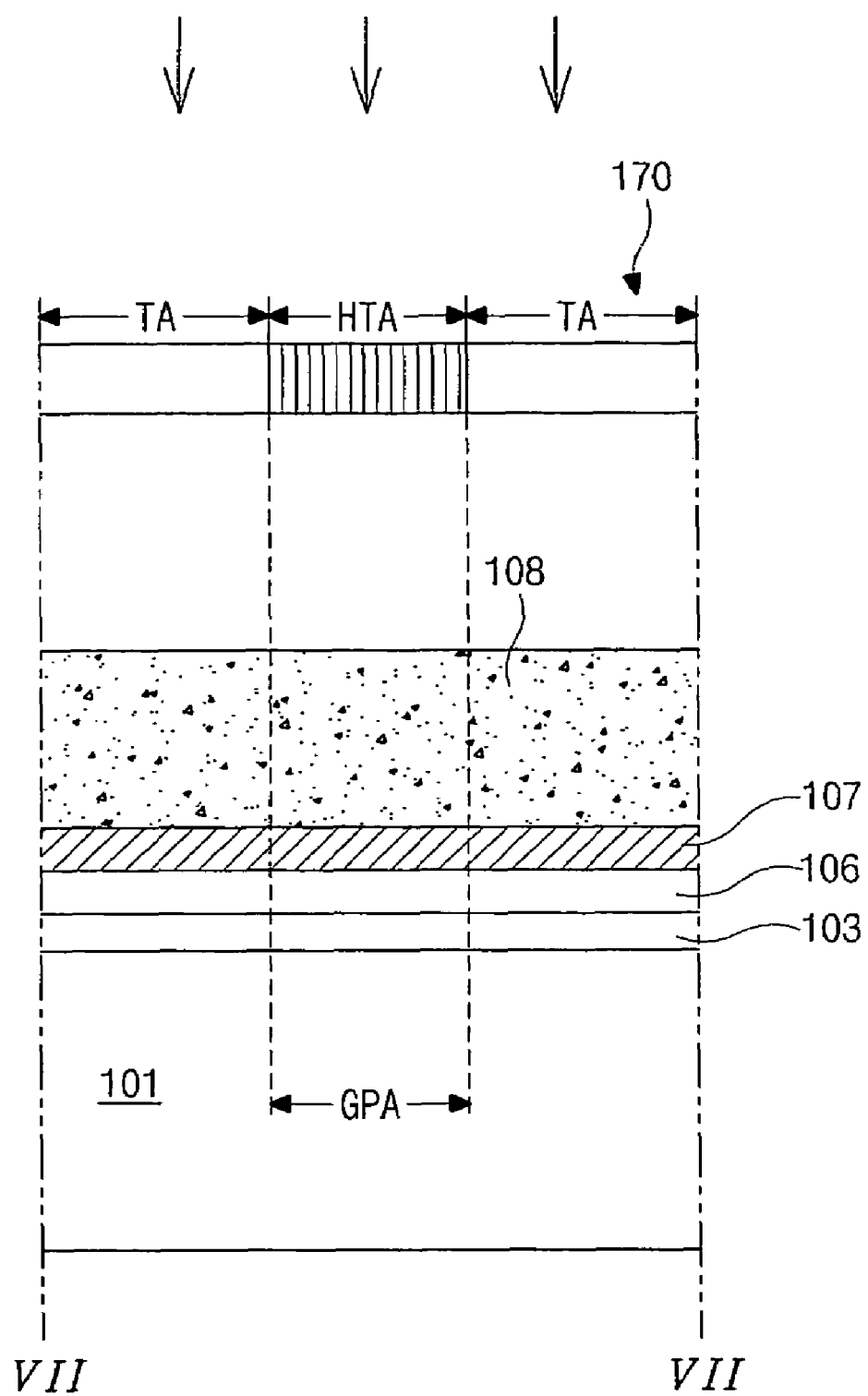
FIGS. 7A to 7P are schematic cross-sectional views taken along line "VII-VII" of FIG. 4 showing a gate pad in a non-display area of an array substrate according to an exemplary embodiment of the present invention.
Figure 7B:
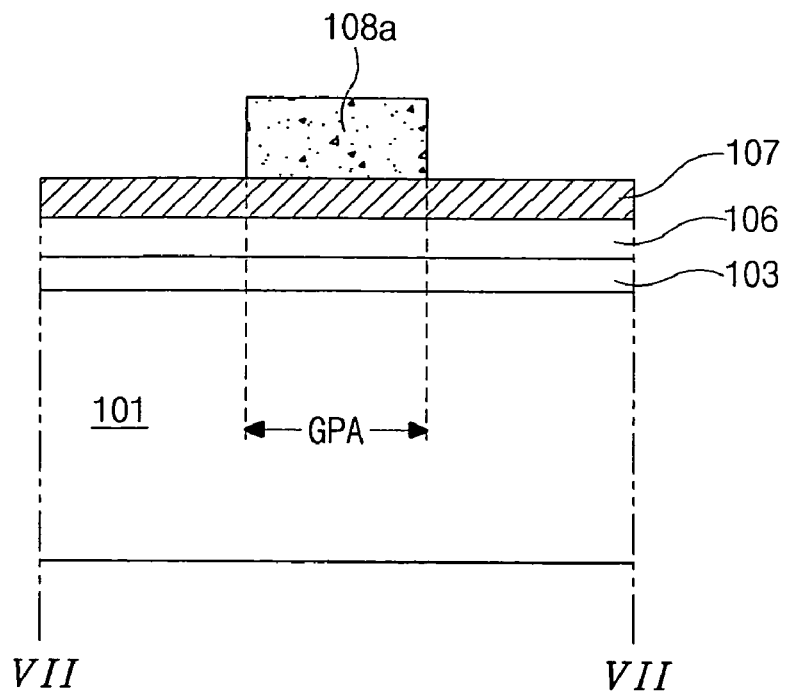
Figure 7C:
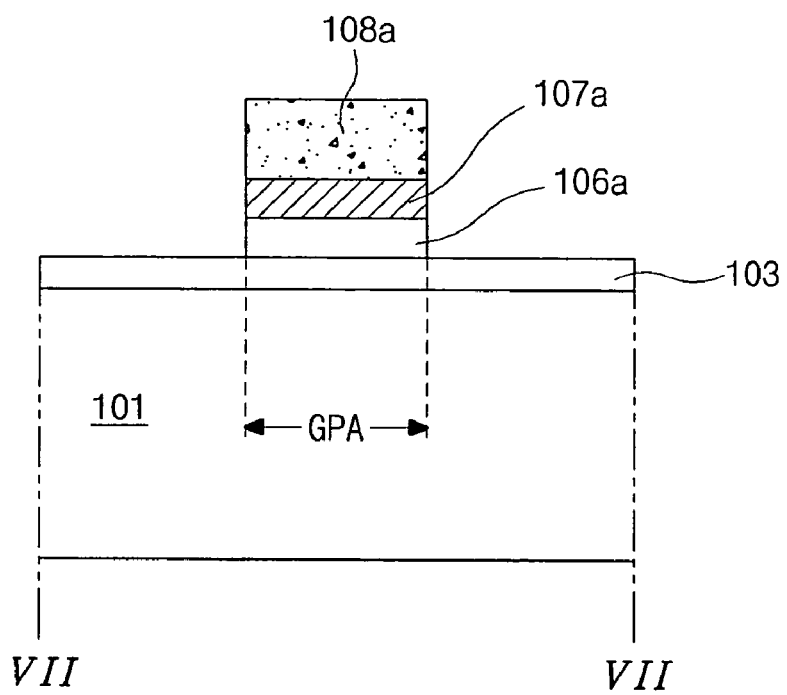
Figure 7D:
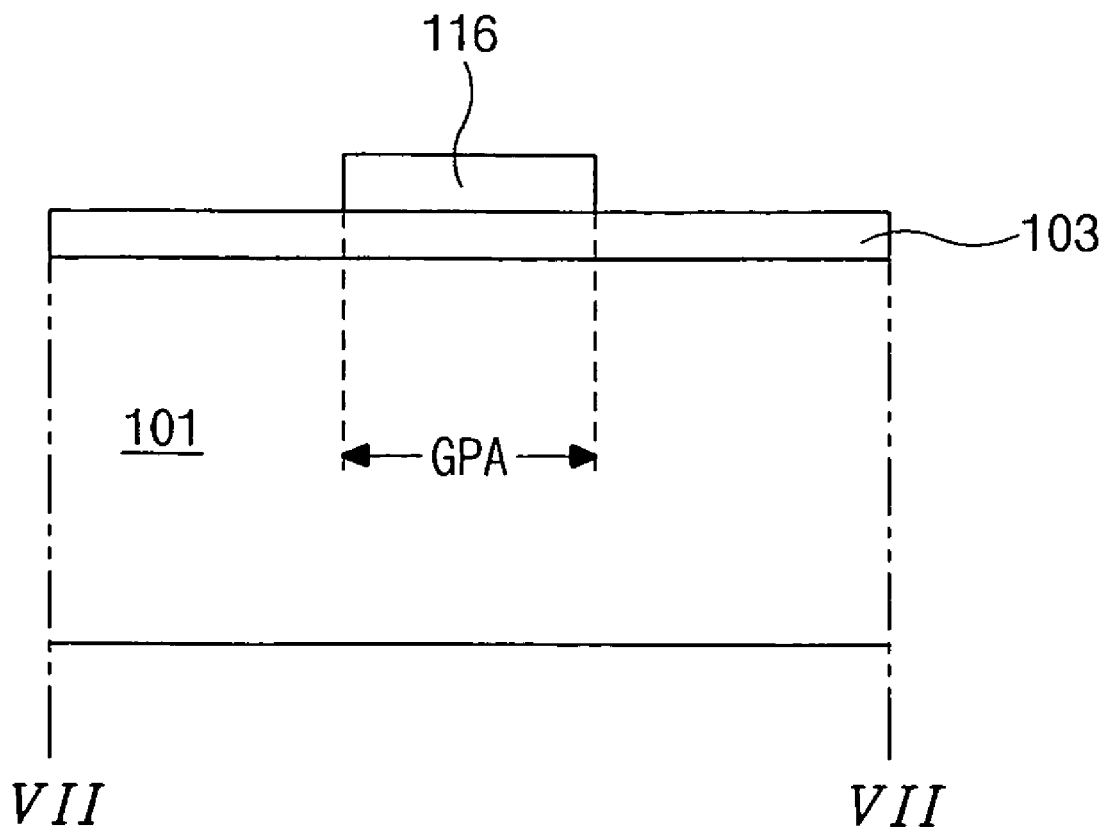
Figure 7E:
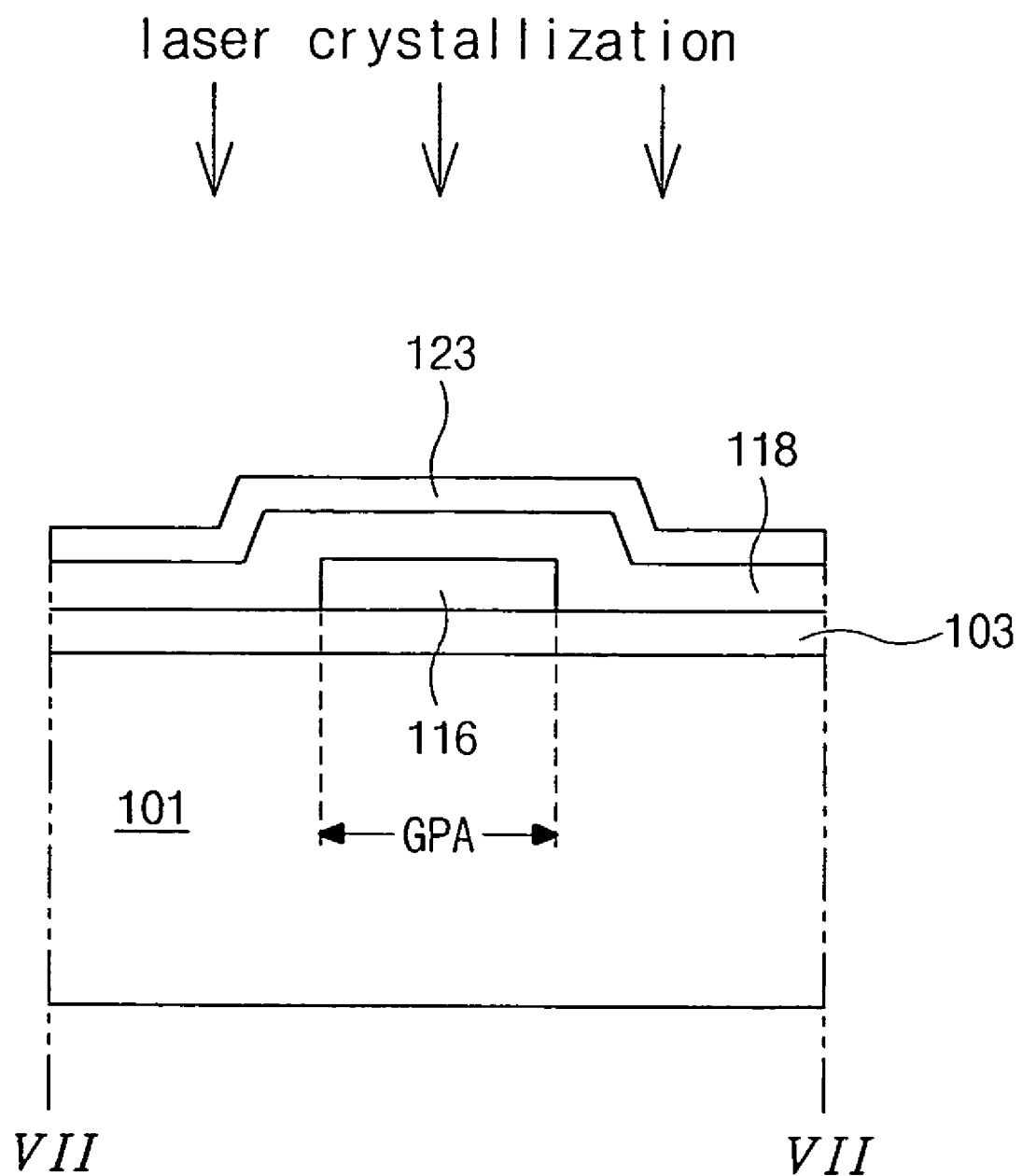
Figure 7F:
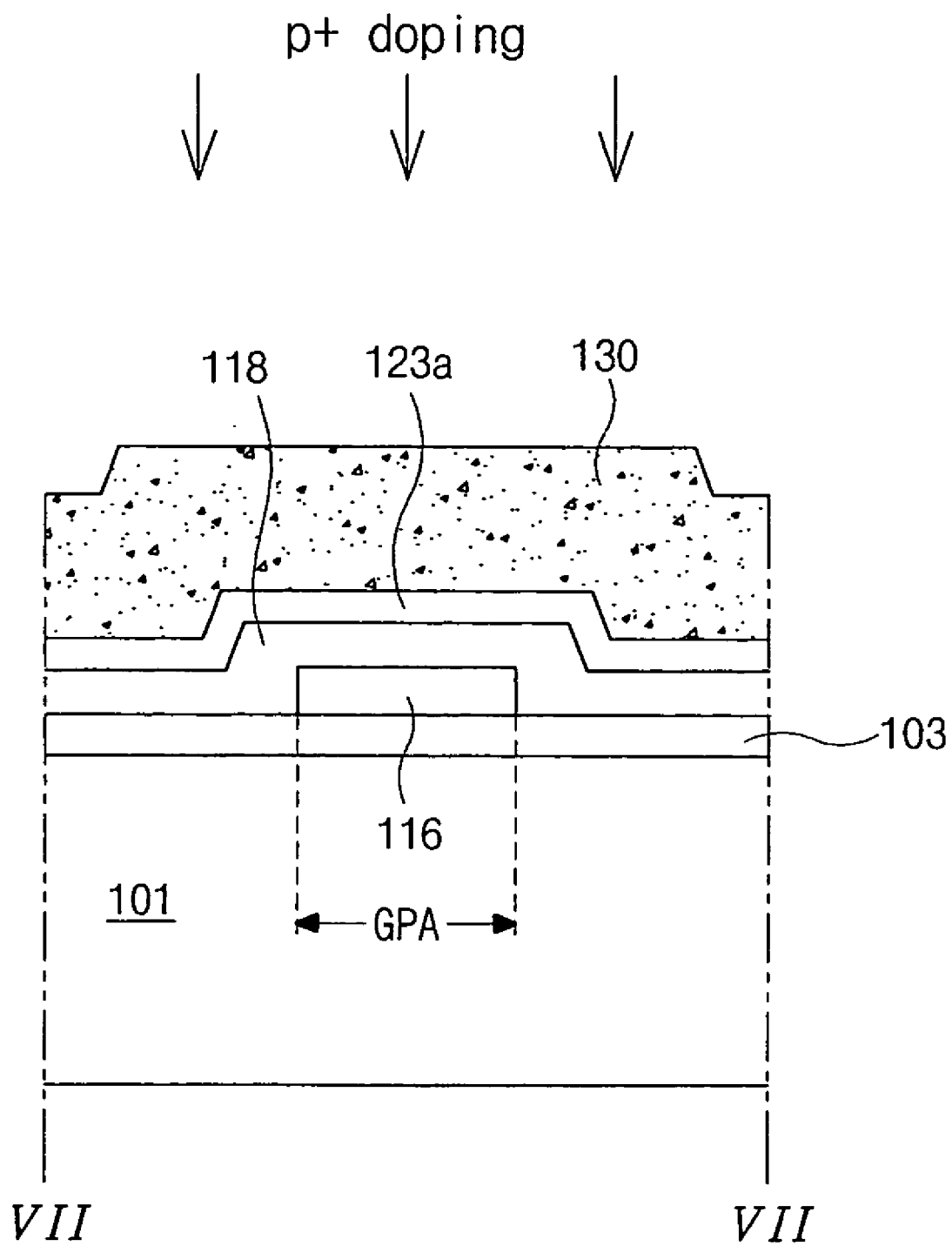
Figure 7G:
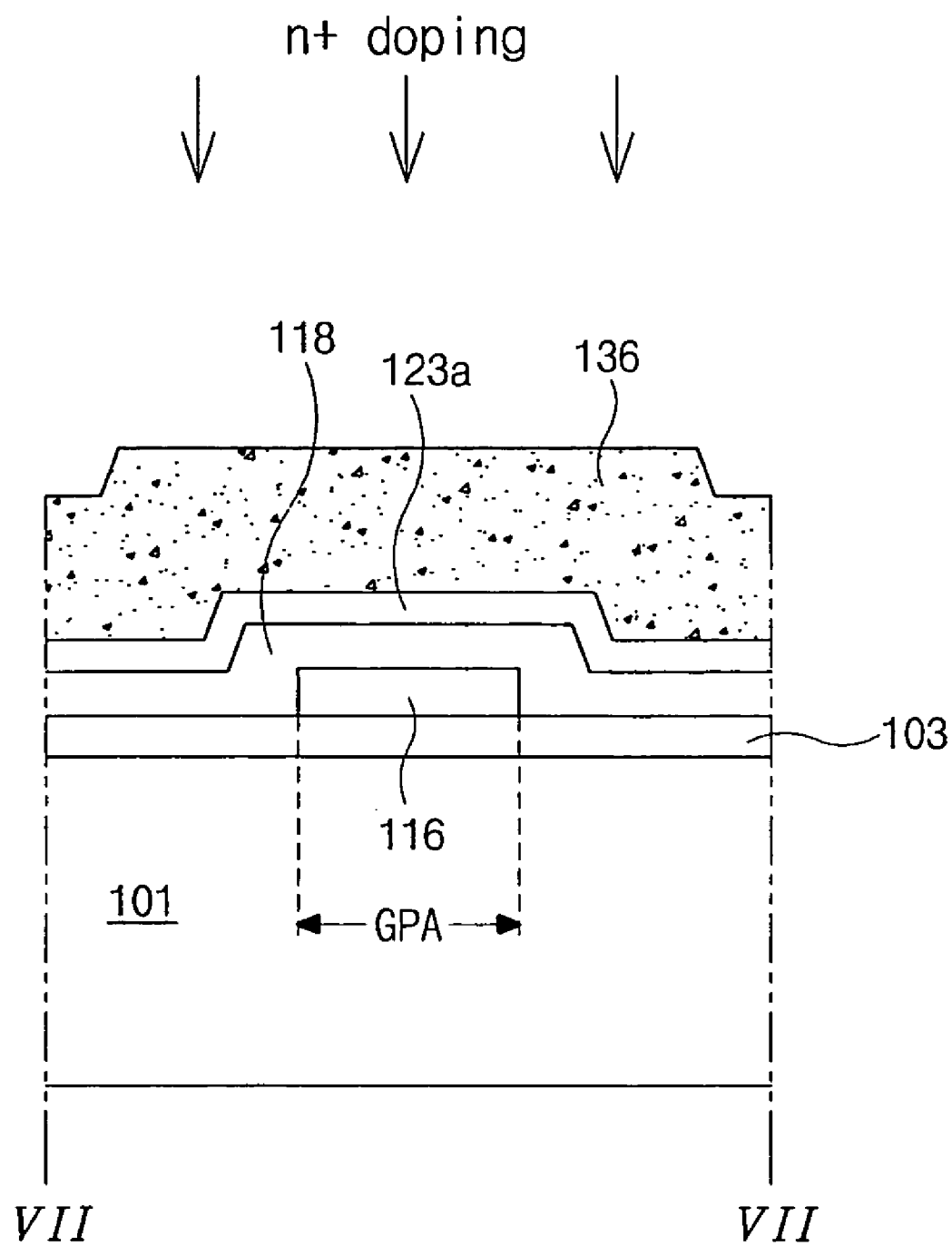
Figure 7H:
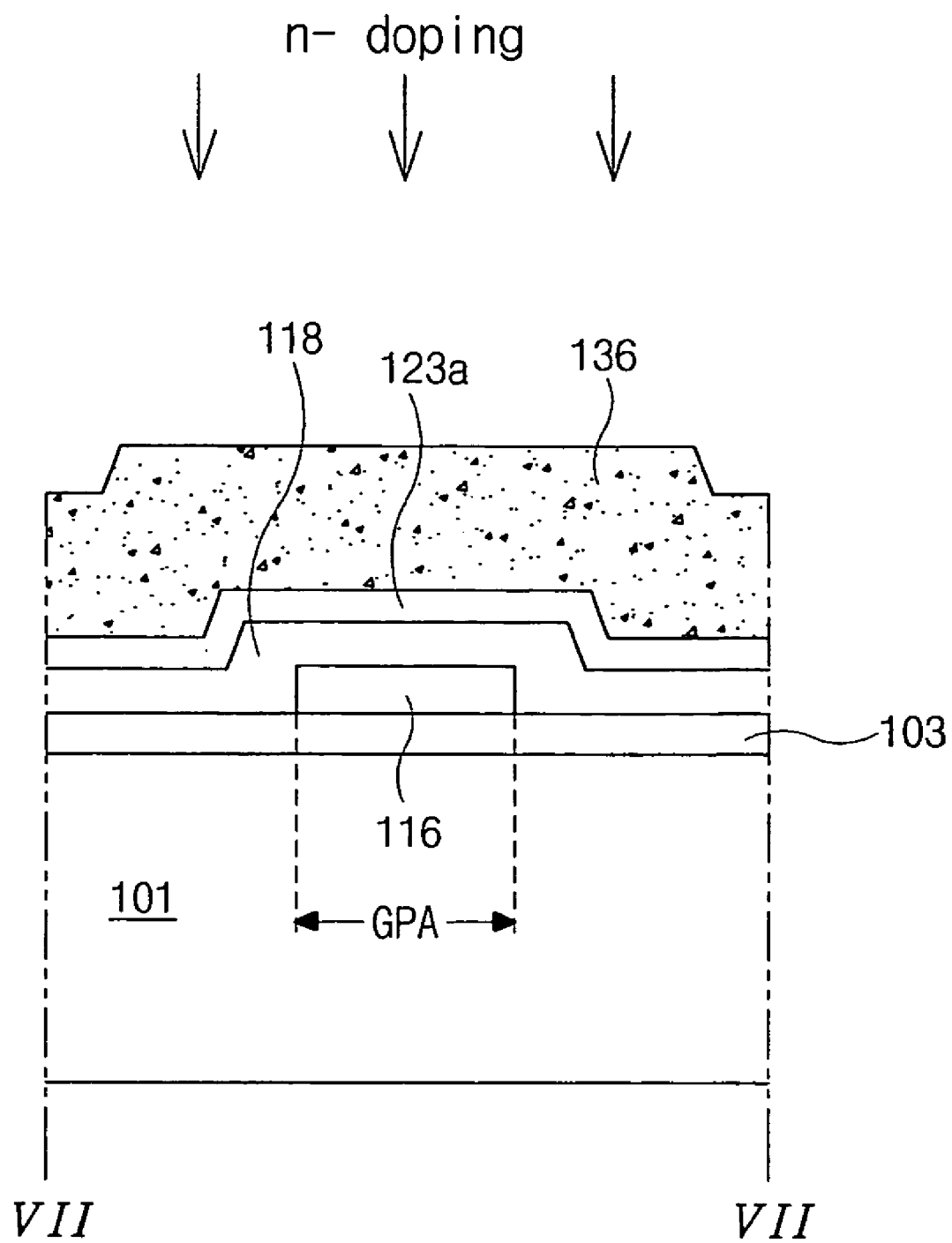
Figure 7I:
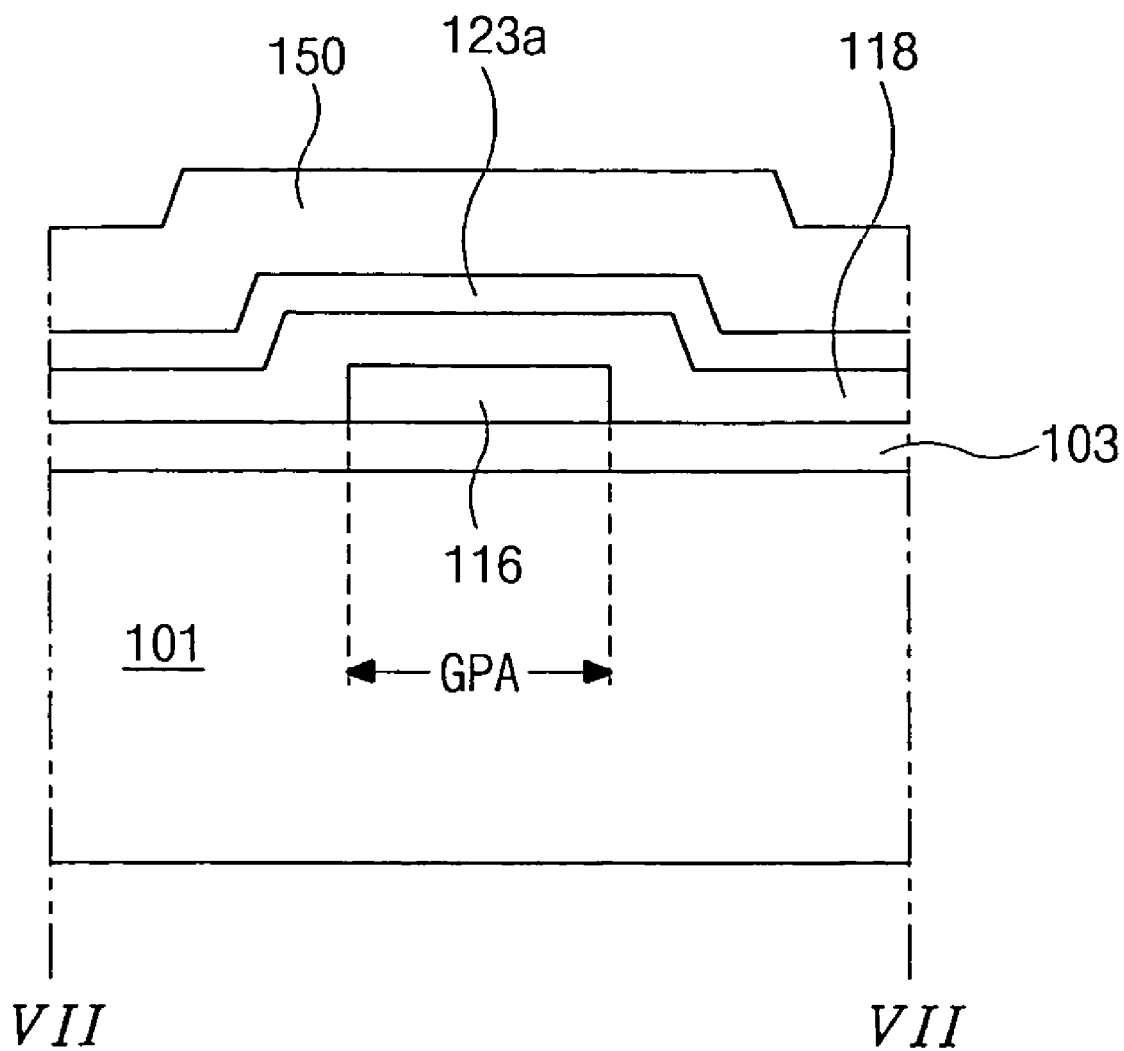
Figure 7J:
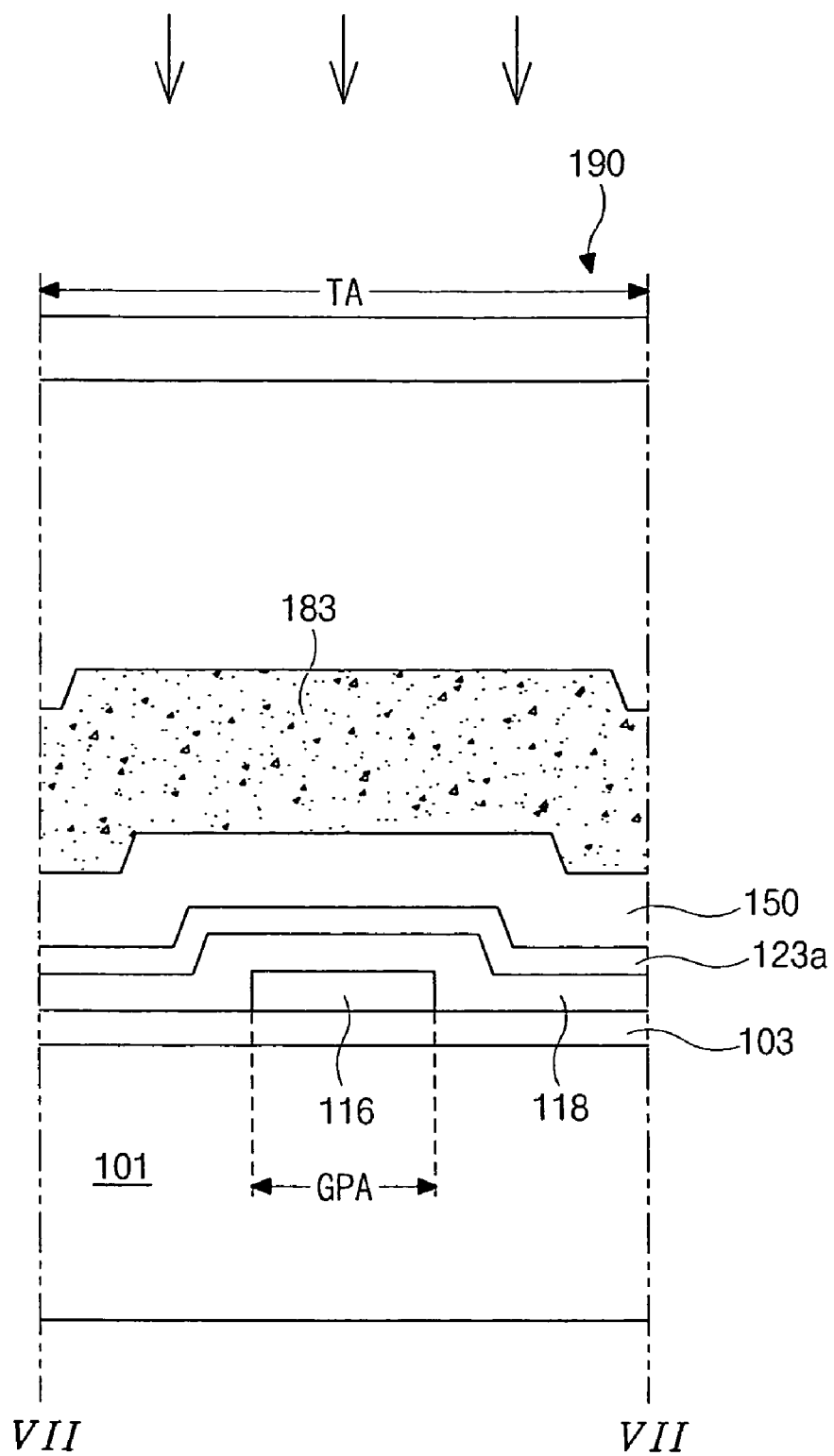
Figure 7K:
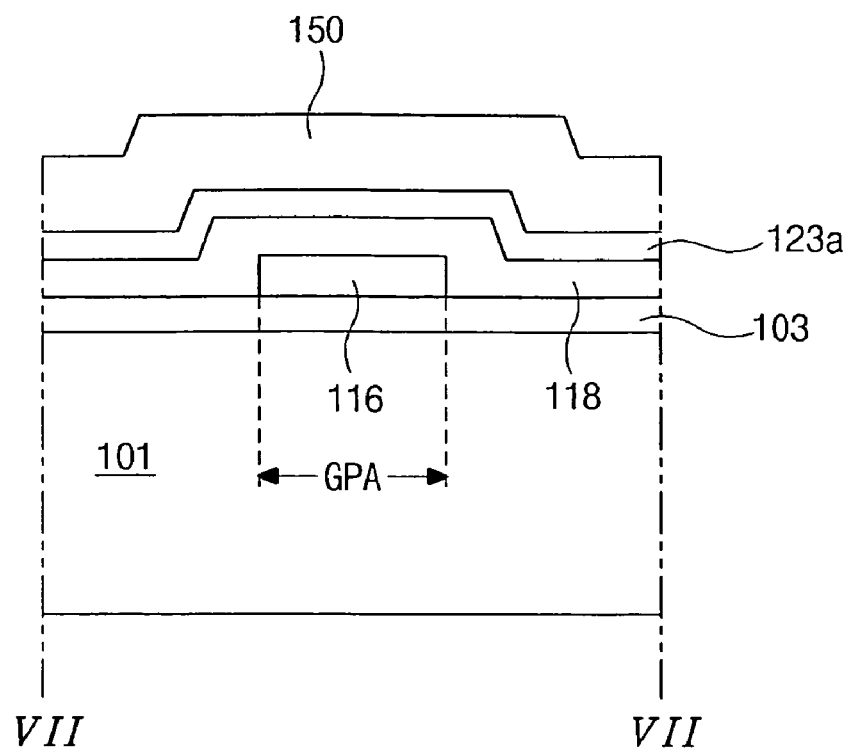
Figure 7L:
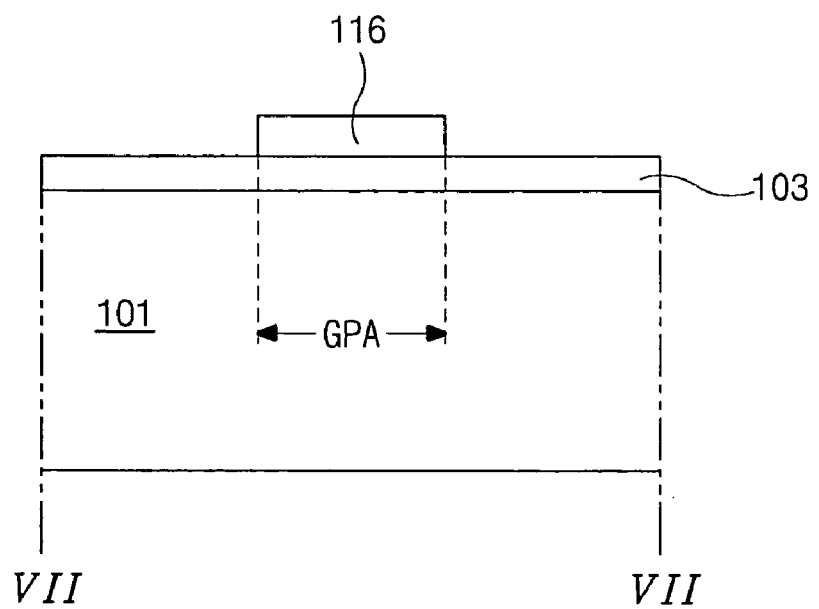
Figure 7M:
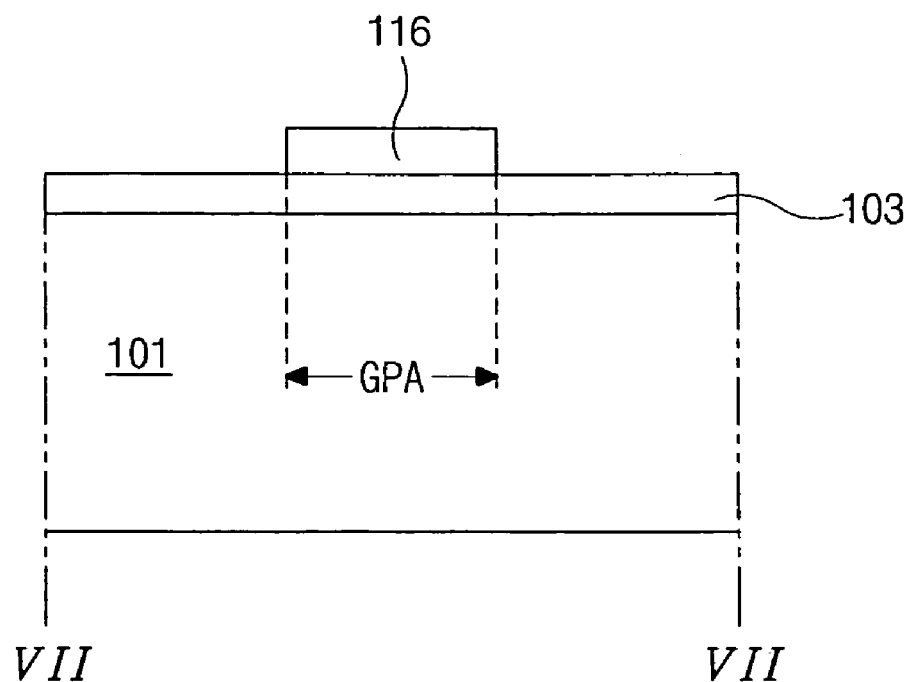
Figure 7N:
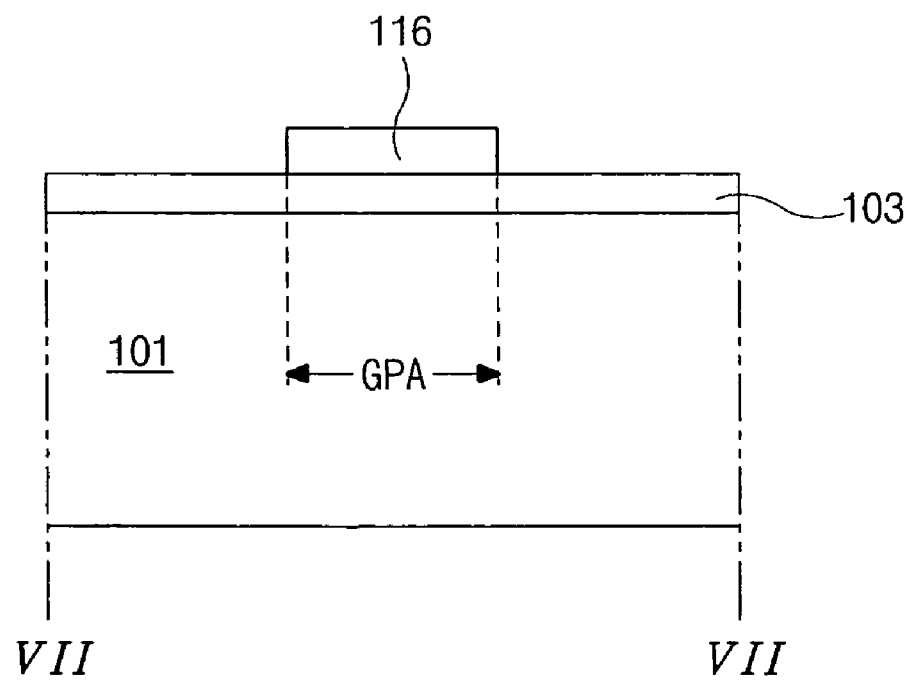
Figure 70:
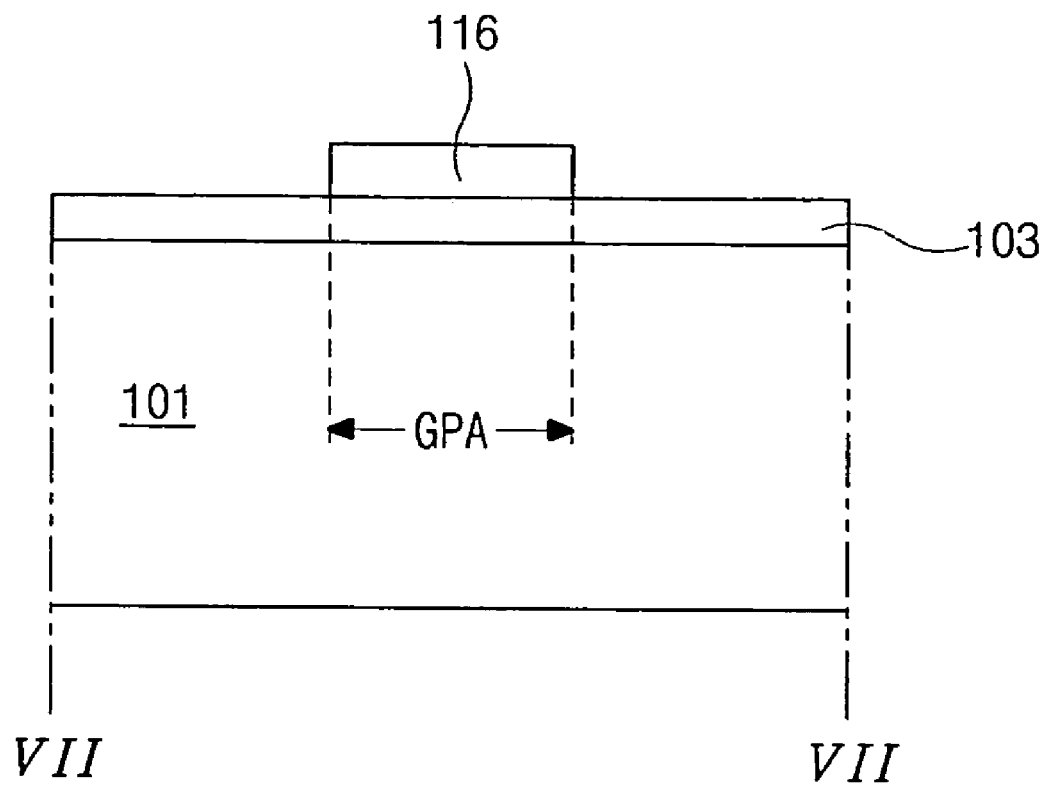
Figure 7P:
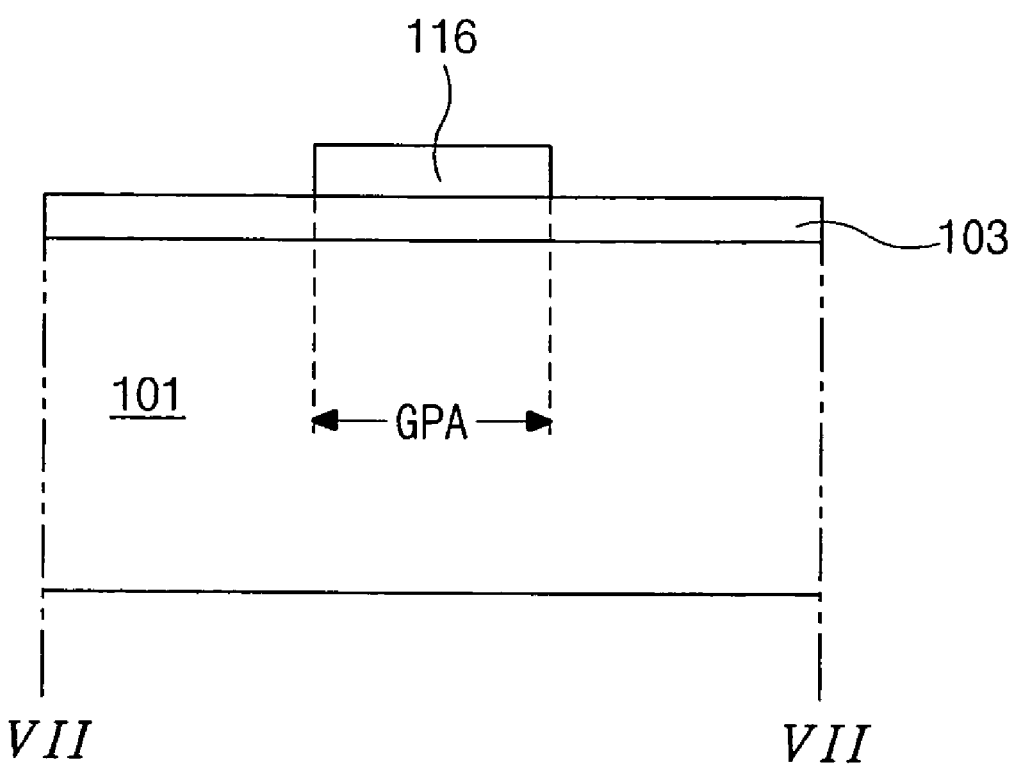
Figure 8A:
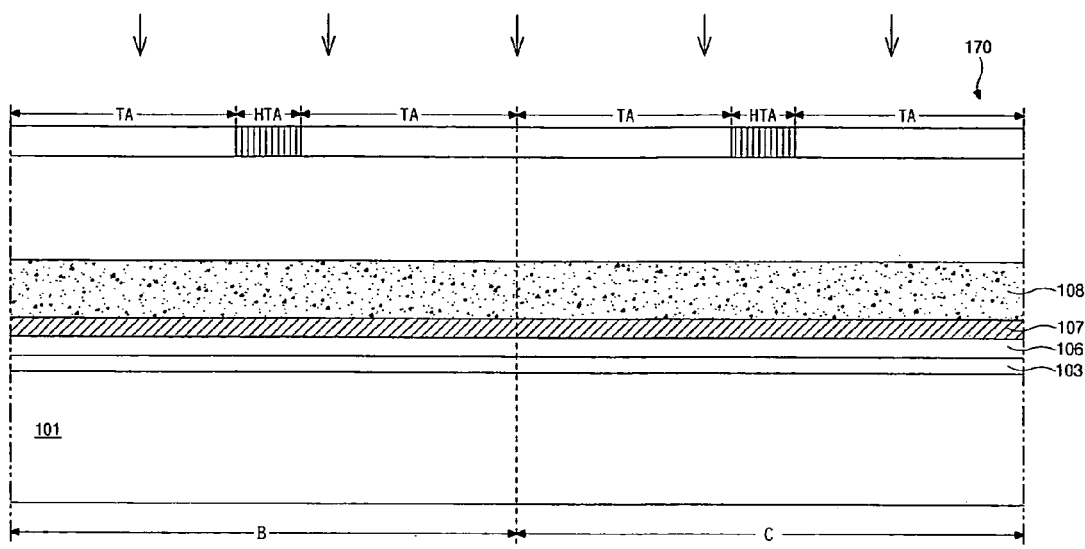
FIGS. 8A to 8P are schematic cross-sectional views showing a fabricating process of n-type and p-type driving thin film transistors in a driving area of an array substrate according to an exemplary embodiment of the present invention.
Figure 8B:
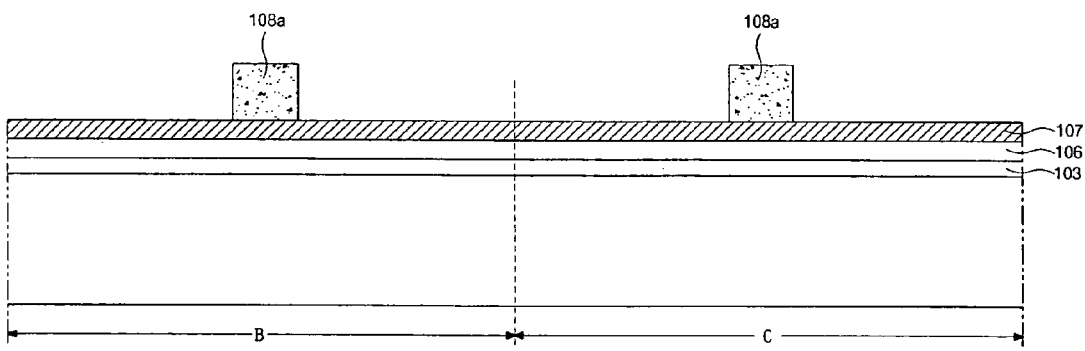
Figure 8C:
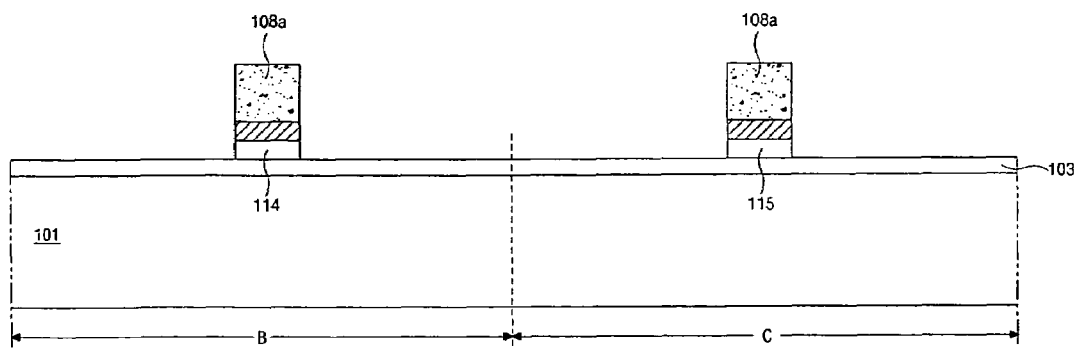
Figure 8D:
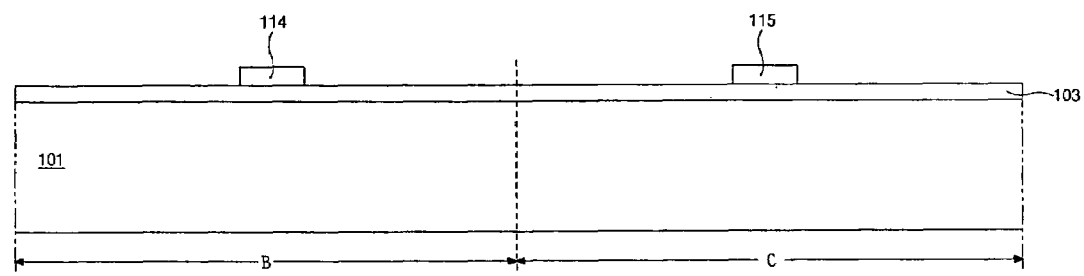
Figure 8E:
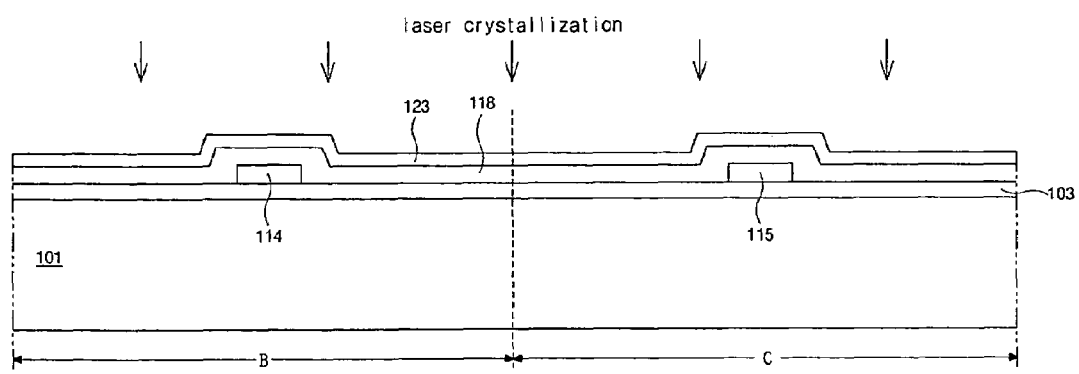
Figure 8F:
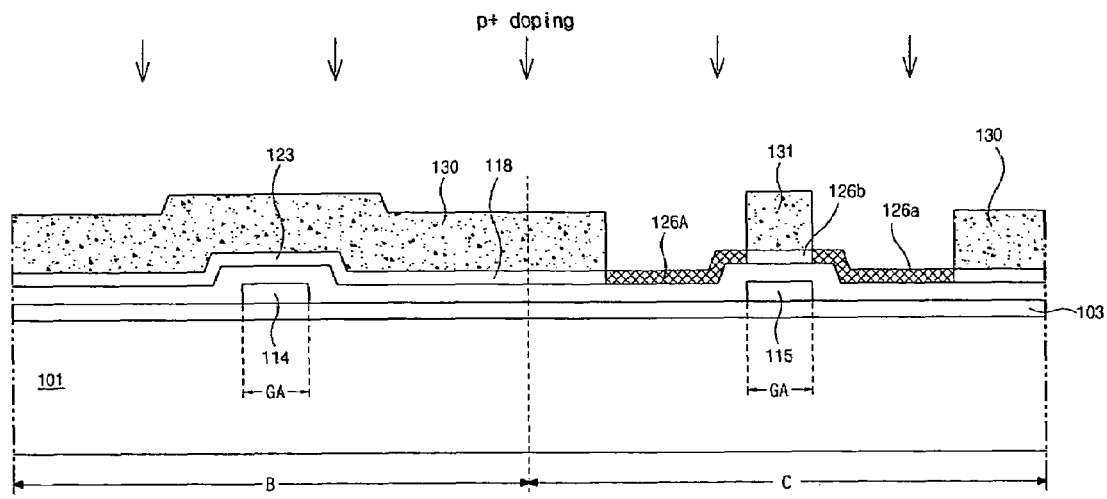

FIGS. 5A to 5P are schematic cross-sectional views taken along line "V-V" of FIG. 4. FIGS. 6A to 6P are schematic cross-sectional views taken along line "VI-VI" of FIG. 4. FIGS. 7A to 7P are schematic cross-sectional views taken along line "VII-VII" of FIG. 4. FIGS. 5A to 5P, FIGS. 6A to 6P, and FIGS. 7A to 7P show a fabricating process of a pixel thin film transistor, a storage capacitor in a display area, and a gate pad disposed in a non-display area of an array substrate according to an embodiment of the present invention. In addition, FIGS. 8A to 8P are schematic cross-sectional views showing a fabricating process of n-type and p-type driving thin film transistors in a driving area of an array substrate according to an embodiment of the present invention.

According to the FIGS. 5A, 6A, 7A and 8A, a buffer layer 103 of an inorganic insulating material such as silicon nitride ($SiN_x$) and silicon oxide ($SiO_2$) is disposed on a substrate 101 having a driving area and a display area. When amorphous silicon is crystallized to a polycrystalline silicon by a laser annealing method, alkali ions such as potassium ion ($K^+$) and sodium ion ($Na^+$) may erupt from a substrate due to a heat produced by a laser beam. The buffer layer 103 prevents deterioration of polycrystalline silicon due to an alkali ion. Next, a transparent conductive material layer 106 and a metallic material layer 107 are sequentially disposed on the buffer layer 103. For example, the transparent conductive material layer 106 may include one of indium-tin-oxide (ITO) and indium-zinc-oxide (IZO) whose thickness fits within a range of about 500 Å to about 1000 Å. The metallic material layer 107 may include molybdenum (Mo) to have a thickness equal to or less than about 3000 Å.

After a first photoresist (PR) layer 108 is disposed on the metallic material layer 107, a gate-pixel mask 170 having a transmissive area "TA," a blocking area "BA" and a half-transmissive area "HTA" is disposed over the first PR layer 108. The half-transmissive area "HTA" has a light transmittance lower than the transmissive area "TA" but higher than the blocking area "BA." The half-transmissive area "HTA" corresponds to gate electrode areas "GA" of a pixel thin film transistor (TFT) portion "A," an n-type driving TFT portion "B" and a p-type driving TFT portion "C." Furthermore, the half-transmissive area "HTA" corresponds to a pixel electrode area "PA" and a storage capacitor area "StgA" of the pixel TFT portion "A" and a gate pad area "GPA" of the non-display area. The blocking area "BA" corresponds to a gate line area "GLA." A positive type PR without exposed portion is used in this embodiment, however, a negative type PR may be used in another embodiment by changing the areas of the gate-pixel mask 170. Then, the first PR layer 108 is exposed through the gate-pixel mask 170. For example, when the half-transmissive area "HTA" includes a slit, light may be irradiated through the slit by diffraction.

Figure 6B:
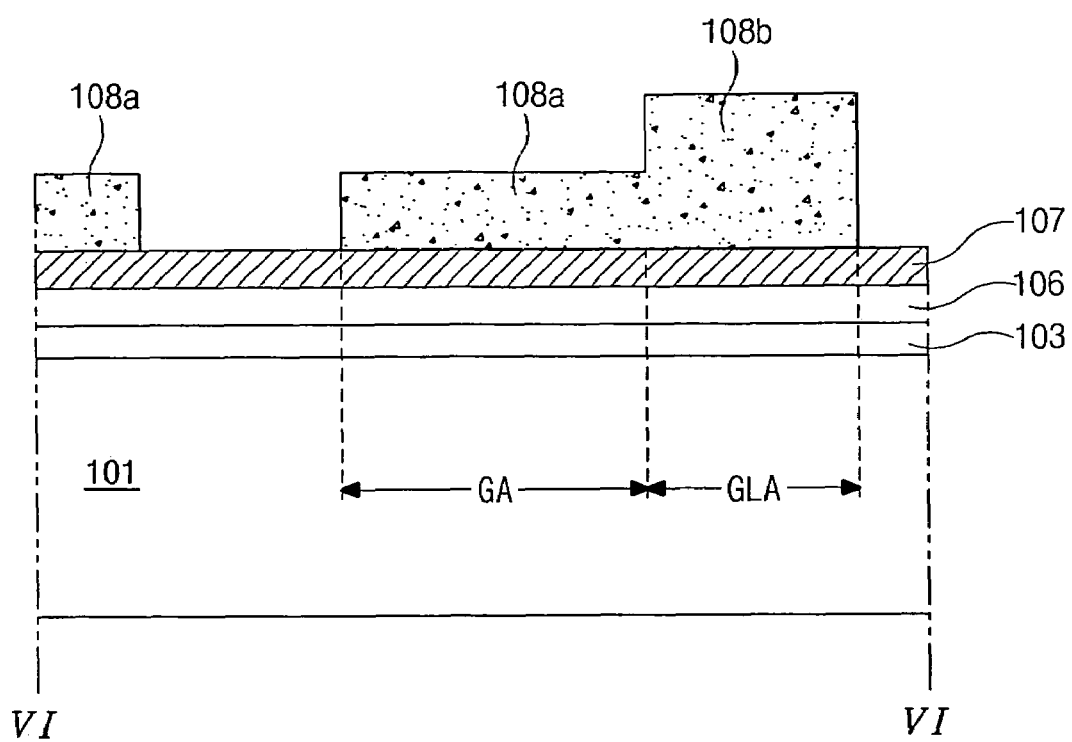
Figure 6C:
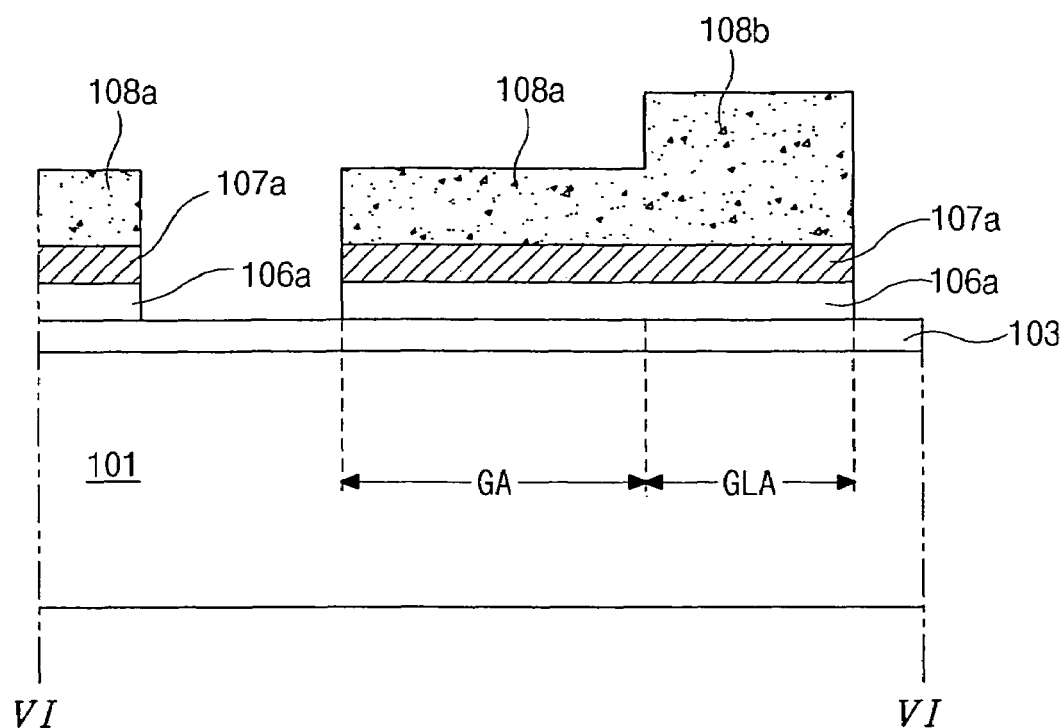

In FIGS. 5B, 6B, 7B and 8B, the first PR layer 108 (of FIG. 5A) is developed to form a first gate-pixel PR pattern 108a and a second gate-pixel PR pattern 108b. The first and second gate-pixel PR patterns 108a and 108b correspond to the half-transmissive area "HTA" and the blocking area "BA" of the gate-pixel mask 170, respectively. As shown in FIG. 6B, the first gate-pixel PR pattern 108a has a reduced thickness as compared to the second gate-pixel PR pattern 108b, and the first and second gate-pixel PR patterns 108a and 108b are formed through a first mask process.

In FIGS. 5C, 6C, 7C and 8C, the metallic material layer 107 and the transparent conductive material layer 106 are sequentially etched using the first and second gate-pixel PR patterns 108a and 108b as an etching mask to form a transparent conductive material pattern 106a and a metallic material pattern 107a.

In FIGS. 5D, 6D, 7D and 8D, after etching the metallic material layer 107 and the transparent conductive material layer 106, portions of the first and second gate-pixel PR patterns 108a and 108b are removed. For example, the first and second gate-pixel PR patterns 108a and 108b may be anisotropically removed by a dry etching method such as ashing. As shown in FIG. 5D, the first gate-pixel PR pattern 108a (of FIG. 5C) is completely removed while a portion of second gate-pixel PR pattern 108b (of FIG. 6C) having a reduced thickness remains. Then, the metallic material pattern 107a is etched using the remaining second gate-pixel PR pattern 108b as an etching mask to expose the transparent conductive material pattern 106a (of FIG. 5C). Accordingly, a pixel electrode 110 and a first capacitor electrode 110a are formed in the pixel TFT portion "A," and a gate pad 116 is formed in the gate pad area "GPA." In addition, first gate electrode 113 is formed in the gate electrode areas "GA" of the pixel TFT portion "A." Second gate electrode 114 is formed in the n-type driving TFT portion "B." Furthermore, third gate electrode 115 is formed in the p-type driving TFT portion "C." As a result, the pixel electrode 110, the first capacitor electrode 110a, the gate pad 116 and the first, second and third gate electrodes 113, 114 and 115 include a transparent conductive material.

Figure 6D:
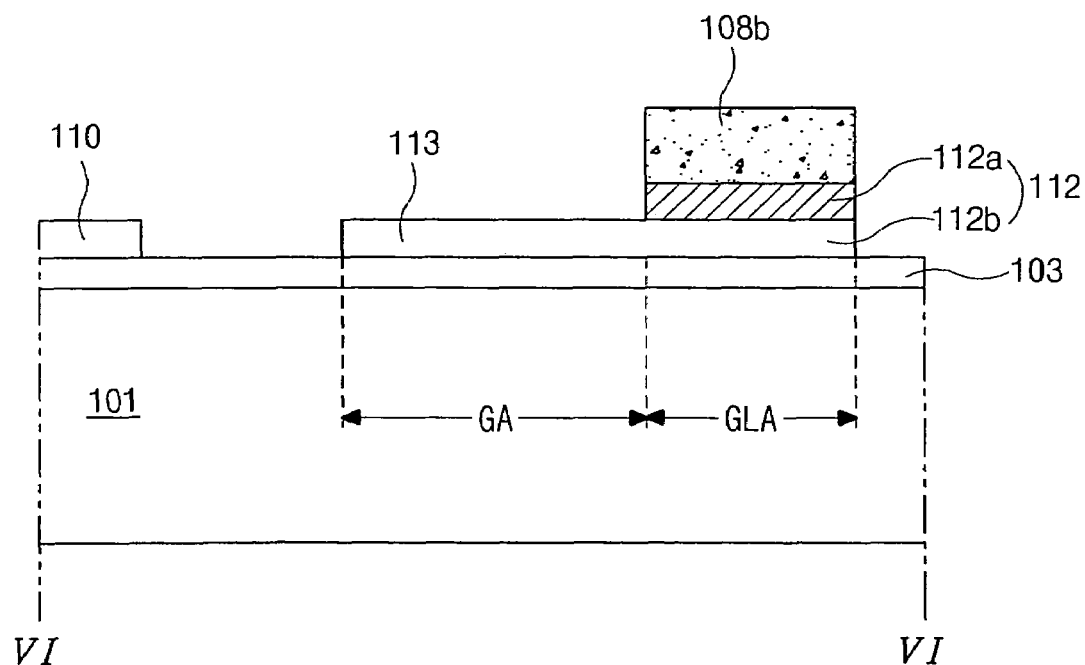
Figure 6E:
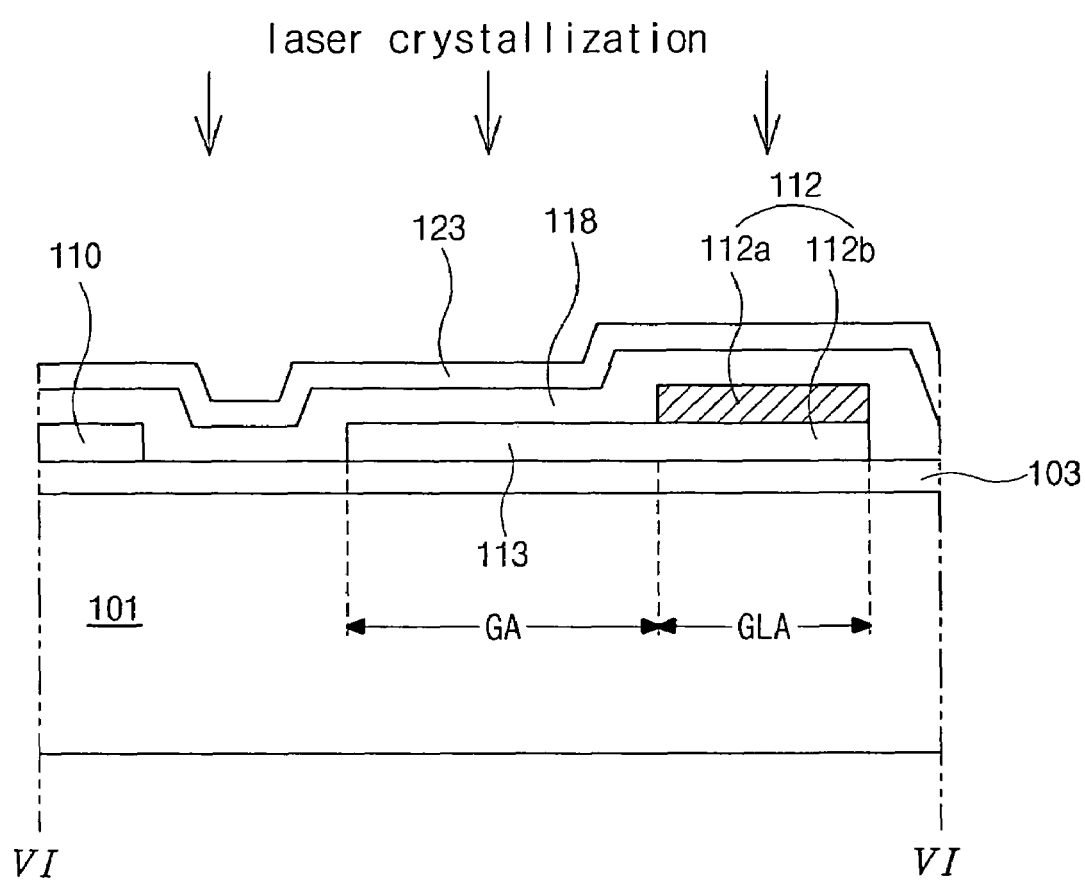
Figure 6F:
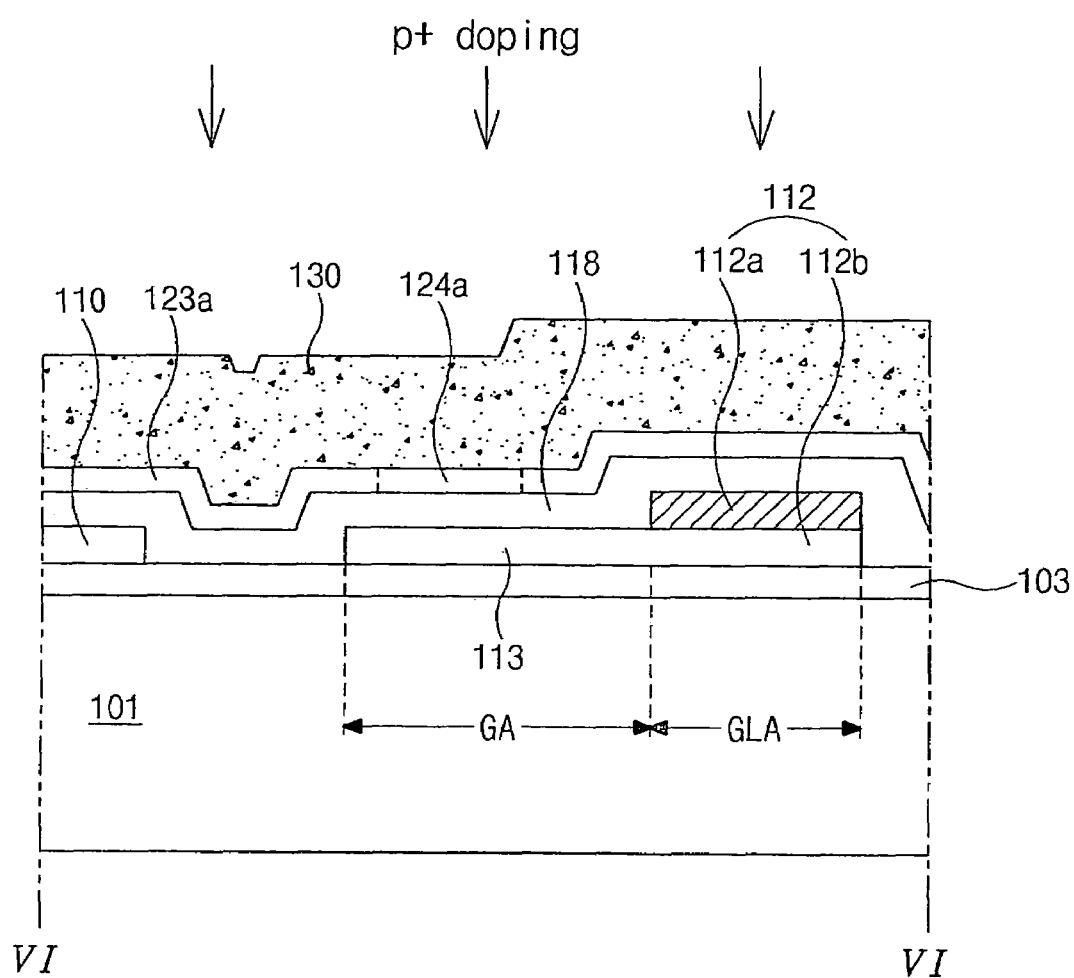
Figure 6G:
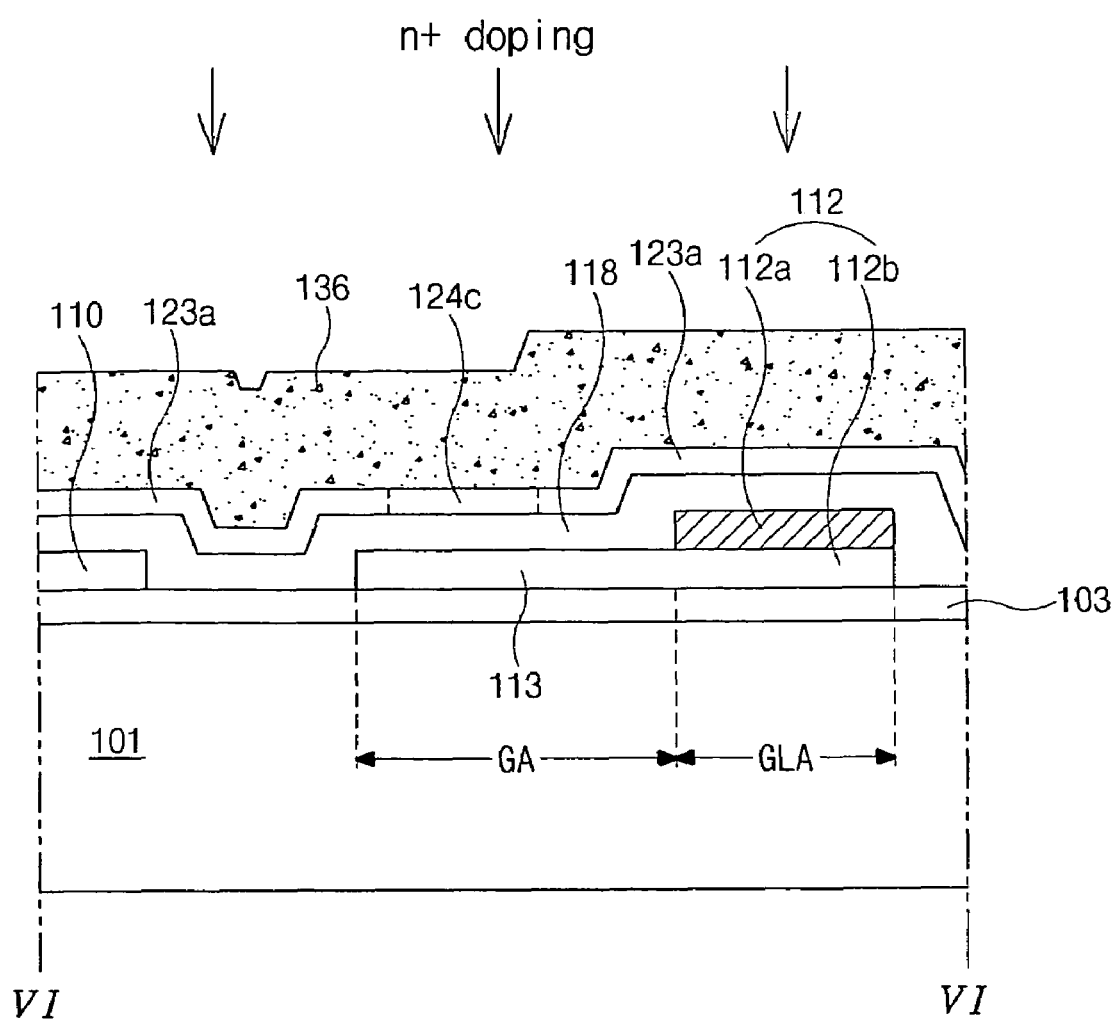
Figure 6H:
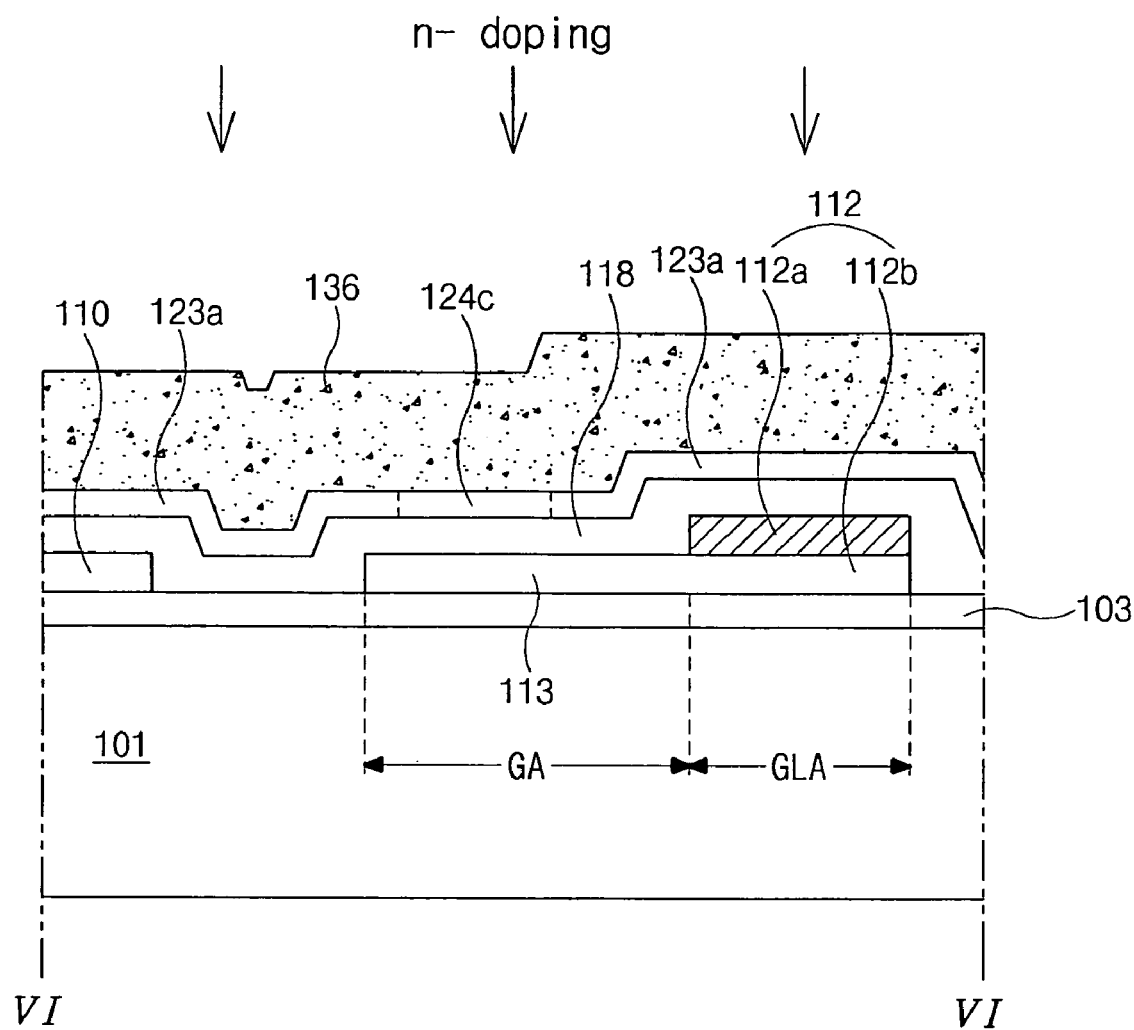
Figure 6I:
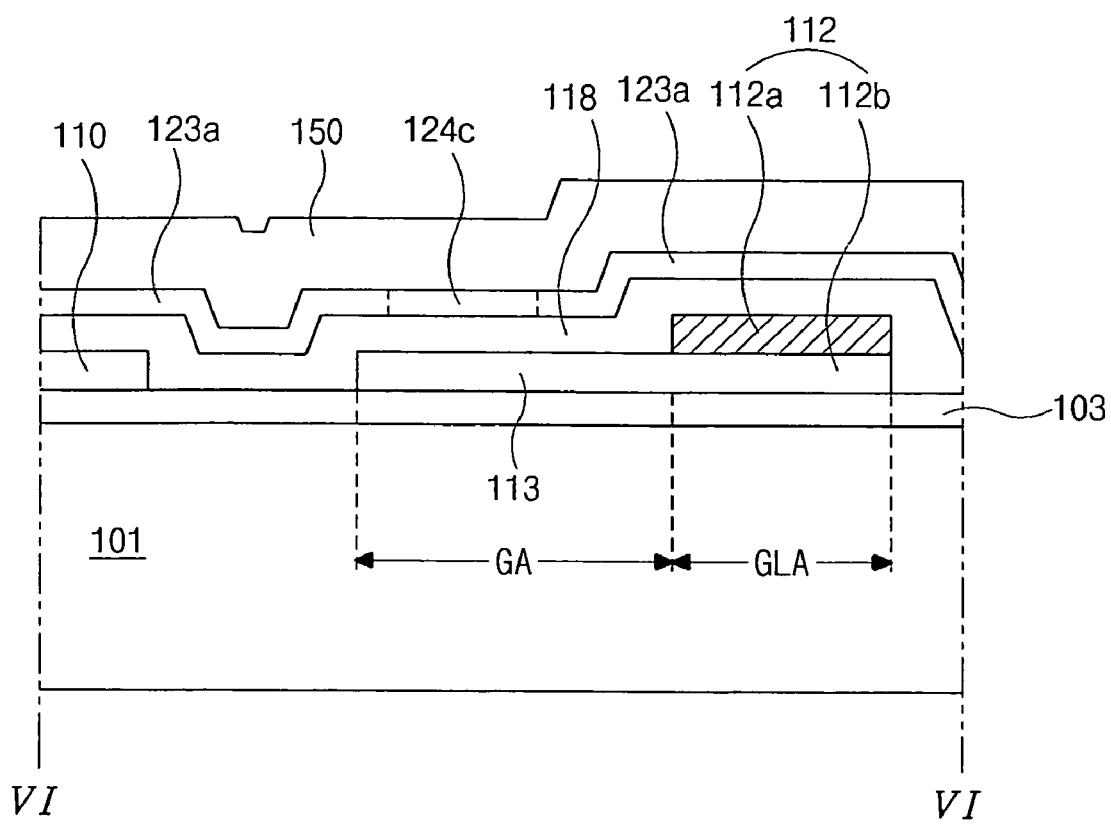
Figure 6J:
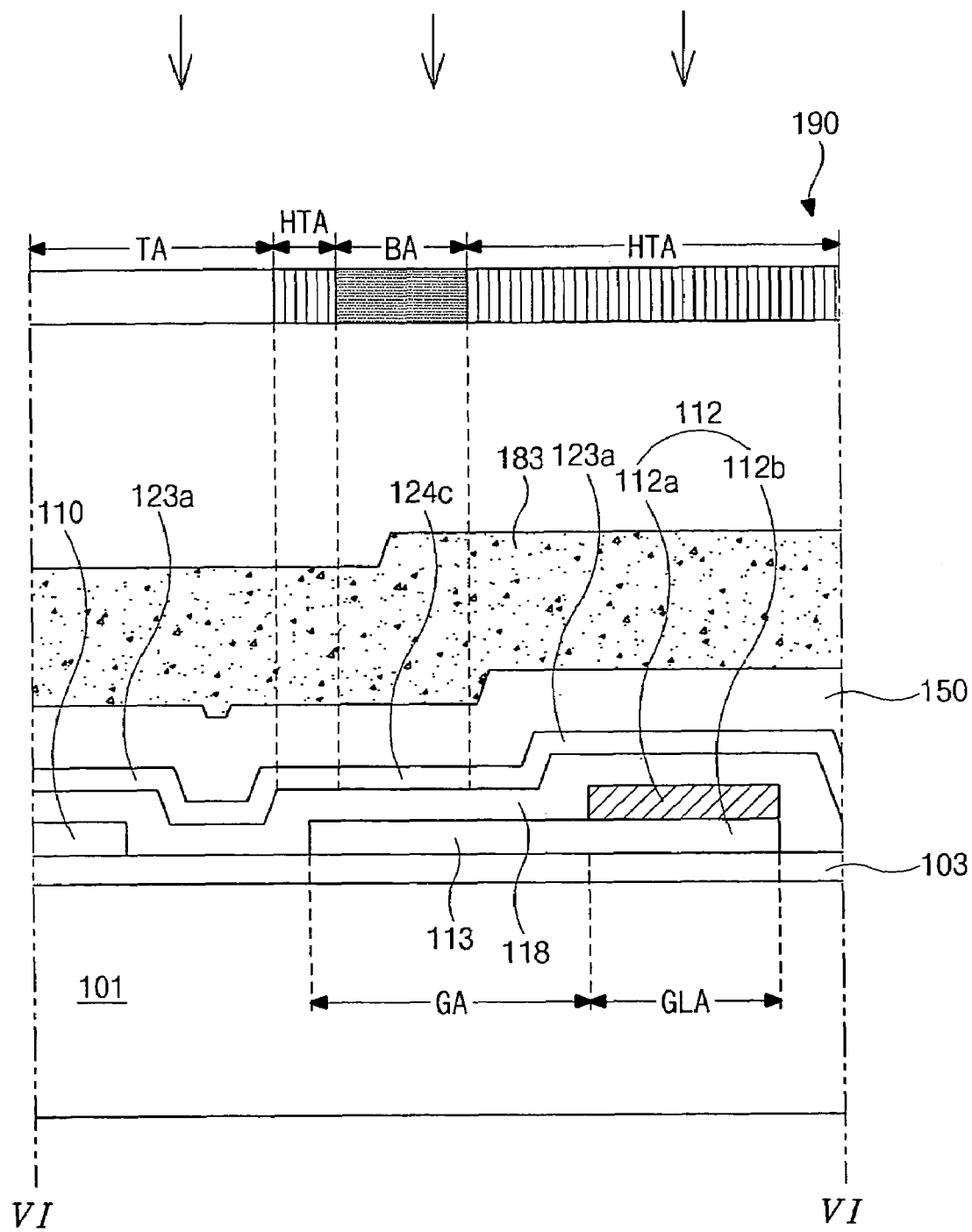
Figure 6K:
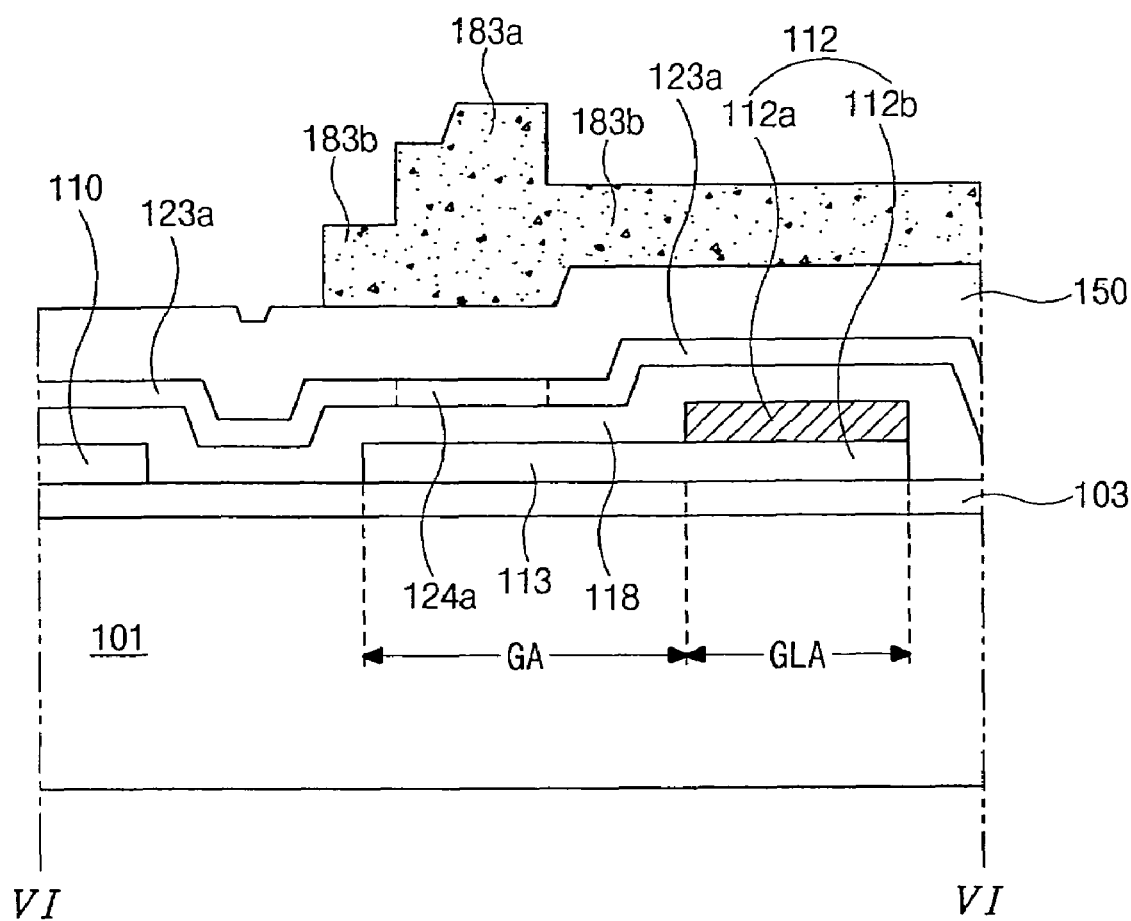
Figure 6L:
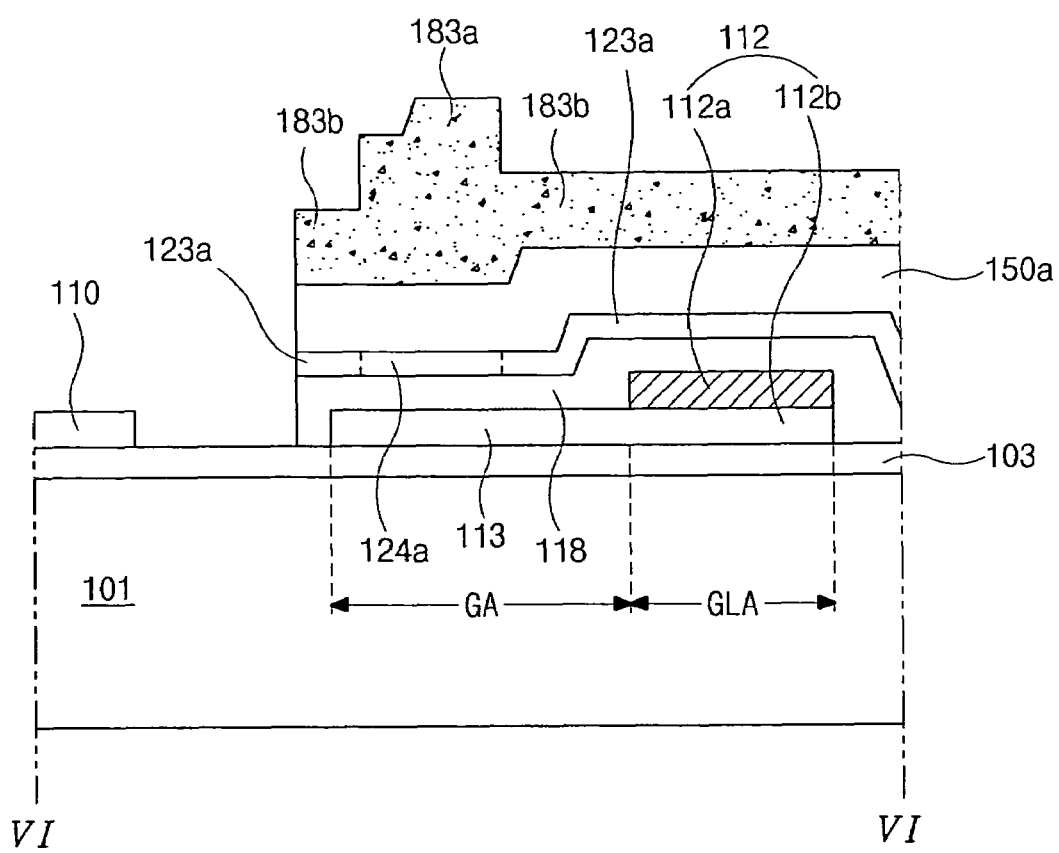
Figure 6M:
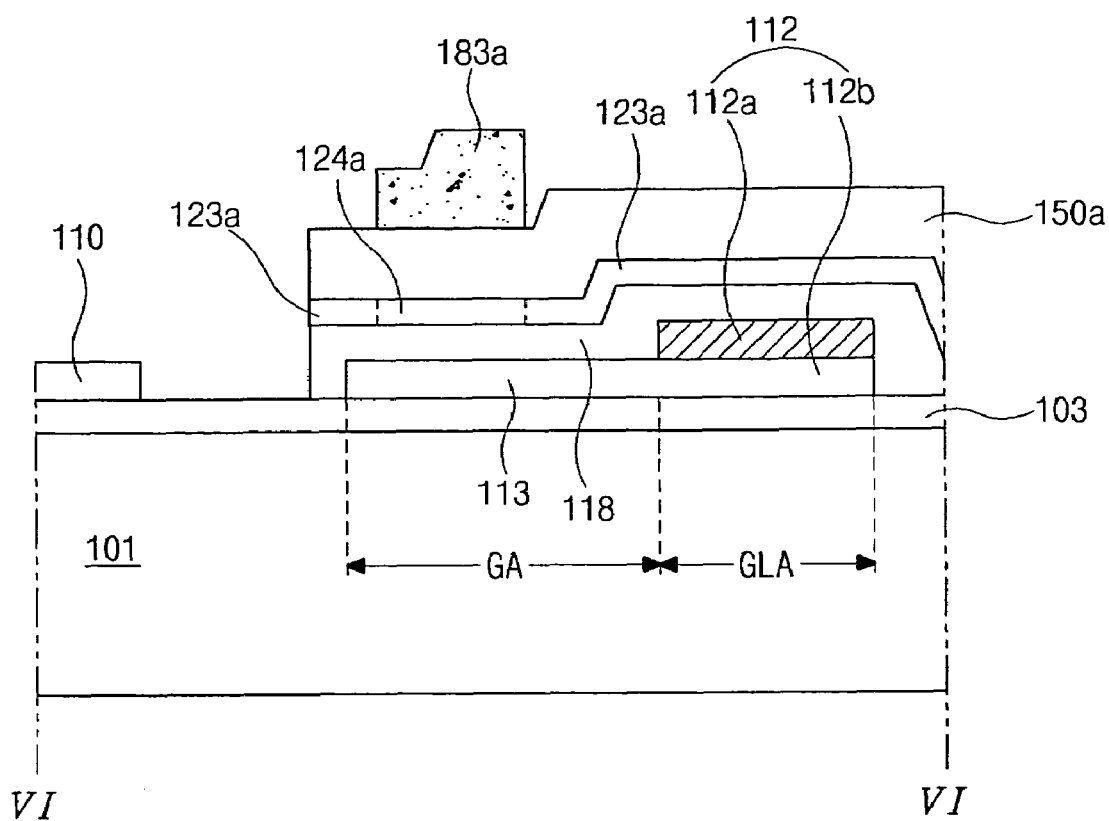
Figure 6N:
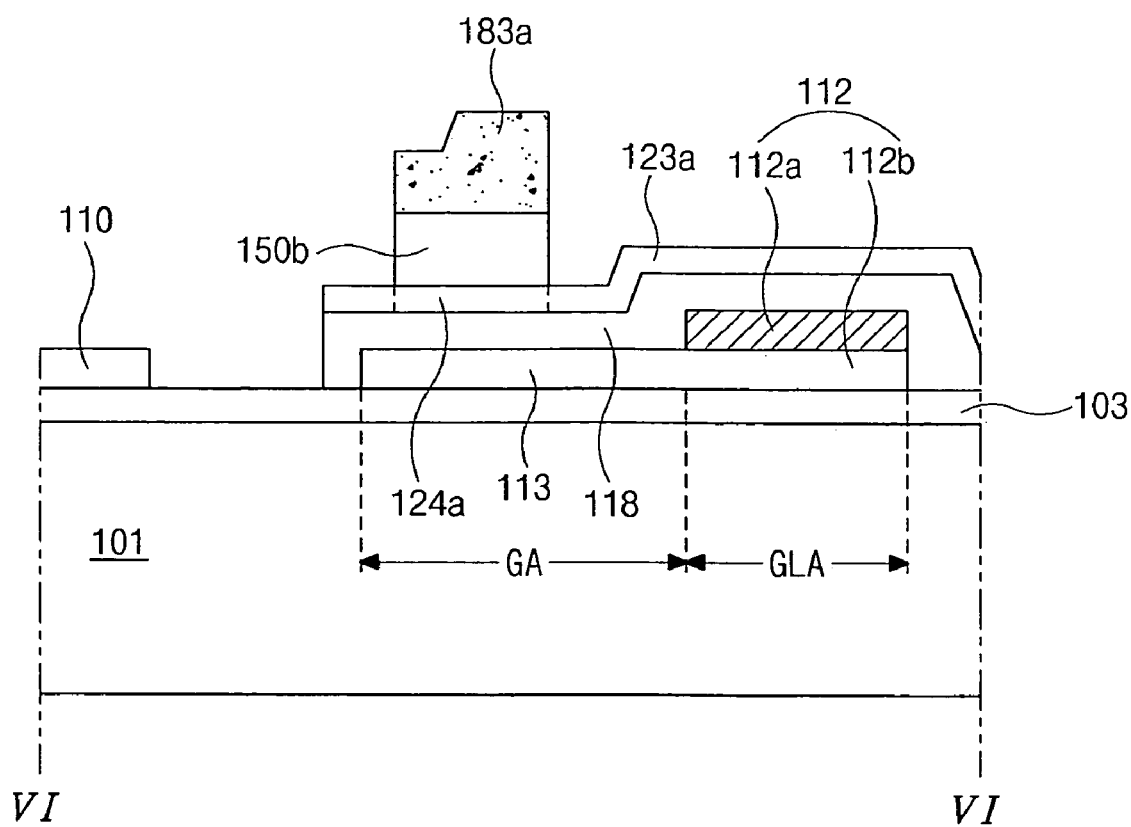
Figure 6O:
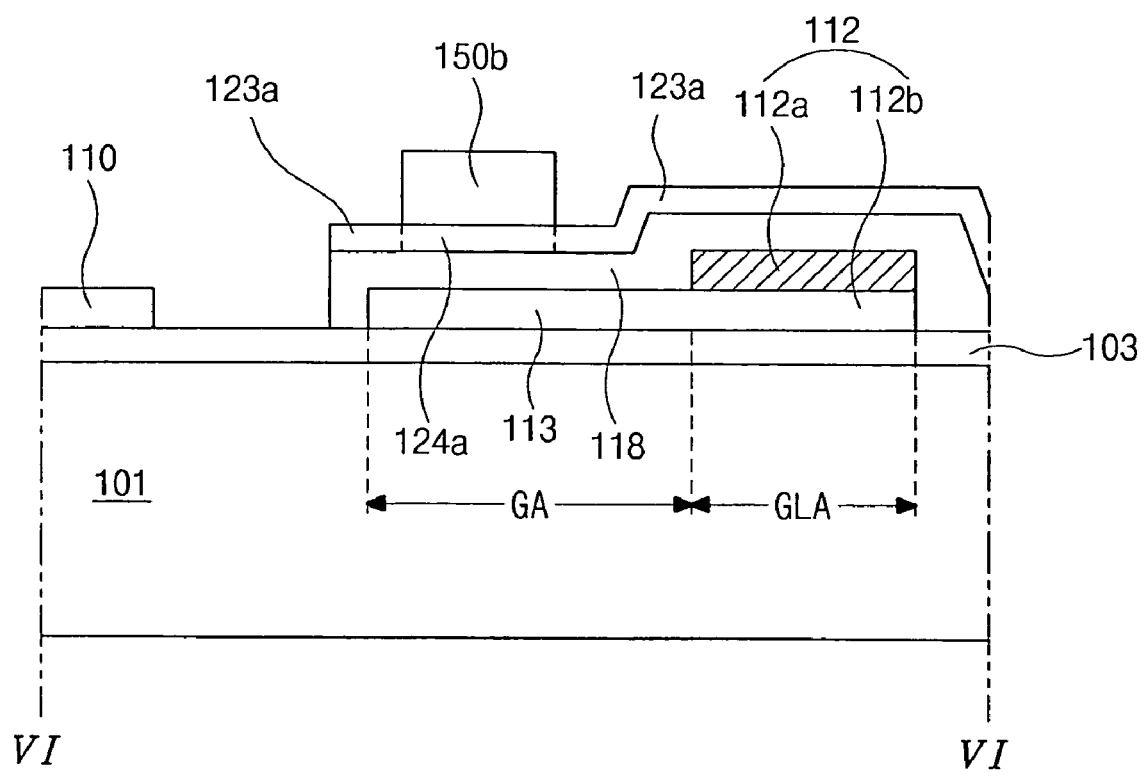

As shown in FIG. 6D, since the portion of second gate-pixel PR pattern 108b still remains, a gate line 112 including a metallic material pattern 112a and a transparent conductive material pattern 112b are formed in the gate line area "GLA." Accordingly, resistance increase of the gate line 112 is prevented. Furthermore, gate line delay due to such resistance increase is prevented. In addition, since each of the first, second and third gate electrodes 113, 114 and 115 include a single layer of a transparent conductive material, a size of a step at edge portions of each of the gate electrodes 113, 114 and 115 becomes small. In a subsequent process, an amorphous silicon layer is disposed on the gate electrodes 113, 114 and 115, and then the amorphous silicon layer may be crystallized to a polycrystalline silicon layer through a laser annealing method. As compared to the smaller step at edge portions of each of the gate electrodes 113, 114 and 115, when edge portions include increased step size, such increased size step may cause deterioration of the polycrystalline silicon layer during the crystallization process. However, in an embodiment, the size of the step for each of the gate electrodes 113, 114 and 115 are formed small enough to prevent the deterioration of the polycrystalline silicon layer.

In FIGS. 5E, 6E, 7E and 8E, after the first and second gate-pixel PR patterns 108a and 108b are removed, a gate insulating layer 118 is disposed on the gate line 112, the first, second and third gate electrodes 113, 114 and 115, and the gate pad 116. The gate insulating layer 118 may include one of inorganic insulating materials such as silicon nitride ($SiN_x$) and silicon oxide ($SiO_2$). Thereafter, an amorphous silicon layer is disposed on an entire surface of the gate insulating layer 118. The amorphous silicon layer is crystallized to a polycrystalline silicon layer 123 by irradiating a laser beam. The amorphous silicon layer may be crystallized through an excimer laser annealing (ELA) method or a sequential lateral solidification (SLS) method using an excimer laser having one of wavelengths 193 nm (ArF), 248 nm (KrF), 308 nm (XeCl), and 351 nm (XeF). Since each of the first, second and third gate electrodes 113, 114 and 115 are formed of a single layer of a transparent conductive material, the step size formed at each of the gate electrodes 113, 114 and 115 on the substrate 101 is reduced. Accordingly, deterioration of the polycrystalline silicon layer during the crystallization process through ELA method or SLS method is prevented and crystallinity of the polycrystalline silicon layer is improved.

In FIGS. 5F, 6F, 7F and 8F, first and second p+ PR patterns 131 and 130 are disposed on the polycrystalline silicon layer 123 through a second mask process. The first p+ PR pattern 131 covers a first portion 126b of the polycrystalline silicon layer 123 corresponding to the gate electrode 115 in the p-type driving TFT portion "C". Second portion 126a of the polycrystalline silicon layer 123 at both sides of the first portion 126b in the p-type driving TFT portion "C" is exposed. In addition, the second p+ PR pattern 130 covers the entire polycrystalline silicon layer 123 in the pixel TFT portion "A," the gate line area "GLA," the gate pad area "GPA", and the n-type driving TFT portion "B."

Next, the polycrystalline silicon layer 123 is doped with high concentration p-type impurities (p+) using the first and second p+ PR patterns 131 and 130 as doping masks. For example, the concentration of the p-type impurities may be within a range of about $1\times10^{15}$ cm$^{-2}$ to about $9\times10^{16}$ cm$^{-2}$. Accordingly, as shown in FIG. 8F, the second portion 126a of the polycrystalline silicon layer 123 in the p-type driving TFT portion "C" is doped with the high concentration p-type impurities (p+) to function as a p-type ohmic contact region, while the first portion 126b is not doped with the high concentration p-type impurities (p+). The first portion 126b functions as an intrinsic silicon layer. Similarly, the polycrystalline silicon layer 123 in the pixel TFT portion "A" of FIG. 5F, the n-type driving TFT portion "B" of FIG. 8F, and the gate pad area "GPA" of FIG. 7F, is not doped with the high concentration p-type impurities (p+) to remain as an intrinsic layer. After doping with the high concentration p-type impurities (p+), the first and second p+ PR patterns 131 and 130 are removed by a dry etching method such as ashing or a wet etching method such as stripping.

Figure 8G:
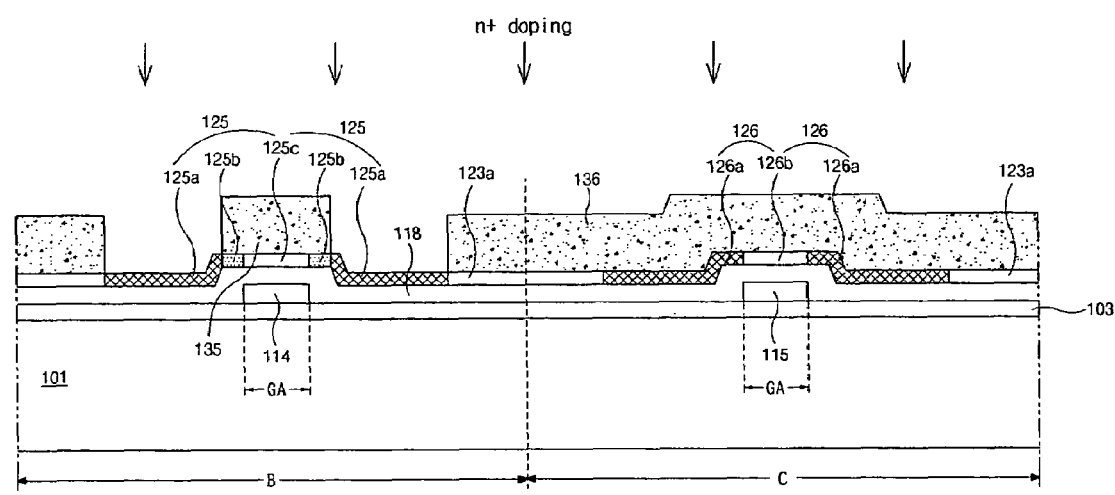

In FIGS. 5G, 6G, 7G and 8G, first and second n+ PR patterns 135 and 136 are disposed on the polycrystalline silicon layer 123 through a third mask process. As shown in FIG. 5G and FIG. 8G, first portions 124a and 125a of the polycrystalline silicon layer 123 in the pixel TFT portion "A" (of FIG. 5G) and the n-type driving TFT portion "B" (of FIG. 8G) are exposed through the first and second n+ PR patterns 135 and 136. In addition, the first n+ PR pattern 135 covers second and third portions 124b, 124c, 125b and 125c in the pixel TFT portion "A" and the n-type driving TFT portion "B." The third portions 124c and 125c correspond to the first gate electrode 113 in the pixel TFT portion "A" and the second gate electrode 114 in the n-type driving TFT portion "B," respectively. Furthermore, the second portions 124b formed between the first portion 124a and the third portion 124c of FIG. 5G have a width matched to a lightly doped drain (LDD) length. Similarly, the 2nd portions 125b formed between the first portion 125a and the third portion 125c of FIG. 8G have a width matched to a lightly doped drain (LDD) length.

As shown in FIG. 5G, a portion of the polycrystalline silicon layer 123 in the pixel electrode area "PA" is covered with the second n+ PR pattern 135, while a portion of storage capacitor area "StgA" is exposed. In addition, the second n+ PR pattern 136 covers the entire polycrystalline silicon layer 123 in the gate line area "GLA" of FIG. 6G, the gate pad area "GPA" of FIG. 7G, and the n-type driving TFT portion "B" of FIG. 8G.

Next, the polycrystalline silicon layer 123 is doped with high concentration n-type impurities (n+) using the first and second n+PR patterns 135 and 136 as doping masks. For example, the concentration of the n-type impurities may be within a range of about $1\times10^{15}$ cm$^{-2}$ to about $9\times10^{16}$ cm$^{-2}$. Accordingly, the first portions 124a and 125a in the pixel TFT portion "A" and the n-type driving TFT portion "B" are doped with the high concentration n-type impurities (n+) to function as a n-type ohmic contact region, while the second and third portions 124b, 124c, 125b and 125c are not doped with the high concentration n-type impurities (n+) to remain as an intrinsic silicon layer. Similarly, the polycrystalline silicon layer 123 in the storage capacitor area "StgA" is doped with the high concentration n-type impurities (n+) to be a second capacitor electrode 127 of n+ doped polycrystalline silicon.

Figure 8H:
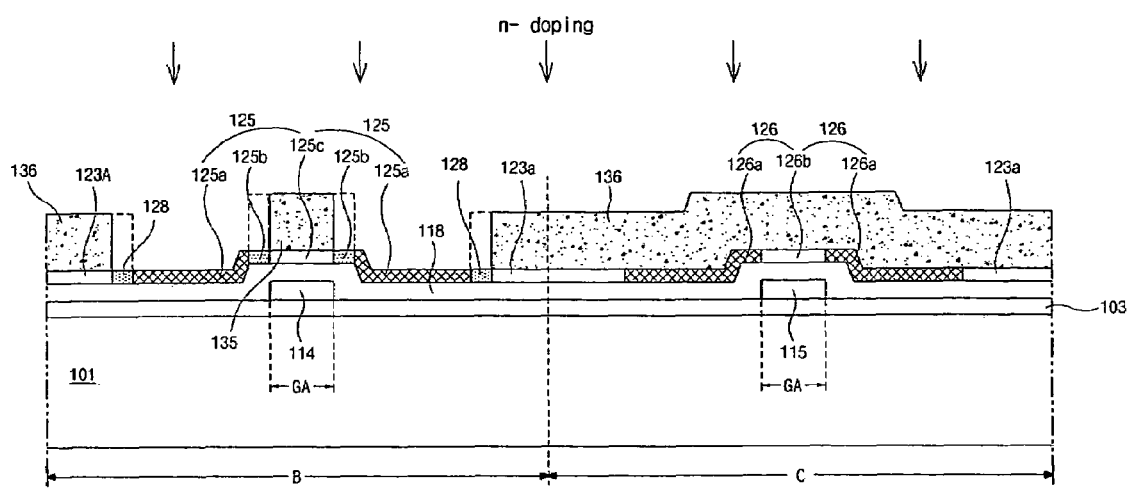

In FIGS. 5H, 6H, 7H and 8H, after doping with the high concentration n-type impurities (n+), portions of the first and second n+ PR patterns 135 and 136 are removed. For example, the first and second n+ PR patterns 135 and 136 may be isotropically removed by a dry etching method such as ashing or a wet etching method such as stripping. Accordingly, a side portion and a top portion of the first and second n+ PR patterns 135 and 136 may be equally removed. As a result, as shown in FIG. 5H and FIG. 8H, the second portions 124b and 125b in the pixel TFT portion "A", the n-type driving TFT portion "B" and a side portion 128 in the pixel electrode area "PA" are exposed, and a thickness of the first and second n+ PR patterns 135 and 136 is reduced.

Next, the polycrystalline silicon layer 123 is doped with low concentration n-type impurities (n−) using the reduced first and second n+ PR patterns 135 and 136 as doping masks. For example, the concentration of the n-type impurities may be within a range of about $1\times10^{13}$ cm$^{-2}$ to about $9\times10^{13}$ cm$^2$. Accordingly, as shown in FIG. 5H, the first portion 124a and the second portion 124b in the polycrystalline silicon layer 123, a side portion 128 in the pixel electrode area "PA", and the second capacitor electrode 127 in the storage capacitor area "StgA" in the pixel TFT portion "A" are doped with the low concentration n-type impurities (n−). Similarly, as shown in FIG. 8H, the first portion 125a and the second portion 125b in the polycrystalline silicon layer 123, and the side portion 128 in the n-type driving TFT portion "B" are doped with the low concentration n-type impurities (n−). After doping with the low concentration n-type impurities (n−), the first and second n+ PR patterns 135 and 136 having the reduced thickness are removed by a dry etching method such as ashing or a wet etching method such as stripping.

Since the first portions 124a and 125a of the polycrystalline silicon layer 123 in the pixel TFT portion "A", the n-type driving TFT portion "B", and the second capacitor electrode 127 in the storage capacitor area "StgA" are already doped with the high concentration n-type impurities (n+), the impurity concentration thereof is not affected by the low concentration n-type impurities (n−) doping and remains as a high concentration. In addition, the side portion 128 in the pixel electrode area "PA" is removed in a subsequent process. As a result, the second portions 124b and 125b in the pixel TFT portion "A" and the n-type driving TFT portion "B" are doped with the low concentration n-type impurities (n−) to be LDD regions. The LDD regions distribute a strong electric field to a weak electric field, thereby hot carriers are reduced and leakage current is prevented. Accordingly, the LDD regions are formed in an n-type TFT and disposed between an ohmic contact region of n+ impurity-doped silicon and an active region of intrinsic silicon.

Figure 8I:
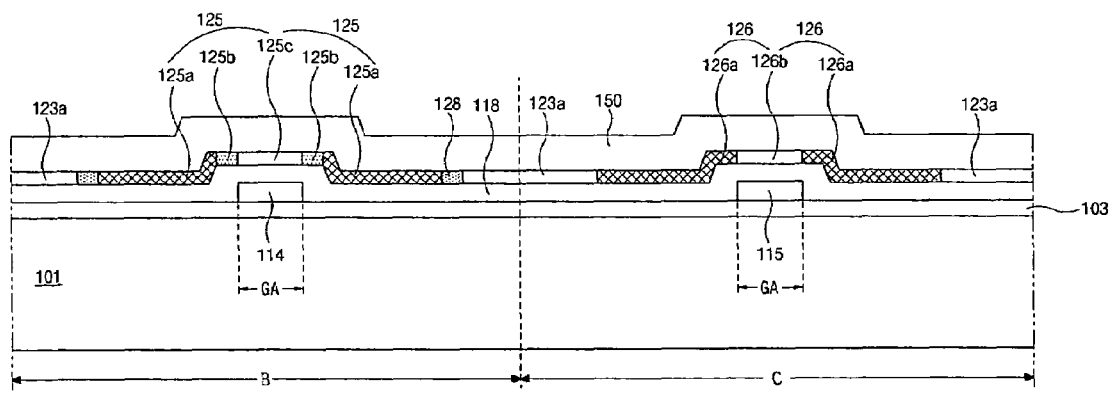
Figure 8J:
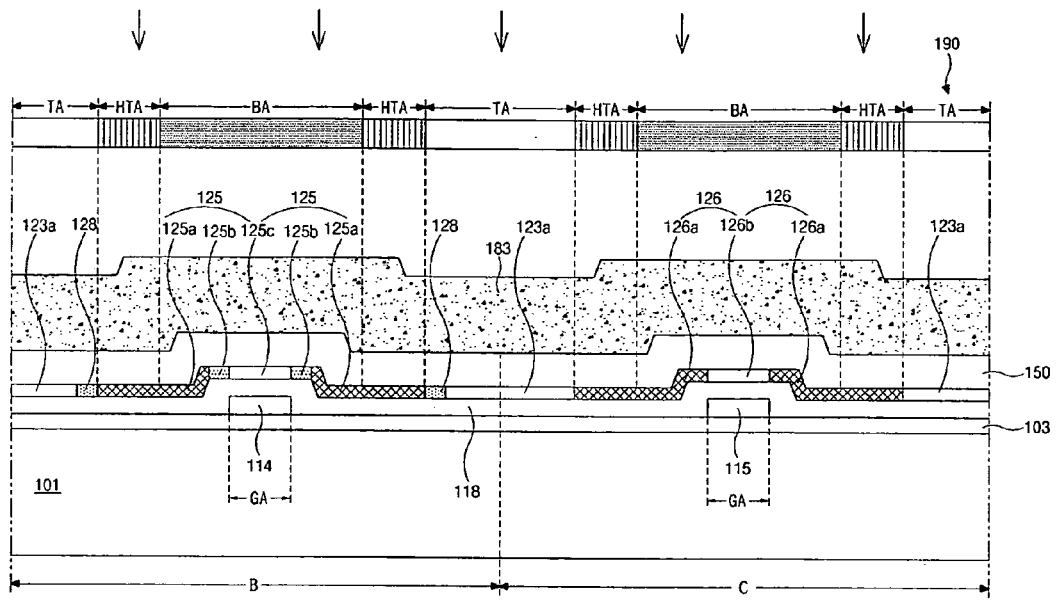
Figure 8K:
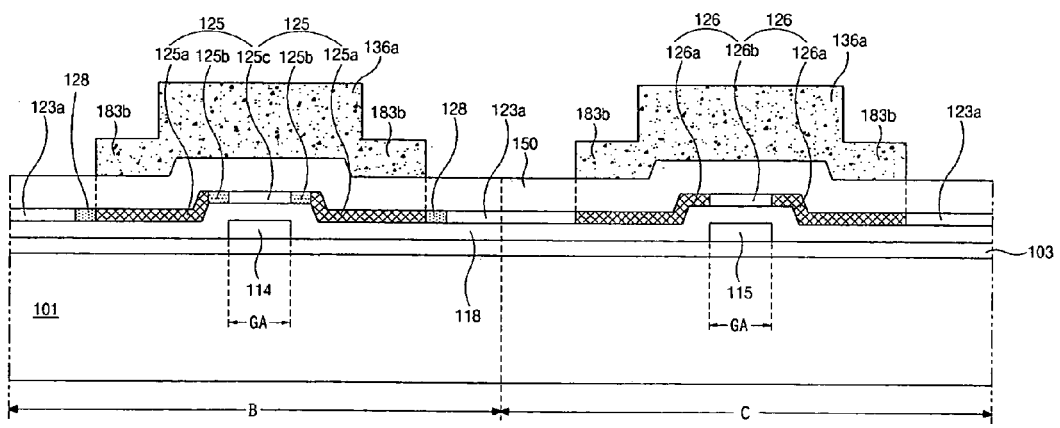

Through a plurality of doping processes including the p+ impurities, the n+ impurities and the n− impurities, n-type TFTs in the pixel TFT portion "A" of FIG. 5I, the n-type driving TFT portion "B" and a p-type TFT in the p-type driving TFT portion "C" of FIG. 8I, are obtained. As shown in FIG. 5I, a first semiconductor layer 124 in the pixel TFT portion "A" includes the active region 124c of intrinsic silicon overlapping the first gate electrode 113, the LDD regions 124b of n− impurity-doped silicon at both sides of the active region 124c, and the ohmic contact regions 124a of n+ impurity-doped silicon at one side of the LDD regions 124b. Similarly, as shown in FIG. 8I, a second semiconductor layer 125 in the n-type driving TFT portion "B" includes the active region 125c of intrinsic silicon overlapping the gate electrode 114, the LDD regions 125b of n− impurity-doped silicon at one side of the active region 125c and the ohmic contact regions 125a of n+ impurity-doped silicon at one side of the LDD regions 125b. A third semiconductor layer 126 in the p-type driving TFT portion "C" of FIG. 8I, includes the active region 126b of intrinsic silicon overlapping the gate electrode 115, and the ohmic contact regions 126a of p+ impurity-doped silicon at both sides of the active region 126b. In addition, a fourth semiconductor layer 127 in the storage capacitor area "StgA" of n+ impurity-doped silicon forms a second electrode of a storage capacitor because of its conductive property. A dummy intrinsic portion 123a and a dummy doped portion 128 of the polycrystalline silicon layer are removed in a subsequent process. In an embodiment, the polycrystalline silicon layer is doped with n-type impurities after doping with p-type impurities. However, the polycrystalline silicon layer may be doped with n-type impurities first, then doped with p-type impurities in another embodiment.

In FIGS. 5I, 6I, 7I and 8I, a passivation layer 150 is disposed on the first, second, third and fourth semiconductor layers 124, 125, 126 and 127, the dummy intrinsic portion 123a and the dummy doped portion 128 of the polycrystalline silicon layer. The passivation layer 150 may include one of inorganic insulating materials such as silicon nitride (SiN$_x$) and silicon oxide (SiO$_2$). In an embodiment, the passivation layer 150 includes a single layer, however, the passivation layer 150 may include a multiple layer of different insulating materials in another embodiment.

In FIGS. 5J, 6J, 7J and 8J, a second PR layer 183 is disposed on the passivation layer 150 and an active-contact mask 190 having a transmissive area "TA," a half-transmissive area "HTA" and a blocking area "BA" is disposed over the second PR layer 183. The half-transmissive area "HTA" has a light transmittance lower than the transmissive area "TA" and higher than the blocking area "BA." The blocking area "BA" of a positive type PR corresponds to the active region 124C and the storage capacitor area "StgA" in the pixel TFT portion "A". Similarly, the blocking area "BA" of the positive type PR corresponds to the active region 125C in the n-type driving TFT portion "B" and the active region 126C in the p-type driving TFT portion "C". In addition, the half-transmissive area "HTA" corresponds to side portions of the ohmic contact regions 124a of FIG. 5J, 125a and 126a of FIG. 8J, and the gate line area "GLA" of FIG. 6J. The other regions of the substrate 101 correspond to the transmissive area "TA." Then, the second PR layer 183 is exposed through the active-contact mask 190. For example, when the half-transmissive area "HTA" includes a slit, light may be irradiated through the slit by diffraction.

In FIGS. 5K, 6K, 7K and 8K, the second PR layer 183 (of FIG. 5J) is developed to form a first active-contact PR pattern 183a and a second active-contact PR pattern 183b. The first active-contact PR pattern 183a corresponds to the blocking area "BA", and the 2nd active-contract PR pattern 183b corresponds to the half-transmissive area "HTA" of the active-contact mask 190. Accordingly, the first active-contact PR pattern 183a has a thickness greater than the second active-contact PR pattern 183b. As a result, the first and second active-contact PR patterns 183a and 183b are formed on the passivation layer 150 and the transmissive area "TA" of the active-contact mask 190 exposes the other portions of the passivation layer 150 through a fourth mask process.

Figure 8L:
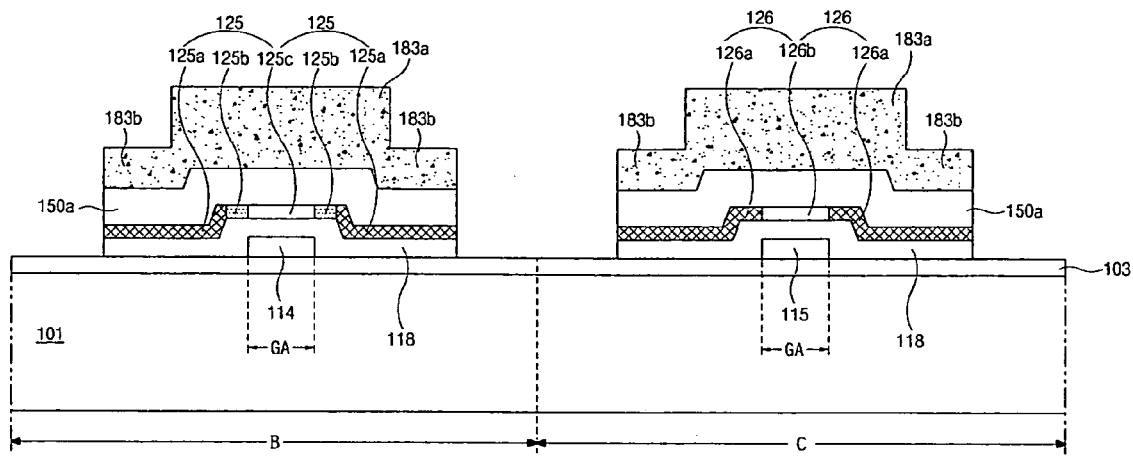
Figure 8M:
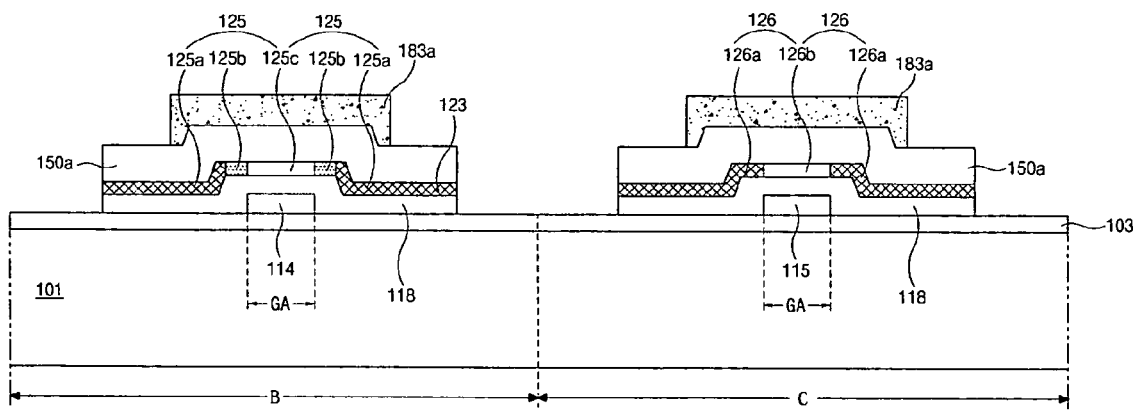

In FIGS. 5L, 6L, 7L and 8L, the passivation layer 150 (of FIG. 5K), the semiconductor layer of polycrystalline silicon layer 123, and the gate insulating layer 118 are sequentially etched using the first and second active-contact PR patterns 183a and 183b as an etching mask. Accordingly, as shown in FIG. 5L, the first semiconductor layer 124 including the ohmic contact region 124a, the LDD region 124b and the active region 124c are defined in the pixel TFT portion "A" to form an island shape. Similarly, as shown in FIG. 8L, the second and third semiconductor layers 125 and 126 having an island shape are defined in the n-type driving TFT portion "B" and the p-type driving TFT portion "C," respectively. The second semiconductor layer 125 includes the ohmic contact region 125a, the LDD region 125b, and the active region 125c. The third semiconductor layer 126 includes the ohmic contact region 126a and the active region 126b. In addition, as shown in FIG. 5L, the fourth semiconductor layer 127 having an island shape is defined in the storage capacitor area "StgA" and the pixel electrode 110 in the pixel electrode area "PA" is exposed. The portion of the passivation layer 150 (of FIG. 5K) are etched to form a first passivation pattern 150a under the first and second active-contact PR patterns 183a and 183b.

In FIGS. 5M, 6M, 7M and 8M, after etching the passivation layer 150 (of FIG. 5K), the semiconductor layer of polycrystalline silicon layer 123, the gate insulating layer 118, the second active-contact PR pattern 183b, and portions of the first active-contact PR patter 183a are removed. For example, the first and second active-contact PR patterns 183a and 183b may be anisotropically removed by a dry etching method such as ashing. Accordingly, the first active-contact PR pattern 183a remains with a reduced thickness, while the second active-contact PR pattern 183b is completely removed. As a result, a portion of the first passivation pattern 150a corresponding to the second active-contact PR pattern 183b is exposed.

Figure 8N:
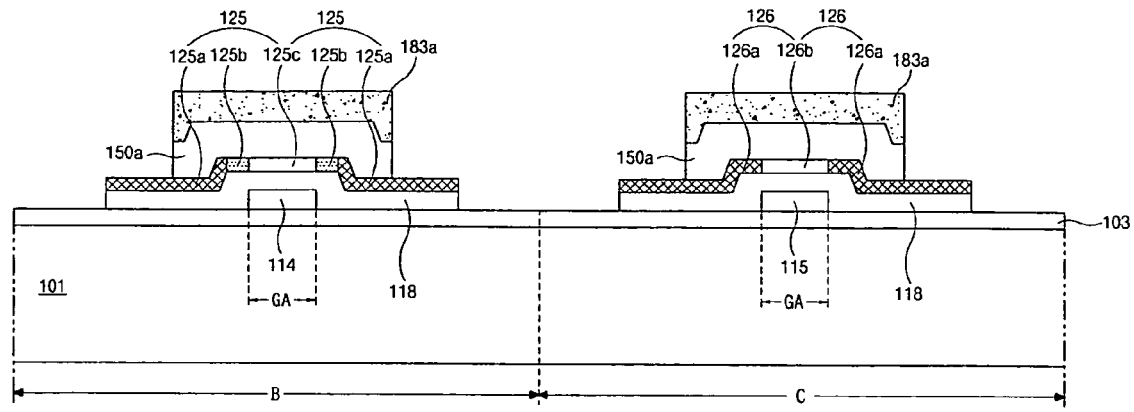

In FIGS. 5N, 6N, 7N and 8N, the exposed portions of the first passivation pattern 150a are etched using the remaining first active-contact PR pattern 183a as an etching mask to define a second passivation pattern 150b covering portions of the active regions 124c of FIG. 5N, 125c and 126b of FIG. 8N, and exposing portions of the ohmic contact regions 124a, 125a and 126a. After etching the portion of the first passivation pattern 150a, the remaining first active-contact PR pattern 183a is removed by a dry etching method such as ashing or a wet etching method such as stripping.

Figure 8O:
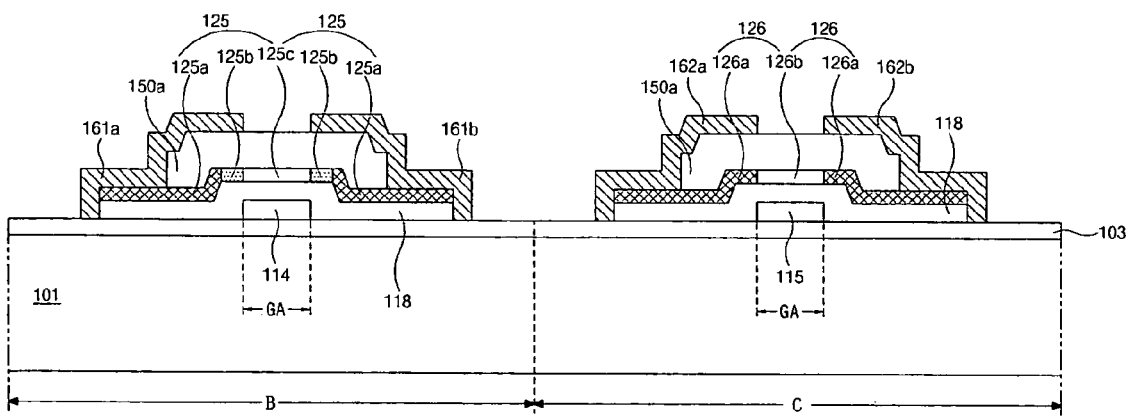
Figure 8P:
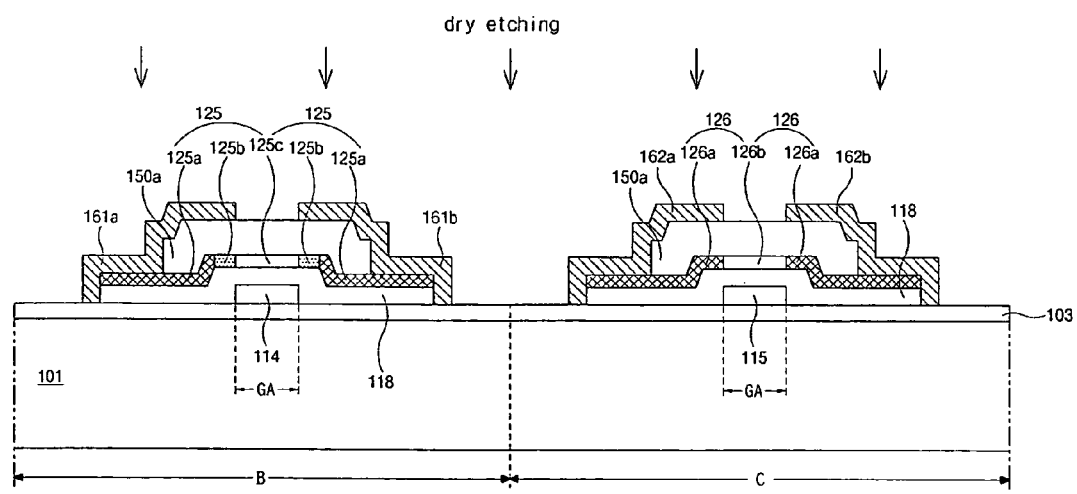

In FIGS. 5O, 6O, 7O and 8O, first source and drain electrodes 160a and 160b in the pixel TFT portion "A", second source and drain electrodes 161a and 161b in the n-type driving portion "B", and third source and drain electrodes 162a and 162b in the p-type driving TFT are formed on the second passivation pattern 150b through a fifth mask process. At the same time, a data line (not shown) is formed on the buffer layer 103. The first source and drain electrodes 160a and 160b, the second source and drain electrodes 161a and 161b, the third source and drain electrodes 162a and 162b, and the data line may include one of molybdenum (Mo), chromium (Cr), aluminum (Al), copper (Cu), and alloy thereof. As shown in FIG. 5D, the first source and drain electrodes 160a and 160b are formed spaced apart from each other having the first gate electrode 113 defining the center portion and connected to the ohmic contact region 124a in the pixel TFT portion "A." Similarly, as shown in FIG. 8O, the second source and drain electrodes 161a and 161b are formed spaced apart from each other having the second gate electrode 114 defining the center portion and connected to the ohmic contact region 125a in the n-type driving TFT portion "B" In addition, the third source and drain electrodes 162a and 162b are formed spaced apart from each other having the third gate electrode 115 deleting the center portion and connected to the ohmic contact region 126a in the p-type driving TFT portion "C."

Since the second passivation pattern 150b covers the active regions 124c, 125c and 126b of the polycrystalline silicon layer 123, the active regions 124c, 125c and 126b forming a channel region are not deteriorated during etching process. The first to third source and drain electrodes 160a, 160b, 161a, 161b, 162a and 162b and the data line are formed during the etching process. In addition, the first source electrode 160a is connected to the data line and the first drain electrode 160b contacts a portion of the pixel electrode 110 in the pixel TFT portion "A". The other portion of the pixel electrode 110 in the pixel electrode area "PA" is exposed. Furthermore, the gate pad 116 in the gate pad area "GPA" of FIG. 7O, the dummy intrinsic portion 123a in the gate electrode area "GA" and the gate line area "GLA" of FIG. 6O and the first passivation pattern 150a in the storage capacitor area "StgA" of FIG. 5O are exposed.

In FIGS. 6P, 7P and 8P, the exposed dummy intrinsic portion 123a of the polycrystalline silicon layer 123 in the gate electrode area "GA" and the gate line area "GLA" is removed using the first to third source and drain electrodes 160a, 160b, 161a, 161b, 162a and 162b and the data line as an etching mask. For example, the exposed dummy intrinsic portion 123a may be etched through a dry etching method. In another embodiment, the dummy intrinsic portion 123a in the gate electrode area "GA" and the gate line area "GLA" may be removed during an etching step of the passivation layer 150 (of FIG. 5K), the semiconductor layer of polycrystalline silicon, and the gate insulating layer 118 shown in FIG. 6L, thereby this etching step of the exposed dummy intrinsic portion 123a may be omitted.

In this embodiment of FIGS. 5A to 8P, an n-type driving TFT and a p-type driving TFT are formed using a CMOS logic in a driving area and an array substrate for an LCD device to drive a circuit. In an embodiment, a five-mask process is implemented to fabricate the n-type and the p-type driving TFTs. In another embodiment, a driving circuit maybe formed using either an NMOS logic or a PMOS logic. In such embodiment, the driving circuit may include only one of an n-type driving TFT and a p-type driving TFT. Accordingly, a mask process for one of p+ doping step and n+ doping step may be omitted, and an array substrate for an LCD device including a driving circuit may be fabricated through a four-mask process.

In the present invention, polycrystalline silicon TFTs of an LCD device includes a bottom gate structure. A gate line and a pixel electrode for a polycrystalline silicon TFT are formed through one-mask process using a mask having a half-transmissive area. In addition, a passivation layer, a polycrystalline silicon layer, and a gate insulating layer for a polycrystalline silicon TFT are also formed through one-mask process using same half transmassive area mask. Accordingly, an array substrate for an LCD device including a driving circuit is fabricated through a five-mask process. As a result, production time and production cost are reduced, and higher production yield are achieved. Moreover, since a passivation pattern of an island shape is formed on a polycrystalline silicon layer having an active region and an ohmic contact region, damages to a channel region of a polycrystalline silicon TFT during an etching process are prevented. Furthermore, when a driving circuit is formed to be driven by one of a PMOS logic and an NMOS logic, an array substrate for an LCD device including a driving circuit is fabricated through a four-mask process. Accordingly, production time, production cost and production yield are further improved. Additionally, since a gate electrode includes a thin single layer of a transparent conductive material, deterioration due to an increased step size of a gate electrode is prevented and crystallinity of a polycrystalline silicon layer is improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating an array substrate structure for a liquid crystal display device, comprising:
    sequentially disposing a transparent conductive material layer and a metallic material layer on a substrate defining a display area and a non-display area, the display area having a pixel TFT portion and a pixel electrode area, and the non-display area having an n-type driving TFT portion and a p-type driving TFT portion;
    forming a first gate electrode in the pixel TFT portion, a second gate electrode in the n-type driving TFT portion, a third gate electrode in the p-type driving TFT portion, a gate line in the display area, a pixel electrode in the pixel electrode area, and a first capacitor electrode connected to the pixel electrode through a first mask process;
    sequentially disposing a gate insulating layer and an amorphous silicon layer on the first gate electrode, the second gate electrode, the third gate electrode, the gate line, the pixel electrode and the first capacitor electrode;
    crystallizing the amorphous silicon layer to a polycrystalline silicon layer;
    doping the polycrystalline silicon layer in the p-type driving TFT portion with high concentration p-type impurities (p+) through a second mask process to define a first active region and a first ohmic contact region;
    doping the polycrystalline silicon layer in the pixel TFT portion and the n-type driving TFT portion with high concentration n-type impurities (n+) and low concentration n-type impurities (n−) through a third mask process to define second and third active regions, second and third ohmic contact regions, first and second lightly doped drain (LDD) regions and a storage capacitor area;
    disposing a passivation layer on the polycrystalline silicon layer;
    forming a first semiconductor layer in the pixel TFT portion, a second semiconductor layer in the n-type driving TFT portion, a third semiconductor layer in the p-type driving TFT portion, a second capacitor electrode in the storage capacitor area through a fourth mask process;
    forming a passivation pattern on the first, second and third semiconductor layers and the second capacitor electrode through the fourth mask process, wherein side portions of each of the first, second and third semiconductor layers are exposed; and
    forming first source and drain electrodes, second source and drain electrodes, third source and drain electrodes and a data line through a fifth mask process, portions of the first source and drain electrodes contacting the side portions of the first semiconductor layer, portions of the second source and drain electrodes contacting the side portions of the second semiconductor layer, portions of the third source and drain electrodes contacting the side portions of the third semiconductor layer, and the data line connected to the first source electrode.

2. The method according to claim 1, wherein the gate insulating layer includes an inorganic insulating material.

3. The method according to claim 1, wherein the passivation layer includes an inorganic insulating material.

4. The method according to claim 1, wherein the first semiconductor layer includes the second active region, the second ohmic contact region and the first LDD region, the second semiconductor layer includes the third active region, the third ohmic contact region and the second LDD region, and the third semiconductor layer includes the first active region and the first ohmic contact region.

5. The method according to claim 4, wherein the first source and drain electrodes directly contact the second ohmic contact region, the second source and drain electrodes directly contact the third ohmic contact region, and the third source and drain electrodes contact the first ohmic contact region.

6. The method according to claim 1, wherein the first, second and third semiconductor layers and the passivation pattern disposed on the corresponding semiconductor layers form an island shape.

7. The method according to claim 1, wherein the first mask process includes:
    forming a photoresist (PR) layer on the metallic material layer;
    disposing a gate-pixel mask having a transmissive area, a blocking area and a half-transmissive area over the PR layer, a light transmittance of the half-transmissive is lower than that of the transmissive area and higher than that of the blocking area;
    exposing the PR layer through the gate-pixel mask;
    developing the PR layer to form a first gate-pixel PR pattern having a first thickness and a second gate-pixel PR pattern having a second thickness greater than the first thickness, the first gate-pixel PR pattern overlapping the first, second, and third gate electrodes, the pixel electrode, and the first capacitor electrode, and the second gate-pixel PR pattern overlapping the gate line;
    sequentially etching the metallic material layer and the transparent conductive material layer using the first and second gate-pixel PR patterns as an etching mask;
    removing the first gate-pixel PR pattern to expose the metallic material layer;
    etching the metallic material layer to expose the transparent conductive material layer; and
    removing the second gate-pixel PR pattern.

8. The method according to claim 7, wherein the PR layer has a positive type, the half-transmissive area corresponds to the first gate-pixel PR pattern and the blocking area corresponds to the second gate-pixel PR pattern.

9. The method according to claim 7, wherein removing the first gate-pixel PR pattern comprises removing a portion of the second gate-pixel PR pattern to reduce the second thickness.

10. The method according to claim 9, wherein removing the first gate-pixel PR pattern and partially removing the second gate-pixel PR pattern are performed anisotropically by at least one of ashing and stripping methods.

11. The method according to claim 1, wherein the gate line includes a double layer of the transparent conductive material layer and the metallic material layer.

12. The method according to claim 1, wherein the gate electrode includes a single layer of the transparent conductive material layer.

13. The method according to claim 1, further comprising disposing a buffer layer between the substrate and the transparent conductive material layer.

14. The method according to claim 13, wherein the buffer layer includes at least one of silicon nitride (SiNx) and silicon oxide ($SiO_2$).

15. The method according to claim 1, wherein the transparent conductive material layer includes at least one of indium-tin-oxide (ITO) and indium-zinc-oxide (IZO).

16. The method according to claim 1, wherein the transparent conductive material layer has a thickness within a range of about 500 Å to about 1000 Å.

17. The method according to claim 1, wherein the metallic material layer includes molybdenum (Mo).

18. The method according to claim 1, wherein the metallic material layer has a thickness less than about 3000 Å.

19. The method according to claim 1, wherein the second mask process comprises:
forming a p+ PR pattern on the polycrystalline silicon layer, the p+ PR pattern exposing a portion of the polycrystalline silicon layer corresponding to the first ohmic contact region;
doping the exposed polycrystalline silicon layer with the high concentration p-type impurities using the p+ PR pattern as a doping mask; and
removing the p+ PR pattern.

20. The method according to claim 19, wherein the high concentration p-type impurities has a dose within a range of about $1\times10^{15}$ cm$^{-2}$ to about $9\times10^{16}$ cm$^{-2}$.

21. The method according to claim 1, wherein the third mask process includes:
forming an n+ PR pattern on the polycrystalline silicon layer, the n+ PR pattern exposing first portions of the polycrystalline silicon layer corresponding to the second and third ohmic contact regions;
doping the exposed polycrystalline silicon layer with the high concentration n-type impurities using the n+ PR pattern as a doping mask;
removing portions of the n+ PR pattern to form an n– PR pattern exposing a second portions of the polycrystalline silicon layer corresponding to the first and second LDD regions;
doping the polycrystalline silicon layer in the first and second LDD regions with the low concentration n-type impurities using the n– PR pattern as a doping mask;
removing the n– PR pattern.

22. The method according to claim 21, wherein the high concentration n-type impurities has a dose within a range of about $1\times10^{15}$ cm$^{-2}$ to about $9\times10^{16}$ cm$^{-2}$, and the low concentration n-type impurities has a dose within a range of about $1\times10^{13}$ cm$^{-2}$ to about $9\times10^{13}$ cm$^{-2}$.

23. The method according to claim 1, wherein the first drain electrode directly contacts the pixel electrode.

24. The method according to claim 1, wherein the fourth mask process includes:
disposing a PR layer on the passivation layer;
disposing a active-contact mask having a transmissive area, a blocking area and a half-transmissive area over the PR layer, and a light transmittance of the half-transmissive is lower than that of the transmissive area and higher than that of the blocking area;
exposing the PR layer using the active-contact mask;
developing the PR layer to form a first active-contact PR pattern having a first thickness and a second active-contact PR pattern having a second thickness smaller than the first thickness, the first active-contact PR pattern corresponding to the portions of the ohmic contact regions in each of the first, second and third semiconductor layers, the first active-contact PR pattern corresponding to other portions of each of the first, second and third semiconductor layers;
sequentially etching the passivation layer, the polycrystalline silicon layer and the gate insulating layer using the first and second active-contact PR patterns as an etching mask;
removing the second active-contact PR pattern to expose the passivation layer;
etching the passivation layer to expose the polycrystalline silicon layer corresponding to the portion of the ohmic regions in the first, second and third semiconductor regions; and
removing the first active-contact PR pattern.

25. The method according to claim 4, wherein the PR layer has a positive type photoresist, the half-transmissive area corresponds to the second active-contact PR pattern and the blocking area corresponds to the first active-contact PR pattern.

26. The method according to claim 24, wherein removing the second active-contact PR pattern includes partially removing the first active-contact PR pattern to reduce the second thickness.

27. The method according to claim 26, wherein removing the second active-contact PR pattern and partially removing the first active-contact PR pattern are performed anisotropically by at least one of ashing and stripping methods.

28. The method according to claim 24, wherein the second active-contact PR pattern further corresponds to the gate line, and wherein the first active-contact PR pattern further corresponds to the second capacitor electrode.

29. The method according to claim 28, further comprising removing the polycrystalline silicon layer using the passivation pattern formed underneath the first active-contact PR pattern as an etching mask.

30. A method of fabricating an array substrate structure for a liquid crystal display device, comprising:
sequentially disposing a transparent conductive material layer and a metallic material layer on a substrate defining a display area and a non-display area, the display area having a pixel TFT portion and a pixel electrode area, and the non-display area having a driving TFT portion;
forming a first gate electrode in the pixel TFT portion and a second gate electrode in the driving TFT portion, a gate line in the display area, a pixel electrode in the pixel electrode area through a first mask process, wherein a first capacitor electrode connects to the pixel electrode;
sequentially disposing a gate insulating layer and an amorphous silicon layer on the first, second gate electrodes, the gate line, the pixel electrode, and the first capacitor electrode;
crystallizing the amorphous silicon layer to a polycrystalline silicon layer;
doping the polycrystalline silicon layer with impurities through a second mask process to define a first active region, a first ohmic contact region, and storage capacitor area in the pixel TFT portion, and a second active region and a second ohmic contact region in the driving TFT portion;
disposing a passivation layer on the polycrystalline silicon layer;
forming a first semiconductor layer in the pixel TFT portion, a second semiconductor layer in the driving TFT portion, a second capacitor electrode in the storage capacitor area, and a passivation pattern on the first and second semiconductor layers and the second capacitor electrode through a third mask process, side portions of each of the first and second semiconductor layers are exposed using the passivation pattern; and
forming first source and drain electrodes, second source and drain electrodes, and a data line through a fourth mask process, the first source and drain electrodes contacting the side portions of the first semiconductor layer, the second source and drain electrodes contacting the side portions of the second semiconductor layer, and the data line connected to the first source electrode.

31. The method according to claim 30, wherein the impurities include at least one of n-type and p-type impurities.

32. The method according to claim 30, wherein the first semiconductor layer includes the first active region and the first ohmic contact region, and the second semiconductor layer includes the second active region and the second ohmic contact region.

33. The method according to claim 32, wherein the first source and drain electrodes directly contact the first ohmic contact region, and the second source and drain electrodes directly contact the second ohmic contact region.

34. The method according to claim 30, wherein the first semiconductor layer, the second semiconductor layer and the passivation pattern formed on the corresponding semiconductor layer form an island shape.

35. The method according to claim 30, wherein the first mask process includes:
disposing a PR layer on the metallic material layer;
disposing a gate-pixel mask having a transmissive area, a blocking area and a half-transmissive area over the PR layer, a light transmittance of the half-transmissive area is lower than that of the transmissive area and higher than that of the blocking area;
exposing the PR layer using the gate-pixel mask;
developing the PR layer to form a first gate-pixel PR pattern having a first thickness and a second gate-pixel PR pattern having a second thickness greater than the first thickness, the first gate-pixel PR pattern overlapping the first and second gate electrodes, the pixel electrode, and the first capacitor electrode, the second gate-pixel PR pattern overlapping the gate line;
sequentially etching the metallic material layer and the transparent conductive material layer using the first and second gate-pixel PR patterns as an etching mask;
removing the first gate-pixel PR pattern to expose the metallic material layer; etching the metallic material layer to expose the transparent conductive material layer; and
removing the second gate-pixel PR pattern.

36. The method according to claim 35, wherein the PR layer has a positive type photoresist, the half-transmissive area corresponds to the first gate-pixel PR pattern and the blocking area corresponds to the second gate-pixel PR pattern.

37. The method according to claim 35, wherein removing the first gate-pixel PR pattern includes removing a portion of the second gate-pixel PR pattern to reduce the second thickness.

38. The method according to claim 37, wherein removing the first gate-pixel PR pattern and removing the portion of the second gate-pixel PR pattern are performed anisotropically by at least one of ashing and stripping methods.

39. The method according to claim 30, further comprising disposing a buffer layer between the substrate and the transparent conductive material layer.

40. The method according to claim 30, wherein the second mask process comprises:
disposing a doping PR pattern on the polycrystalline silicon layer, the doping PR pattern exposing a portion of the polycrystalline silicon layer corresponding to the first and second ohmic contact regions;
doping the polycrystalline silicon layer with the impurities using the doping PR pattern as a doping mask; and
removing the doping pattern.

41. The method according to claim 30, wherein the fourth mask process includes:
forming a PR layer on the passivation layer;
disposing a active-contact mask having a transmissive area, a blocking area and a half-transmissive area over the PR layer, a light transmittance of the half-transmissive area is lower than that of the transmissive area and higher than that of the blocking area;
exposing the PR layer using the active-contact mask;
developing the PR layer to form a first active-contact PR pattern having a first thickness and a second active-contact PR pattern having a second thickness smaller than the first thickness, the second active-contact PR pattern corresponding to the portions of the ohmic contact regions in each of the first and second semiconductor layers, the first active-contact PR pattern corresponding to other portions of each of the first and second semiconductor layers;
sequentially etching the passivation layer, the polycrystalline silicon layer and the gate insulating layer using the first and second active-contact PR patterns as an etching mask;
removing the second active-contact PR pattern to expose the passivation layer;
etching the passivation layer to expose the polycrystalline silicon layer corresponding to the ohmic contact regions in the first and second semiconductor layers; and
removing the first active-contact PR pattern.

42. The method according to claim 41, wherein the PR layer has a positive type photoresist, wherein the half-transmissive area corresponds to the second active-contact PR pattern, and wherein the blocking area corresponds to the first active-contact PR pattern.

43. The method according to claim 41, wherein removing the second active-contact PR pattern includes partially removing the first active-contact PR pattern to reduce the first thickness.

44. The method according to claim 43, wherein removing the second active-contact PR pattern and partially removing the first active-contact PR pattern are performed anisotropically by at least one of ashing and stripping methods.

45. The method according to claim 41, wherein the second active-contact PR pattern further corresponds to the gate line, and wherein the first active-contact PR pattern further corresponds to the second capacitor electrode.

46. The method according to claim 45, further comprising removing the polycrystalline silicon layer using the passivation pattern formed underneath the first active-contact PR pattern as an etching mask.

* * * * *